United States Patent
Gmitter et al.

(10) Patent No.: US 10,204,831 B2
(45) Date of Patent: Feb. 12, 2019

(54) TAPE-BASED EPITAXIAL LIFT OFF APPARATUSES AND METHODS

(71) Applicant: ALTA DEVICES, Inc., Sunnyvale, CA (US)

(72) Inventors: Thomas Gmitter, Sunnyvale, CA (US); Gang He, Cupertino, CA (US); Melissa Archer, San Jose, CA (US); Andreas Hegedus, Burlingame, CA (US)

(73) Assignee: ALTA DEVICES, INC., Sunnyvale, CA (US)

( * ) Notice: Subject to any disclaimer, the term of this patent is extended or adjusted under 35 U.S.C. 154(b) by 512 days.

(21) Appl. No.: 14/861,821

(22) Filed: Sep. 22, 2015

(65) Prior Publication Data

US 2016/0049334 A1 Feb. 18, 2016

Related U.S. Application Data

(62) Division of application No. 12/640,796, filed on Dec. 17, 2009, now Pat. No. 9,165,805.

(Continued)

(51) Int. Cl.
*H01L 21/683* (2006.01)
*H01L 21/78* (2006.01)
(Continued)

(52) U.S. Cl.
CPC .... *H01L 21/7813* (2013.01); *H01L 21/30612* (2013.01); *H01L 21/67086* (2013.01);
(Continued)

(58) Field of Classification Search
None
See application file for complete search history.

(56) References Cited

U.S. PATENT DOCUMENTS

| 3,993,533 A | 11/1976 | Milnes et al. |
| 4,219,926 A | 9/1980 | Bloch et al. |

(Continued)

FOREIGN PATENT DOCUMENTS

| DE | 10107405 | 9/2002 |
| WO | WO 9117565 | 11/1991 |
| WO | WO 2006131316 | 12/2006 |

OTHER PUBLICATIONS

Bauhuis, G.J., "Substrate Reuse for Epitaxial Lift-Off of III-V Solar Cells", Proceedings of the 22nd European Photovoltaic Solar Energy Conference: Milan, Sep. 3-7, 2007, pp. 106-110.
(Continued)

*Primary Examiner* — Karla A Moore
(74) *Attorney, Agent, or Firm* — Arent Fox LLP

(57) ABSTRACT

Embodiments of the invention generally relate to apparatuses and methods for producing epitaxial thin films and devices by epitaxial lift off (ELO) processes. In one embodiment, a method for forming thin film devices during an ELO process is provided which includes coupling a plurality of substrates to an elongated support tape, wherein each substrate contains an epitaxial film disposed over a sacrificial layer disposed over a wafer, exposing the substrates to an etchant during an etching process while moving the elongated support tape, and etching the sacrificial layers and peeling the epitaxial films from the wafers while moving the elongated support tape. Embodiments also include several apparatuses, continuous-type as well as a batch-type apparatuses, for forming the epitaxial thin films and devices, including an apparatus for removing the support tape and epitaxial films from the wafers on which the epitaxial films were grown.

31 Claims, 42 Drawing Sheets

Related U.S. Application Data

(60) Provisional application No. 61/138,440, filed on Dec. 17, 2008, provisional application No. 61/257,326, filed on Nov. 2, 2009.

(51) Int. Cl.
    *H01L 21/67*     (2006.01)
    *H01L 21/306*     (2006.01)
    *H01L 31/18*     (2006.01)

(52) U.S. Cl.
CPC .. *H01L 21/67092* (2013.01); *H01L 21/67132* (2013.01); *H01L 21/6835* (2013.01); *H01L 21/6836* (2013.01); *H01L 31/184* (2013.01); H01L 2221/6839 (2013.01); H01L 2221/68318 (2013.01); H01L 2221/68345 (2013.01); H01L 2221/68381 (2013.01)

(56) References Cited

U.S. PATENT DOCUMENTS

| | | | |
|---|---|---|---|
| 4,410,558 A * | 10/1983 | Izu | C23C 16/517 |
| | | | 136/258 |
| 4,419,178 A | 12/1983 | Rode | |
| 4,445,965 A | 5/1984 | Milnes | |
| 4,663,828 A | 5/1987 | Hanak | |
| 4,727,047 A | 2/1988 | Bozler et al. | |
| 4,846,931 A | 7/1989 | Gmitter et al. | |
| 4,883,561 A | 11/1989 | Gmitter et al. | |
| 4,891,329 A | 1/1990 | Reisman et al. | |
| 5,073,230 A * | 12/1991 | Maracas | H01L 21/7813 |
| | | | 117/915 |
| 5,122,852 A | 6/1992 | Chang et al. | |
| 5,201,996 A | 4/1993 | Gmitter et al. | |
| 5,221,637 A | 6/1993 | De Boeck | |
| 5,256,562 A | 10/1993 | Vu et al. | |
| 5,258,325 A | 11/1993 | Spitzer et al. | |
| 5,276,345 A | 1/1994 | Siegel et al. | |
| 5,277,749 A | 1/1994 | Griffith et al. | |
| 5,286,335 A | 2/1994 | Drabik et al. | |
| 5,344,517 A | 9/1994 | Houlding | |
| 5,401,983 A | 3/1995 | Jokerst et al. | |
| 5,458,694 A | 10/1995 | Nuyen | |
| 5,465,009 A * | 11/1995 | Drabik | H01L 24/96 |
| | | | 257/723 |
| 5,476,810 A | 12/1995 | Curran | |
| 5,479,043 A | 12/1995 | Nuyen | |
| 5,527,766 A | 6/1996 | Eddy | |
| 5,528,719 A | 6/1996 | Yamada | |
| 5,546,375 A | 8/1996 | Shimada et al. | |
| 5,641,381 A | 6/1997 | Bailey et al. | |
| 5,755,989 A * | 5/1998 | Ishii | C09K 13/10 |
| | | | 252/79.3 |
| 5,827,751 A | 10/1998 | Nuyen | |
| 5,985,742 A | 11/1999 | Henley et al. | |
| 6,010,579 A | 1/2000 | Henley et al. | |
| 6,071,795 A | 6/2000 | Cheung et al. | |
| 6,155,909 A | 12/2000 | Henley et al. | |
| 6,214,733 B1 | 4/2001 | Sickmiller | |
| 6,221,740 B1 | 4/2001 | Bryan et al. | |
| 6,232,136 B1 | 5/2001 | Zavracky et al. | |
| 6,263,941 B1 | 7/2001 | Bryan et al. | |
| 6,284,631 B1 | 9/2001 | Henley et al. | |
| 6,287,891 B1 | 9/2001 | Sayyah | |
| 6,290,804 B1 | 9/2001 | Henley et al. | |
| 6,291,313 B1 | 9/2001 | Henley et al. | |
| 6,294,814 B1 | 9/2001 | Henley et al. | |
| 6,346,459 B1 | 2/2002 | Usenko et al. | |
| 6,352,909 B1 | 3/2002 | Usenko | |
| 6,387,829 B1 | 5/2002 | Usenko et al. | |
| 6,391,740 B1 | 5/2002 | Cheung et al. | |
| 6,414,783 B2 | 7/2002 | Zavracky et al. | |
| 6,458,672 B1 | 10/2002 | Henley et al. | |
| 6,486,041 B2 | 11/2002 | Henley et al. | |
| 6,500,732 B1 | 12/2002 | Henley et al. | |
| 6,504,524 B1 | 1/2003 | Gates et al. | |
| 6,511,899 B1 | 1/2003 | Henley et al. | |
| 6,513,564 B2 | 2/2003 | Bryan et al. | |
| 6,528,391 B1 | 3/2003 | Henley et al. | |
| 6,548,382 B1 | 4/2003 | Henley et al. | |
| 6,554,046 B1 | 4/2003 | Bryan et al. | |
| 6,559,075 B1 | 5/2003 | Kelly et al. | |
| 6,589,811 B2 | 7/2003 | Sayyah | |
| 6,632,724 B2 | 10/2003 | Henley et al. | |
| 6,669,801 B2 | 12/2003 | Yoshimura et al. | |
| 6,677,249 B2 | 1/2004 | Laermer et al. | |
| 6,740,604 B2 | 5/2004 | Kelly et al. | |
| 6,790,747 B2 | 9/2004 | Henley et al. | |
| 6,809,044 B1 | 10/2004 | Aspar et al. | |
| 6,858,518 B2 * | 2/2005 | Kondo | H01L 21/2007 |
| | | | 257/E21.122 |
| 6,890,838 B2 | 5/2005 | Henley et al. | |
| 6,943,050 B2 | 9/2005 | Kondo | |
| 6,974,521 B2 | 12/2005 | Schermer | |
| 7,045,878 B2 | 5/2006 | Faris | |
| 7,056,808 B2 | 6/2006 | Henley et al. | |
| 7,060,591 B2 | 6/2006 | Yamazaki et al. | |
| 7,153,761 B1 | 12/2006 | Nastasi et al. | |
| 7,160,790 B2 | 1/2007 | Henley et al. | |
| 7,163,826 B2 | 1/2007 | Faris | |
| 7,176,543 B2 | 2/2007 | Beernink | |
| 7,198,671 B2 | 4/2007 | Ueda | |
| 7,202,141 B2 * | 4/2007 | Park | B23K 26/0732 |
| | | | 257/E21.347 |
| 7,229,901 B2 | 6/2007 | Savage et al. | |
| 7,241,667 B2 | 7/2007 | Park et al. | |
| 7,341,925 B2 | 3/2008 | Kelly et al. | |
| 7,348,258 B2 | 3/2008 | Henley et al. | |
| 7,638,410 B2 | 12/2009 | Nastasi et al. | |
| 8,362,592 B2 * | 1/2013 | He | C30B 25/18 |
| | | | 257/618 |
| 8,367,518 B2 | 2/2013 | Gmitter et al. | |
| 8,657,994 B2 | 2/2014 | Burrows et al. | |
| 8,778,199 B2 * | 7/2014 | Cornfeld | H01L 31/06875 |
| | | | 216/24 |
| 9,165,805 B2 * | 10/2015 | Gmitter | H01L 21/67092 |
| 9,381,731 B2 * | 7/2016 | Brown | H01L 21/67086 |
| 2001/0008303 A1 | 7/2001 | Nakamura | |
| 2009/0321881 A1 | 12/2009 | Archer et al. | |
| 2009/0321885 A1 | 12/2009 | Archer et al. | |
| 2009/0321886 A1 | 12/2009 | Gmitter et al. | |
| 2009/0324379 A1 | 12/2009 | He et al. | |
| 2009/0325367 A1 | 12/2009 | He et al. | |
| 2010/0001316 A1 | 1/2010 | Gmitter et al. | |
| 2010/0001374 A1 | 1/2010 | Gmitter et al. | |
| 2011/0214805 A1 * | 9/2011 | Brown | H01L 21/67086 |
| | | | 156/247 |

OTHER PUBLICATIONS

Bauhuis, G.J., "Thin film GaAs solar cells with increased quantum efficiency due to light reflection", Solar Energy Materials & Solar Cells 83 (2004) 81-90, Nov. 3, 2003.
International Search Report and Written Opinion for PCT/US2009/068445 (ALTA/0018PCT) dated Jun. 22, 2010.
Konagai, Makoto, "High Efficiency GaAs Thin Film Solar Cells by Peeled Film Technology", Journal of Crystal Growth 45 (1978) 277-280.
Kumar, P., "Sacrificial etching of AlxGa1-xAs for III-V MEMS surface micromatching", Appl. Phys. A 88, 711-714, May 24, 2007.
Schermer J.J., "Epitaxial Lift-Off for large area thin film III/V devices", Phys. Stat. Sol. (1) 202, No. 4, 501-508 (2005).
Schermer, J.J., "Photon confinement in high-efficiency, thin-film III-V solar cells obtained by epitaxial lift-off", Thin Solid Films 511-512 (2006) 645-653, Jan. 19, 2006.
Schermer, J.J., "Thin-film GaAs Epitaxial Lift-Off Solar Cells for Space Applications", Prog. Photovolt: Res. Appl. 2005; 13:587-596, Apr. 28, 2005.
Schermer, John, "Solar Cells Based on III-V Semiconductors", Joint Solar Panel, Sep. 29, 2004.

(56) References Cited

OTHER PUBLICATIONS

Sickmiller, Mike, "Packaging Of Ultrathin Semiconductor Devices Through The ELO Packaging Process", Mat. Res. Soc. Symp. Proc. vol. 681E (2001).

van Deelen, J. "On the development of high-efficiency thin-film GaAs and GaInP2 cells", Journal of Crystal Growth 298 (2007) 772-776, Nov. 28, 2006.

van Niftrik, A. T. J., "HF Species and Dissolved Oxygen on the Epitaxial Lift-Off Process of GaAs Using AlAsP Release Layers", Journal of The Electrochemical Society, 155 (1) D35-D39 (2008), Nov. 6, 2007.

van Niftrik, A. T.J., "A Diffusion and Reaction Related Model of the Epitaxial Lift-Off Process", Journal of The Electrochemical Society, 154 (11) D629-D635 (2007), Sep. 19, 2007.

van Niftrik, Antonius T. J., "The Influence of InxGa1-xAs and GaAs1-yPy Layers Surrounding the AlAs Release Layer in the Epitaxial Lift-Off Process", Crystal Growth & Design, 2007, vol. 7, No. 12, 2472-2480, Aug. 7, 2007.

Voncken, M.M.A.J., "Influence of radius of curvature on the lateral etch rate of the weight induced epitaxial lift-off process", Material Science and Engineering B95 (2002) 242-248, May 21, 2002.

Voncken, M.M.A.J., "Multiple release layer study of the intrinsic lateral etch rate of the epitaxial lift-off process", Appl. Phys. A 79, 1801-1807, Mar. 28, 2003.

Voncken, M.M.A.J., "Strain-accelerated HF etching of AlAs for epitaxial lift-off", J. Phys.: Condens. Matter 16 (2004) 3585-3596, May 14, 2004.

Yablonovitch, E., "Van De Waals bonding of GaAs epitaxial liftoff films onto arbitrary substrates", Appl. Phys. Lett. 56 (24), Jun. 11, 1990.

\* cited by examiner

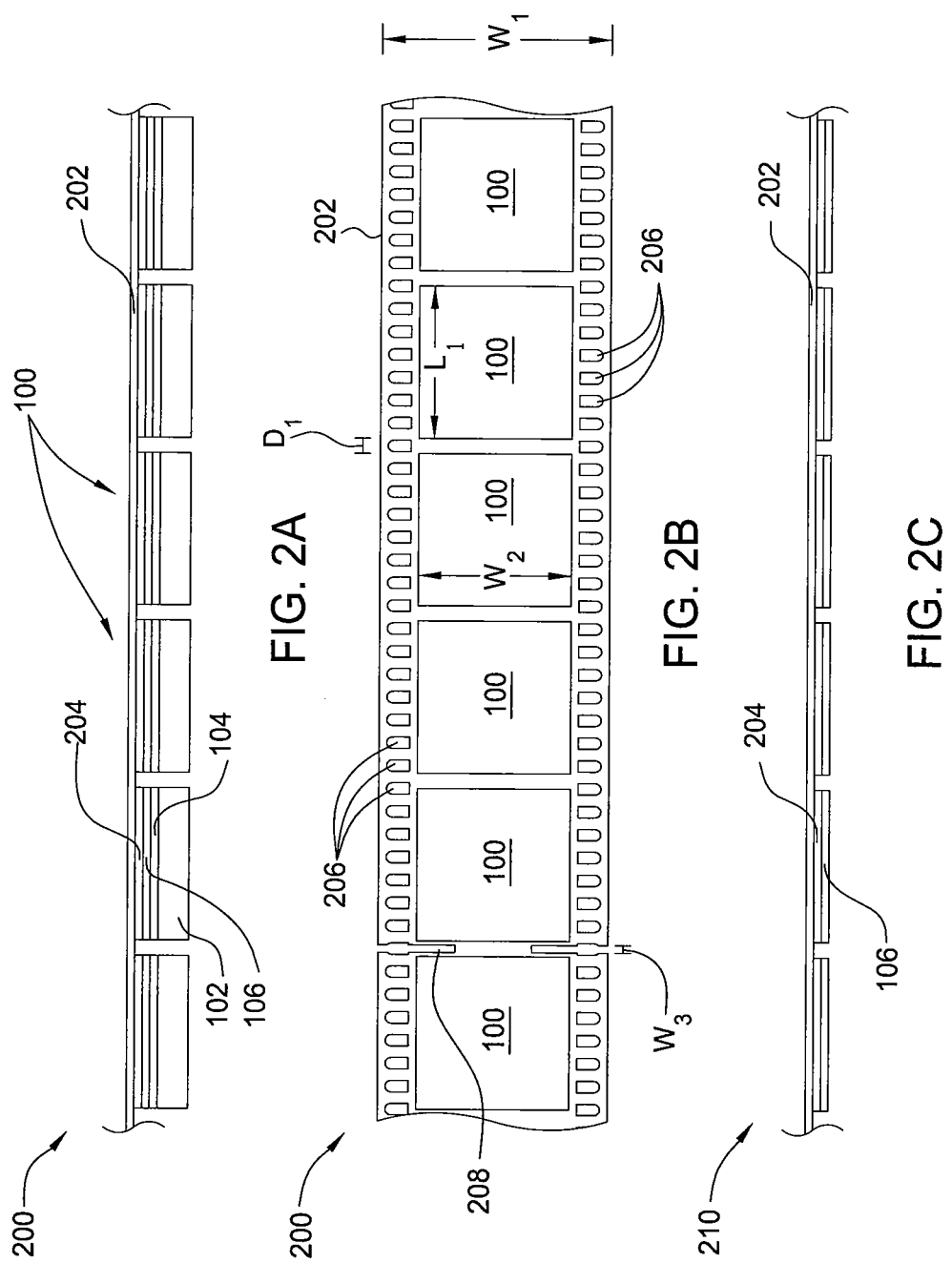

TAPE-BASED EPITAXIAL LIFT OFF APPARATUSES AND METHODS

CROSS-REFERENCE TO RELATED APPLICATIONS

This application is a Divisional Application of and claims priority to U.S. patent application Ser. No. 12/640,796, filed on Dec. 17, 2009, titled "TAPE-BASED EPITAXIAL LIFT OFF APPARATUSES AND METHODS," by Gmitter, et al., which claims benefit of U.S. Ser. No. 61/138,440, filed Dec. 17, 2008, and U.S. Ser. No. 61/257,326, filed Nov. 2, 2009, which are hereby incorporated by reference in their entirety.

BACKGROUND OF THE INVENTION

Field of the Invention

Embodiments of the invention generally relate to apparatuses and methods for the fabrication of solar, semiconductor, and electronic materials and devices, and more particularly to epitaxial lift off (ELO) thin films and devices.

Description of the Related Art

One phase in device fabrication involves handling and packaging of thin films used as photovoltaic or solar devices, semiconductor devices, or other electronic devices. Such thin film devices may be manufactured by utilizing a variety of processes for depositing materials onto and removing material from a substrate or wafer. One uncommon technique for manufacturing thin film devices is known as the epitaxial lift off (ELO) process. The ELO process includes depositing an epitaxial layer or film on a sacrificial layer on a growth substrate, then etching the sacrificial layer to separate the epitaxial layer from the growth substrate. The removed thin epitaxial layer is known as the ELO or epitaxial film or layer and typically includes thin films used as photovoltaic or solar devices, semiconductor devices, or other electronic devices.

The thin ELO films are very difficult to manage or handle, such as when bonding to a substrate or while packaging, since the ELO films are very fragile and have narrow dimensions. The ELO films crack under very small forces. Also, the ELO films are very difficult to align due to their extremely narrow dimensions.

The sacrificial layer is typically very thin and may be etched away via a wet chemical process. The speed of the overall process may be limited by the lack of delivery or exposure of reactant to the etch front, which leads to less removal of by-products from the etch front. The ELO etching process is a diffusion limited process and when the ELO films are maintained in their as deposited geometries, a very narrow and long opening forms which severely limits the overall speed of the process. To lessen the transport constraint of the diffusion processes, it may be beneficial to open up the resulting opening created by the etched or removed sacrificial layer and bending the ELO film away from the growth substrate. The act of bending while etching forms a crevice between the ELO film and the growth substrate—which geometry of the crevice provides greater angles to increase the transport of species both towards and away the etch front. Reactants move towards the etch front while by-products generally move away from the etch front.

The bending of the ELO film however can induce stresses the epitaxial layers within and the amount of bending is limited by the strength of the ELO film. The ELO film usually contains a brittle material, which does not undergo plastic deformation before failure, and as such may be subject to crack induced failures.

To minimize the potential for crack propagation, the brittle ELO film may be maintained under a compressive stress. Cracks usually do not propagate through regions of residual compressive stress. The ELO film is placed under tensile stress while bending the ELO film away from the growth substrate since the ELO film is on the outside of the curvature of the crevice. The tensile stress limits the amount of crevice curvature and reduces the speed of the etch process. To overcome this limitation, a residual compressive stress may be instilled within the ELO film before etching the sacrificial layer. This initial compressive stress may be offset by tensile stress caused by the bending and therefore allows for a greater amount of bending during the separation process.

Also, the ELO process has always been a cost prohibiting technique for commercially producing the thin ELO film devices. Current ELO processes include transferring a single growth substrate through many fabrication steps while producing a single ELO film. The current processes are time consuming, costly, and rarely produce commercial quality ELO films.

Therefore, there is a need for more effective, less time consuming, and less expensive methods and apparatuses to remove and handle ELO thin films.

SUMMARY OF THE INVENTION

Embodiments of the invention generally relate to apparatuses and methods for producing epitaxial thin films and devices by epitaxial lift off (ELO) processes. The thin film devices generally contain epitaxially grown layers which are formed on a sacrificial layer disposed on or over a growth substrate, such as a wafer. A support tape may be disposed on or over the opposite side of the epitaxial film as the wafer. The support tape may be used to hold the epitaxial films during the etching and removal steps of the ELO process, and thereafter. In various embodiments, the apparatus for removing the epitaxial films from the substrates may include an etch section, substrate and support tape handling devices, and various tension control devices to protect the epitaxial films during the ELO removal process.

In one embodiment, a method for forming thin film devices during an ELO process is provided and includes forming an epitaxial film or material over a sacrificial layer on a substrate, adhering an elongated tape support onto the epitaxial film, removing the sacrificial layer during an etching process, and peeling the epitaxial film from the substrate while bending the elongated tape support away from the substrate.

In another embodiment, an apparatus for forming a tape-based ELO stack is provided and contains a first end, a second end, and a tape supply section proximate the first end. The tape supply section provides at least one unloaded support tape, a lamination section for receiving the at least one unloaded support tape, and a plurality of substrates having an epitaxial film thereon. The lamination section adheres the substrates to the at least one unloaded support tape to form at least one loaded support tape and an ELO etch section proximate the second end, the ELO etch section removing the substrates from the at least one loaded support tape, while leaving the epitaxial film on the at least one loaded support tape. The tape supply section generally includes at least one roller which has at least one roller with at least one tape wound thereon.

Embodiments of the apparatus further provide a splice/punch section disposed between the tape supply section and the lamination section, the splice/punch section forming openings in the elongated, unloaded support tape. The ELO etch section containing etch bath reservoirs or tanks may be configured to continuously remove the substrates from the loaded support tape and may be configured to remove the substrates from the loaded support tape in batches.

In some embodiments, the support tape has at least one row of track openings extending the length of the support tape. Other examples provide that each side of the support tape has a row of track openings extending the length of the support tape. In some configurations, the support tape moves around at least two reels, drums, or rollers. The support tape moves around at least one roller having a plurality of pins extending from the roller to engage the track openings. In some examples, the roller contains a sprocket or a cog to engage the track openings. The loaded support tape may contain a plurality of slots extending perpendicular or substantially perpendicular from the outside edges of the support tape. The plurality of slots has pairs of aligned slots which extend from opposite outside edges of the loaded support tape. Each pair of slots is within a region of the loaded support tape, and the region is free of substrates. Each substrate may be coupled to or with the loaded support tape between two consecutive pairs of slots, such as outside the region containing the pair of slots.

In another embodiment, a method for forming thin film devices during an ELO process is provided which includes coupling an elongated support tape and a plurality of substrates, wherein each substrate contains an epitaxial film disposed over a sacrificial layer disposed over a wafer, exposing the substrates to an etchant during an etching process while moving the elongated support tape, and etching the sacrificial layers and peeling the epitaxial films from the wafers while moving the elongated support tape.

The elongated support tape is coupled with each substrate by the epitaxial film disposed thereon. The plurality of substrates coupled with the elongated support tape generally contains from about 4 substrates to about 100 substrates or more. The elongated support tape may contain multiple layers. In some embodiments, the elongated support tape contains at least one metal, for example, at least one metallic foil. The metallic foil contains a metal such as iron, nickel, cobalt, steel, stainless steel, alloys thereof, derivatives thereof, or combinations thereof. In other embodiments, the elongated support tape contains at least one material such as a plastic material, a polymeric material, a co-polymeric material, an oligomeric material, derivatives thereof, or combinations thereof. In some examples, the elongated support tape may contain polyacrylic materials, polyethylene materials, polypropylene materials, polytetrafluoroethylene materials, fluorinated polymeric materials, isomers thereof, derivatives thereof, and combinations thereof.

In some embodiments, the elongated support tape moves around at least two reels, drums, or rollers. At least one side of the elongated support tape contains a row of track openings extending the length of the elongated support tape. In some examples, each side of the elongated support tape contains a row of track openings extending the length of the elongated support tape. The elongated support tape moves around at least one roller having a plurality of pins extending from the roller to engage the track openings. The roller may have a sprocket or a cog as the pins for engaging the track openings. The elongated support tape may have a plurality of slots extending perpendicular or substantially perpendicular from the outside edges of the elongated support tape. The plurality of slots may have pairs of aligned slots which extend from opposite outside edges of the elongated support tape. In some embodiments, each pair of slots may be within a region of the elongated support tape, and the region is free of substrates. Each substrate may be coupled with the elongated support tape between two consecutive pairs of slots.

In many embodiments, an adhesive layer is disposed between each substrate and the elongated support tape. The adhesive layer may be formed by applying an adhesive to each substrate and coupling each substrate to the elongated support tape. The adhesive layer may contain a pressure sensitive adhesive, a hot-melt adhesive, a UV-cured adhesive. In some examples, the adhesive layer contains an acrylic adhesive.

In some embodiments, the sacrificial layer contains aluminum arsenide, alloys thereof, derivatives thereof, or combinations thereof. The sacrificial layer may have a thickness within a range from about 1 nm to about 20 nm. The sacrificial layer may be exposed to a wet etch solution during the etching process. The wet etch solution may contain hydrofluoric acid, a surfactant, and a buffer. In some examples, the sacrificial layer is etched at a rate of about 5 mm/hr or greater.

The epitaxial film or material grown or formed on the wafer may have a plurality of layers. The wafer generally contains gallium arsenide, gallium arsenide alloys, dopants thereof, or derivatives thereof. Each layer of the epitaxial film or material may contain gallium arsenide, aluminum gallium arsenide, indium gallium phosphide, alloys thereof, derivatives thereof, or combinations thereof. In one embodiment, the epitaxial film has a layer containing gallium arsenide and another layer containing aluminum gallium arsenide. The epitaxial film may have a gallium arsenide buffer layer, at least one aluminum gallium arsenide passivation layer, and a gallium arsenide active layer. In some examples, the gallium arsenide buffer layer may have a thickness within a range from about 100 nm to about 500 nm, the aluminum gallium arsenide passivation layer has a thickness within a range from about 10 nm to about 50 nm, and the gallium arsenide active layer has a thickness within a range from about 500 nm to about 2,000 nm. In some specific examples, each epitaxial film contains a photovoltaic or solar cell structure having multiple layers. The photovoltaic cell structure contains at least two materials such as gallium arsenide, n-doped gallium arsenide, p-doped gallium arsenide, aluminum gallium arsenide, n-doped aluminum gallium arsenide, p-doped aluminum gallium arsenide, indium gallium phosphide, alloys thereof, derivatives thereof, or combinations thereof.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2A is a side view of an assembly formed of a plurality of substrates adhered to a support tape, according to embodiments of the invention.

FIG. 2B is a plan view of the bottom of the assembly of FIG. 2A.

FIG. 2C is a side view of an assembly formed of a plurality of epitaxial films attached to a support tape, according to embodiments of the invention.

DETAILED DESCRIPTION

Figure 1:
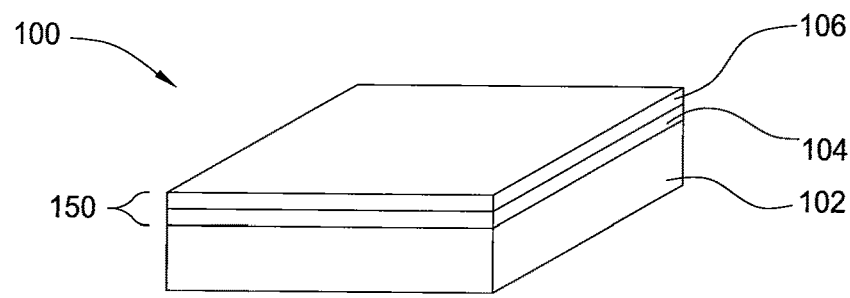
FIG. 1 is a schematic isometric view of a substrate containing an ELO thin film stack on a wafer according to embodiments described herein.

FIG. 1 depicts substrate 100 containing an epitaxial lift off (ELO) thin film stack 150, as described in one embodiment herein. The ELO thin film stack 150 is disposed on or over the wafer 102 and contains an epitaxial film 106 disposed on or over a sacrificial layer 104. The substrate 100 is a relatively difficult product to handle, requiring each ELO thin film stack 150 to be handled separately. In addition, the wafers 102 used to form the epitaxial layers of the ELO thin film stacks 150 are usually expensive, particularly when made of gallium arsenide.

The wafer 102 may contain or be formed of a variety of materials, such as Group III/V materials, and may be doped with other elements. The wafer 102 may be a wafer or a substrate and usually contains gallium arsenide, gallium arsenide alloys or other derivatives, and may be n-doped or p-doped. In one example, the wafer 102 contains n-doped gallium arsenide material. In another example, the wafer 102 contains p-doped gallium arsenide material.

The sacrificial layer 104 may contain aluminum arsenide, alloys thereof, derivatives thereof, or combinations thereof. In one example, the sacrificial layer 104 contains at least an aluminum arsenide layer. The sacrificial layer 104 may have a thickness of about 20 nm or less, such as within a range from about 1 nm to about 20 nm, or from about 1 nm to about 10 nm, or from about 4 nm to about 6 nm.

The epitaxial film 106 generally contains multiple layers of epitaxial materials. In some embodiments, the epitaxial material of the epitaxial film 106 may contain gallium arsenide, aluminum gallium arsenide, indium gallium phosphide, alloys thereof, derivatives thereof, or combinations thereof. The epitaxial film 106 may contain one layer, but usually contains multiple layers. In some examples, the epitaxial film 106 contains a layer having gallium arsenide and another layer having aluminum gallium arsenide. In another example, the epitaxial film 106 contains a gallium arsenide buffer layer, an aluminum gallium arsenide passivation layer, and a gallium arsenide active layer. The gallium arsenide buffer layer may have a thickness within a range from about 100 nm to about 500 nm, such as about 300 nm, the aluminum gallium arsenide passivation layer may have a thickness within a range from about 10 nm to about 50 nm, such as about 30 nm, and the gallium arsenide active layer may have a thickness within a range from about 500 nm to about 2,000 nm, such as about 1,000 nm. In some examples, the epitaxial film 106 further contains a second aluminum gallium arsenide passivation layer. The second gallium arsenide buffer layer may have a thickness within a range from about 100 nm to about 500 nm, such as about 300 nm. In other embodiments herein, the epitaxial film 106 may have a photovoltaic cell structure containing multiple layers. The photovoltaic cell structure may contain gallium arsenide, n-doped gallium arsenide, p-doped gallium arsenide, aluminum gallium arsenide, n-doped aluminum gallium arsenide, p-doped aluminum gallium arsenide, indium gallium phosphide, alloys thereof, derivatives thereof, or combinations thereof.

Figure 2D:
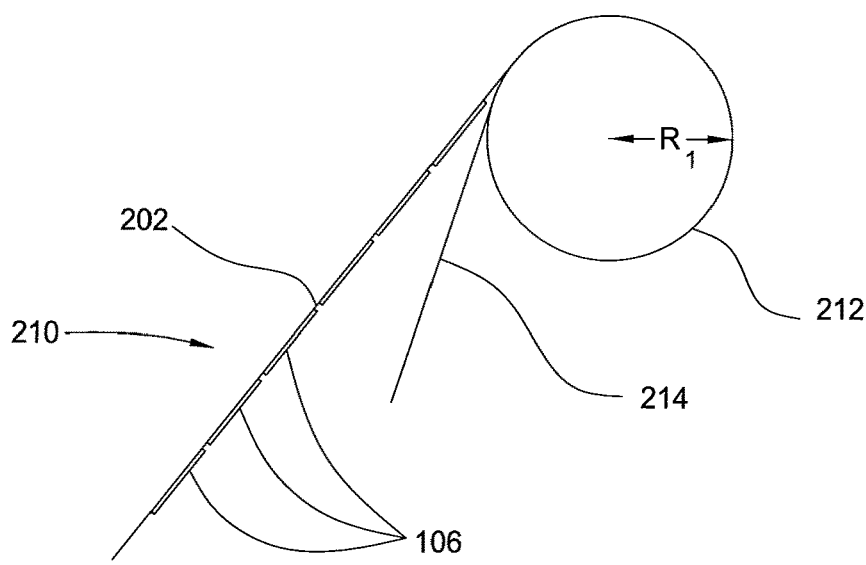
FIG. 2D is a side view of the assembly of FIG. 2C being wound on a support roll, according to embodiments of the invention.

FIGS. 2A-2E depict various stages of transferring the epitaxial film 106 from the wafer 102 to a tape substrate on a roll, according to embodiments of the invention. FIG. 2A is a side view and FIG. 2B is a bottom view of an assembly 200 that includes a plurality (six shown) of the substrates 100 of FIG. 1, attached to a support tape 202. Each of the substrates 100 has a sacrificial layer 104 disposed on or over a wafer 102 and an epitaxial film 106 disposed on or over the sacrificial layer 104. An adhesive layer 204 may be disposed between each of the substrates 100 and the support tape 202.

In one embodiment, the adhesive layer 204 may be applied to the substrates 100 or the epitaxial films 106 before adhering or coupling with the support tape 202. Alternatively, the adhesive layer 204 may be applied to the support tape 202 before adhering or coupling with the substrates 100 or the epitaxial films 106. Also, the adhesive layer 204 may be applied to both the support tape 202 and the substrates 100 or the epitaxial films 106 and subsequently, adhering or coupling together. The adhesive layers 204 may be made of a pressure sensitive adhesive (PSA), a hot melt adhesive, an ultraviolet (UV) curing adhesive, an acrylic adhesive, a rubber adhesive, a natural adhesive (e.g., natural rubber), a synthetic adhesive (e.g., synthetic rubber), derivatives thereof, or combinations thereof. The material of the adhesive layers 204 is at least substantially resistant to the etchant used in the etching process as described below.

In some examples, the adhesive layers 204 may be formed from or contain an optical adhesive and/or a UV-curable adhesive that has been exposed to UV radiation during a curing process. Generally, the adhesive may be exposed to the UV radiation for a time period within a range from about 1 minute to about 10 minutes, preferably, from about 3 minutes to about 7 minutes, such as about 5 minutes. The adhesive may be cured at a temperature within a range from about 25° C. to about 75° C., such as about 50° C. An exemplary optical adhesive is commercially available as Norland UV-curable optical adhesive. In some examples, the adhesive layers 204 may contain a mercapto ester compound. In other examples, the adhesive layers 204 may further contain an adhesive material such as butyl octyl phthalate, tetrahydrofurfuryl methacrylate, acrylate monomer, isomers thereof, derivatives thereof, or combinations thereof. In one example, the adhesive layers 204 may contain an acrylic compound or derivatives thereof.

In other examples, the adhesive of the adhesive layers 204 may be a silicone adhesive or may contain sodium silicate. In these examples, the adhesive may be cured for a time period within a range from about 10 hours to about 100 hours, preferably, from about 20 hours to about 60 hours, and more preferably, from about 30 hours to about 50 hours, for example, about 42 hours. The adhesive may be cured at a temperature within a range from about 25° C. to about 75° C., such as about 50° C. Also the adhesive may be cured by applying a pressure thereto. The pressure applied to the adhesive may be within a range from about 1 psi (pounds per square inch) to about 50 psi, preferably, from about 3 psi to about 25 psi, and more preferably, from about 5 psi to about 15 psi. In one example, the pressure is about 9 psi.

In other examples, the adhesive layers 204 may contain a polymer, a copolymer, an oligomer, derivatives thereof, or combinations thereof. In one embodiment, the adhesive layer 204 contains a copolymer. In one example, the copolymer may be an ethylene/vinylacetate (EVA) copolymer or derivatives thereof. An EVA copolymer which is useful as the adhesive layer 204 is WAFER GRIP adhesive film, commercially available from Dynatex International, located in Santa Rosa, Calif.

In one embodiment, the support tape 202 is an elongated thin strip of material. In some embodiments, the support tape 202 is similar in structure to photographic film. The elongated support tape, such as support tape 202, may be coupled with each substrate 100 through each epitaxial film 106 by an adhesive or adhesive layer 204. There is a plurality of substrates 100 coupled with the support tape 202. Generally, there may be 4, 8, 10, 20, 50, 100, or more substrates attached to the support tape 202. In some embodiments, the support tape 202 may have from about 4 substrates to about 100 substrates or more.

The support tape 202 may have a single layer or may contain multiple layers of the same or different materials. The material of the support tape 202, in some embodiments, includes metallic, plastic, polymeric, co-polymeric, and/or oligomeric materials. In some examples, the support tape 202 may be formed from or contain polyacrylic materials, polyethylene materials, polypropylene materials, polytetrafluoroethylene materials, fluorinated polymeric materials, isomers thereof, derivatives thereof, or combinations thereof. The material of the support tape 202 is at least substantially resistant to the etchant used in the etching process as described below. In some embodiments, the support tape 202 contains at least one metal, or contains at least one metallic foil. The metallic foil may contain at least one metal such as iron, nickel, cobalt, steel, stainless steel, alloys thereof, derivatives thereof, or combinations thereof.

The support tape 202 may have a width $W_1$ that is between about 10 mm and about 1,000 mm, or about 50 mm to about 300 mm, or about 70 mm to about 150 mm, in various embodiments. The overall length (not shown) of the support tape 202, is only limited by the size of the storage rolls or reels that the support tape 202 is wound upon. In one embodiment the length of the support tape 202 is between about 1 m and about 1,000 m. Each substrate 100 may have a length $L_1$ in the longitudinal direction of the support tape 202 and a width $W_2$, traverse to the support tape 202. In one embodiment, $L_1$ is between about 8 mm and about 950 mm, while $W_2$ is between about 8 mm and about 950 mm. The substrates 100, in one embodiment, are substantially centered on the tape, and spaced a distance $D_1$ from each other. In one embodiment, $D_1$ is between about 2 mm and about 20 mm.

The support tape 202 may optionally include track openings 206 along the sides of the support tape 202 for engagement by drive elements as described below with respect to various embodiments of the apparatus. In addition, the support tape 202 may include regularly spaced slots 208, in some embodiments, to provide a greater degree of flexibility in the transverse direction, as required. The slots 208 are generally centered between two adjacent substrates 100, and in one embodiment have a width $W_3$ that is between about 0.5 mm and about 2 mm. In one embodiment, the slots 208 are located between substrates 100 such that between about 2 substrates and about 5 substrates are between adjacent slots 208. Further, in some embodiments, the slots 208 extend between about 25% and about 90% to the center of the support tape 202. For example, for tapes having a width $W_1$ of about 20 mm, and slots 208 that extend for about 7 mm each, then each slot 208 would extend about 70% to the center of the support tape 202, leaving a connecting edge of about 6 mm between the slots 208.

In FIG. 2C, a side view of an assembly 210 is shown that includes a plurality (six shown) of the epitaxial films 106 of FIG. 2A, attached to the support tape 202 by the adhesive layers 204. There may be 4, 8, 10, 20, 50, 100, or more epitaxial films 106 attached to the support tape 202. In some embodiments, the support tape 202 may have from about 4 epitaxial films to about 100 epitaxial films or more within the plurality of epitaxial films 106.

In some embodiments, the assembly 210 is formed by exposing the sacrificial layer 104 in the assembly 200 of FIGS. 2A and 2B to a wet etch solution during an ELO etching process. In some examples, the wet etch solution contains hydrofluoric acid and may contain a surfactant and/or a buffer. The sacrificial layer 104 may be etched at a rate of about 0.3 mm/hr or greater, preferably, about 1 mm/hr or greater, and more preferably, about 5 mm/hr or greater. In an alternative embodiment, the sacrificial layer 104 may be exposed to an electrochemical etch during the ELO etching process. The electrochemical etch may be a biased process or a galvanic process. Also, the sacrificial layer 104 may be exposed to a vapor phase etch during the ELO etching process in another embodiment described herein. The vapor phase etch includes exposing the sacrificial layer 104 to hydrogen fluoride vapor. The ELO etching process may be a photochemical etch, a thermally enhanced etch, a plasma enhanced etch, a stress enhanced etch, derivatives thereof, or combinations thereof.

In FIG. 2D, a side view is shown of the assembly 210 of FIG. 2C being wound on a support reel or a support roll 212. The assembly 210 includes the support tape 202 with a plurality of epitaxial films 106 attached or adhered thereto as described above. The assembly 210 is shown being wound around roll 212 with the epitaxial films 106 attached to the bottom of the support tape 202 such that the epitaxial films 106 are faced toward the surface of the roll 212. In an alternate embodiment, the epitaxial films 106 may be above the support tape 202 such that the epitaxial films 106 are faced away from the surface of the roll 212. A protective film or sheet 214 may be provided to protect the epitaxial films 106 from adjacent surfaces. The roll 212 has a minimum (unloaded) radius of $R_1$. In one embodiment, the radius $R_1$ of the roll 212 is between about 10 cm to about 100 cm. The radius $R_1$ of the roll 212 is an important design consideration, as the epitaxial films 106 may be cracked or otherwise damaged if they are subjected to a radius of curvature that is too small. Thus the radius $R_1$ of the roll 212 is chosen based on the structural limitations of the epitaxial films 106. Once the roll 212 is loaded with an appropriate length of assembly 210, as shown in FIG. 2E, a large number of epitaxial films 106 may be handled, transported, or loaded into subsequent processing apparatus as an assembly 220.

Figure 2E:
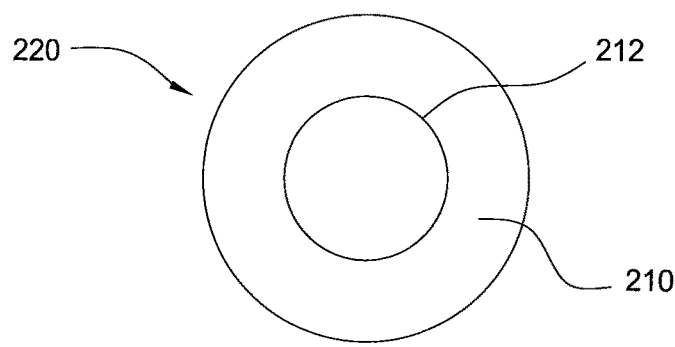
FIG. 2E is a side view of an assembly including the assembly of FIG. 2C wound on a support roll, according to embodiments of the invention.
Figure 3:
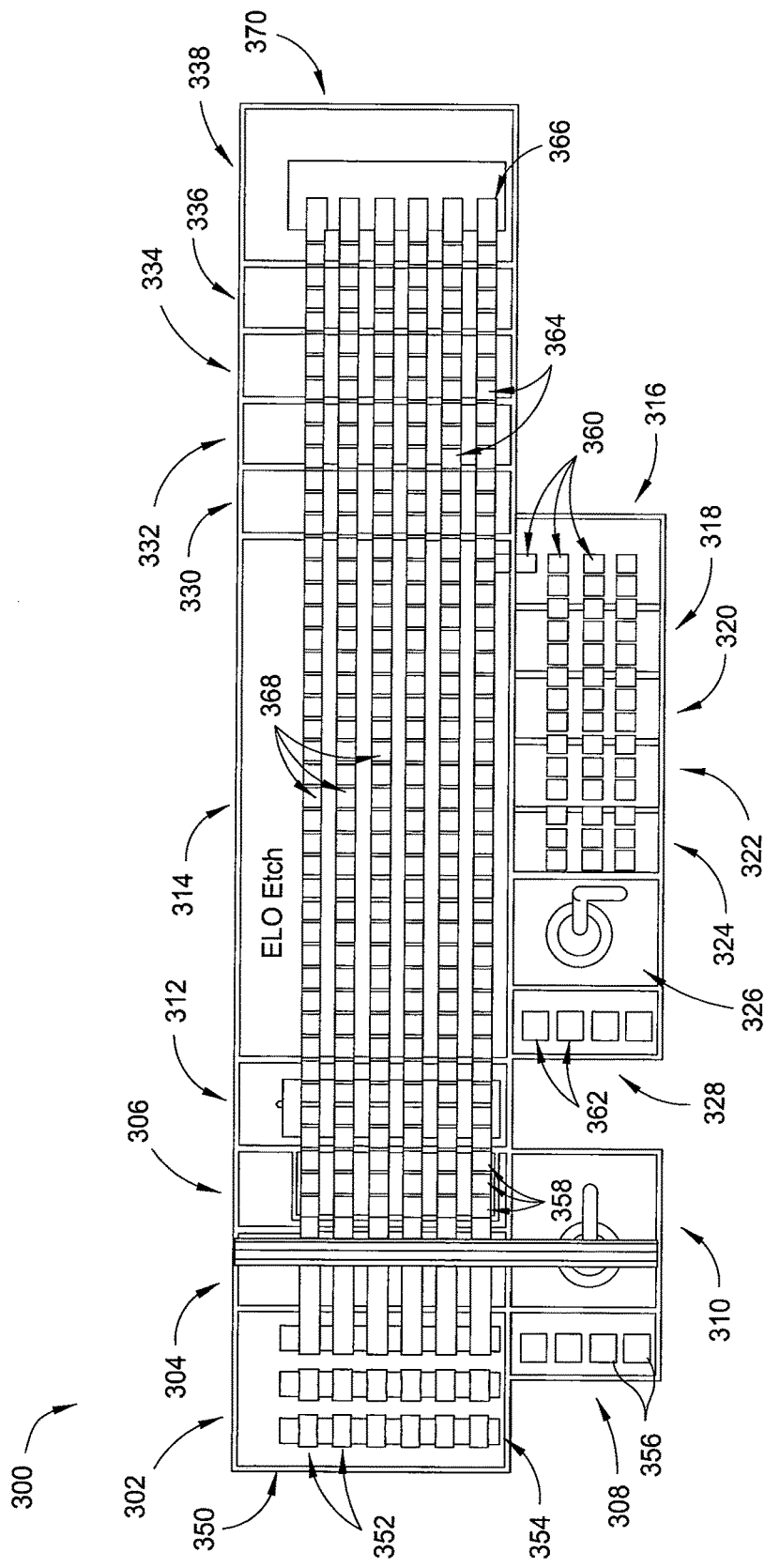
FIG. 3 is a schematic plan view of one embodiment of an apparatus for forming tape based ELO films and devices.
Figure 39:
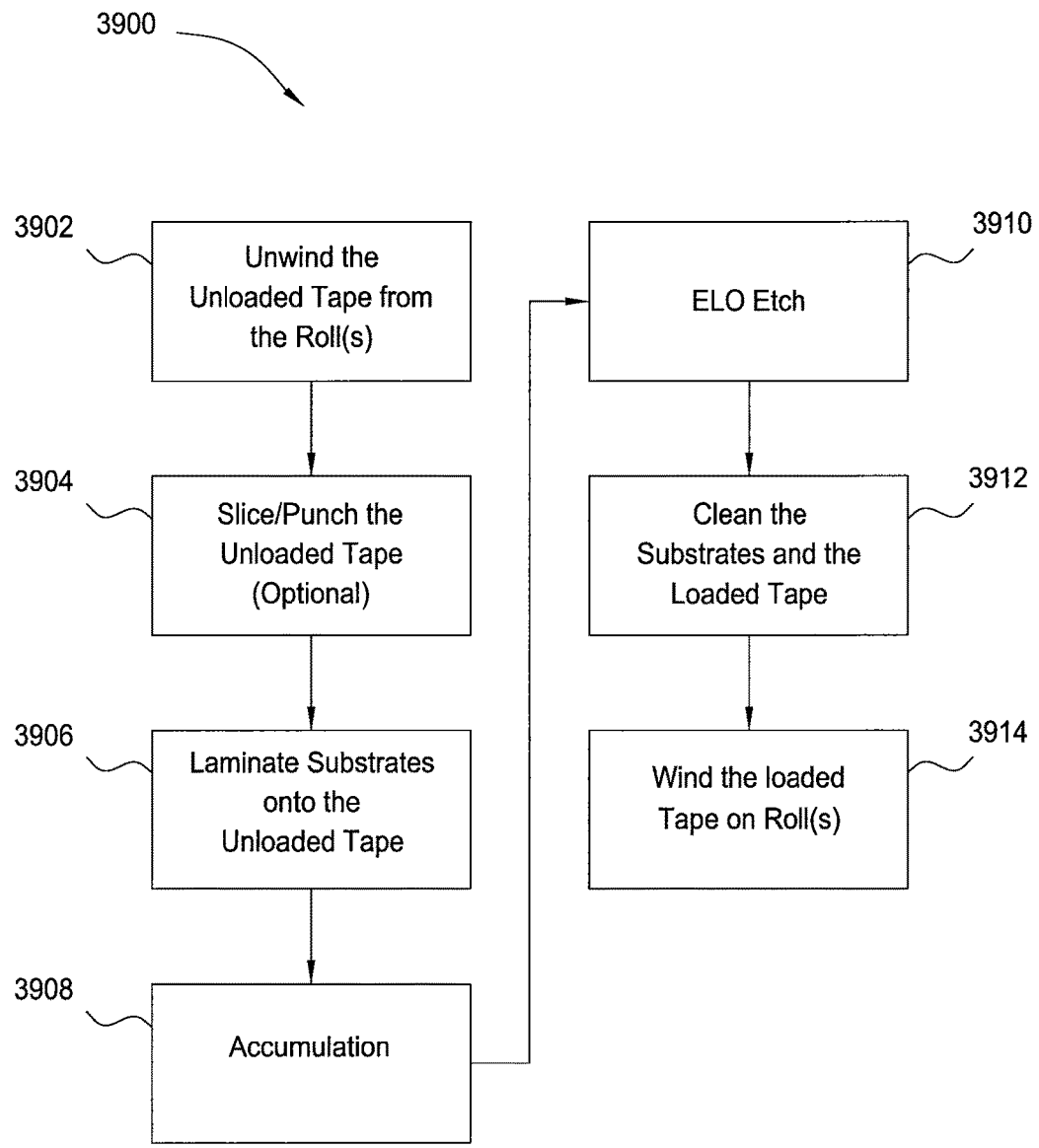
FIG. 39 is a flow chart illustrating one embodiment of a method for forming ELO thin films and devices that may be performed by the apparatus of FIG. 3.

In FIG. 3 is a schematic plan view of one embodiment of an apparatus 300 that is useful for performing a method of forming tape based ELO products such as assembly 220 in FIG. 2E. FIG. 39 is a flow chart of a method 3900 that in one embodiment is performed by apparatus 300. At a first end 350 of the apparatus 300, a first section 302 includes one or more reels or rolls 354 containing one or more blank or unloaded support tapes 352. In the embodiment shown in FIG. 3, there are six parallel support tapes 352. However, it should be understood that there may be any number of support tapes 352 loaded on one or more rolls 354, within the physical restrictions of apparatus 300. In block 3902 of method 3900, the unloaded support tapes 352 are unwound from the roll(s), and the unloaded support tapes 352 are fed from the roll(s) 354 into a splice/punch section 304. In block 3904 of method 3900, in the splice/punch section 304, the unloaded support tapes 352 are cut, punched, or a combination of cut and punched to form openings in the tape, as required for handling and other purposes. In one embodiment, for example, the openings formed in the support tapes 352 in the splice/punch section 304, include the track openings 206 and the slots 208, as shown in FIG. 2B. In other embodiments, openings may not be required, and the splice/punch section 304 may be omitted from apparatus 300.

In block 3906 of method 3900, after block 3904 (if provided), substrates or wafers are laminated onto the unloaded support tapes. As shown in FIG. 3, after the splice/punch section 304 (when provided) the unloaded support tapes 352 enter a lamination section 306. The lamination section 306 receives substrates 356 from a substrate input section 308. In one embodiment, a robot 310 may be used to load the substrates 356 into the lamination section 306. The substrates 356 may, in one embodiment, be similar in structure to the substrate 100 of FIG. 1. In the lamination section 306, the substrates are attached, adhered or otherwise bonded to the support tapes 352, as shown by substrates 358 bonded to the loaded support tapes 368. In one embodiment, the loaded support tapes 368 are similar in structure to assembly 200 as shown in FIGS. 2A and 2B.

The loaded support tapes 368 enter an accumulation section 312 after leaving the lamination section 306. In the accumulation section 312, the loaded support tapes 368 are accumulated prior to entering etch bath reservoirs or tanks within the ELO etch section 314, as illustrated by block 3908 of method 3900.

After the accumulation section 312, the loaded support tapes 368 enter etch bath reservoirs or tanks within an ELO etch section 314. In the ELO etch section 314, the sacrificial layer (for example sacrificial layer 104 in FIGS. 1 and 2A), is etched to remove the sacrificial layer and the wafer (for example, wafer 102 in FIGS. 1 and 2A), from the loaded support tapes 368, in block 3910 of method 3900. The resulting ELO film loaded support tapes 364, proceed to tape post etch processing sections, while the unloaded substrates 360 proceed to wafer post etch processing sections, in block 3912 of method 3900. The unloaded substrates 360 enter a conveyor loading section 316, where the unloaded substrates 360 are placed on a conveyor, for example, by a robot (not shown). In one embodiment, the wafer post etch processing sections include a first wafer rinsing section 318, a wafer cleaning section 320, a second wafer rinsing section 322 and a wafer drying section 324. The wafer post etch processing sections are designed to prepare the wafers to be reused in the process, by removing contaminates from the wafers. A robot 326 unloads the substrates from the wafer drying section 324 to a wafer output section 328. The wafers 362 in the wafer output section 328 are ready to have sacrificial and epitaxial material layers redeposited thereon. A conveyor (not shown) may redirect the wafers 362 to a deposition chamber or process. Once the sacrificial layers and epitaxial films are deposited on the substrates, the substrates may be further conveyed to substrate input section 308 as substrates 356, to be reused in the process. In this manner, the relatively expensive wafers may be used multiple times to grow the desired epitaxial thin films and devices.

After removal of the sacrificial layer and the wafer from the loaded support tapes 368, the resulting ELO film loaded support tapes 364, proceed to tape post etch processing sections. The tape post etch processing sections, in one embodiment, include a first tape rinsing section 330, a tape cleaning section 332, a second tape rinsing section 334 and a tape drying section 336. In one embodiment, the ELO film loaded support tapes are similar to the assembly 210 as shown in FIG. 2C. The tape post etch processing sections are designed to clean and dry the ELO film loaded support tapes 364 to remove contaminates from the tape and epitaxial material loaded thereon.

Once the ELO film loaded support tapes 364 have been cleaned, they proceed to a tape winding section 338 located at a second end 370 of the apparatus 300. In the tape winding section 338 the ELO film loaded support tapes 364 are wound onto one or more reels or rolls 366, such as shown in FIG. 2D, and in block 3914 of method 3900. Once the roll 366 is fully loaded, the loaded roll is removed from the tape winding section 338 and is replaced by an empty roll. In one embodiment, the loaded roll is similar to assembly 220 as shown in FIG. 2E.

Figure 4:
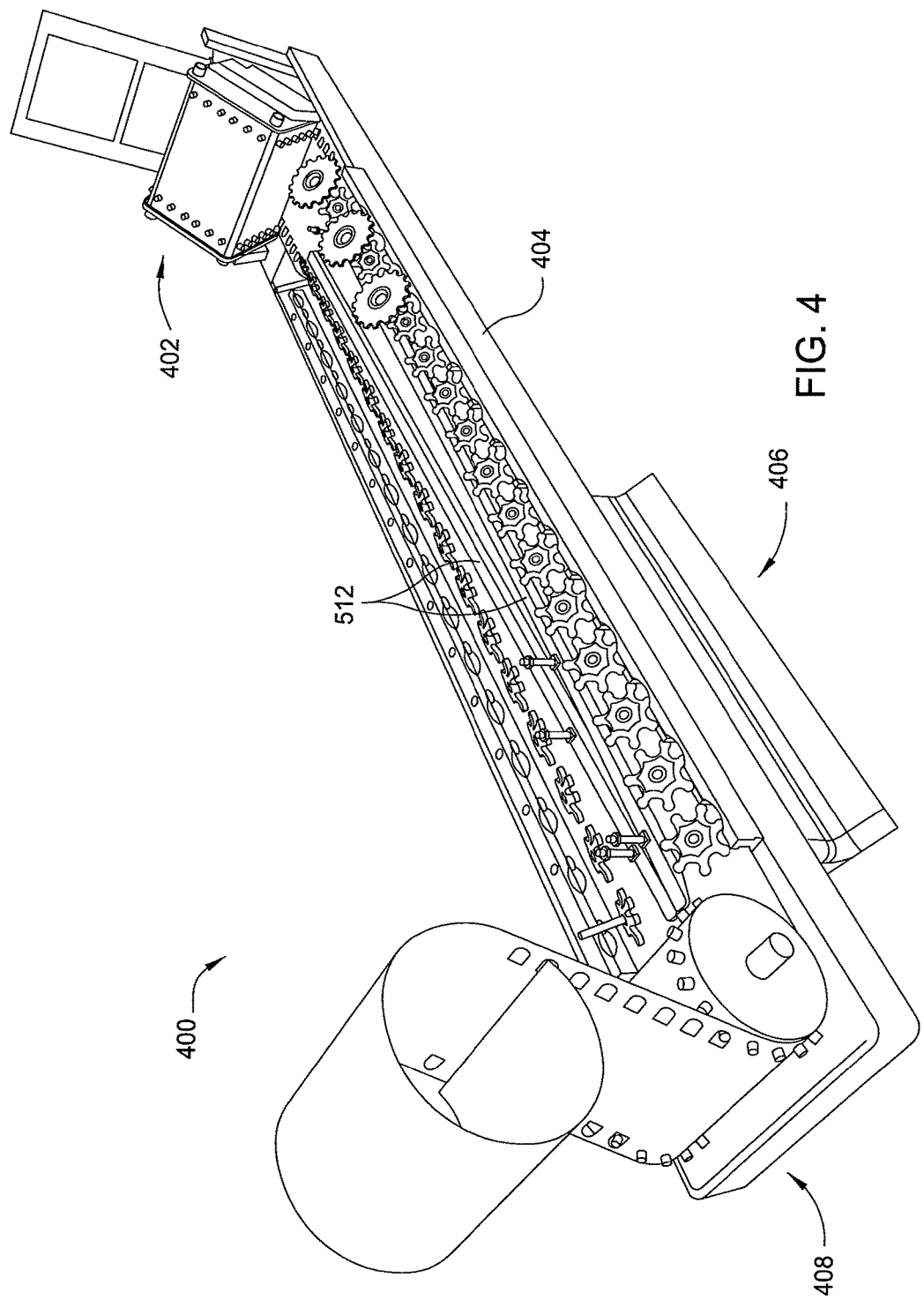
FIG. 4 is a schematic isometric view of one embodiment of an apparatus for performing an ELO process to remove ELO films from support wafers.
Figure 5:
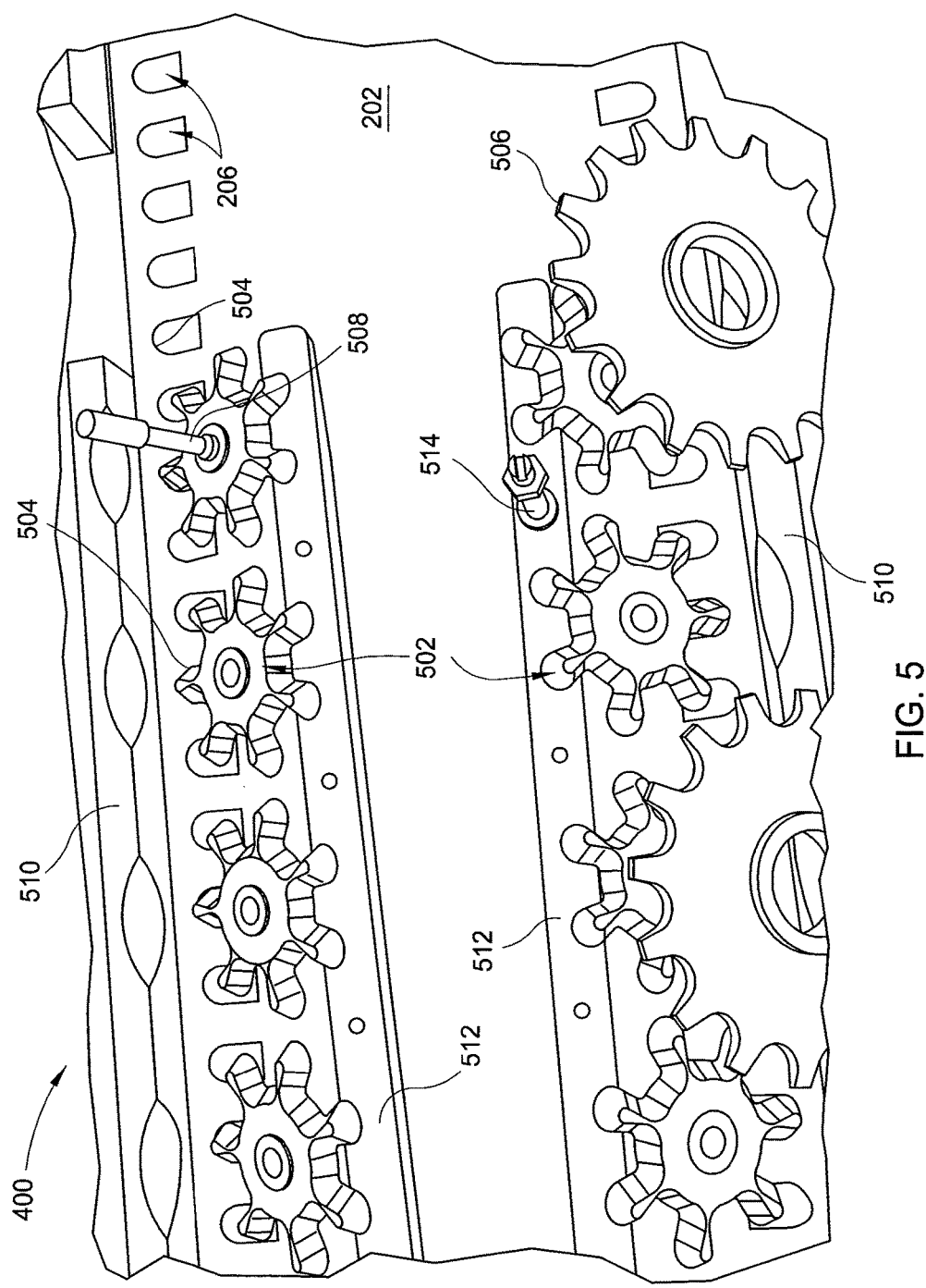
FIG. 5 is an enlarged overhead isometric view of the tape drive and tensioning portion of the apparatus of FIG. 4.
Figure 6:
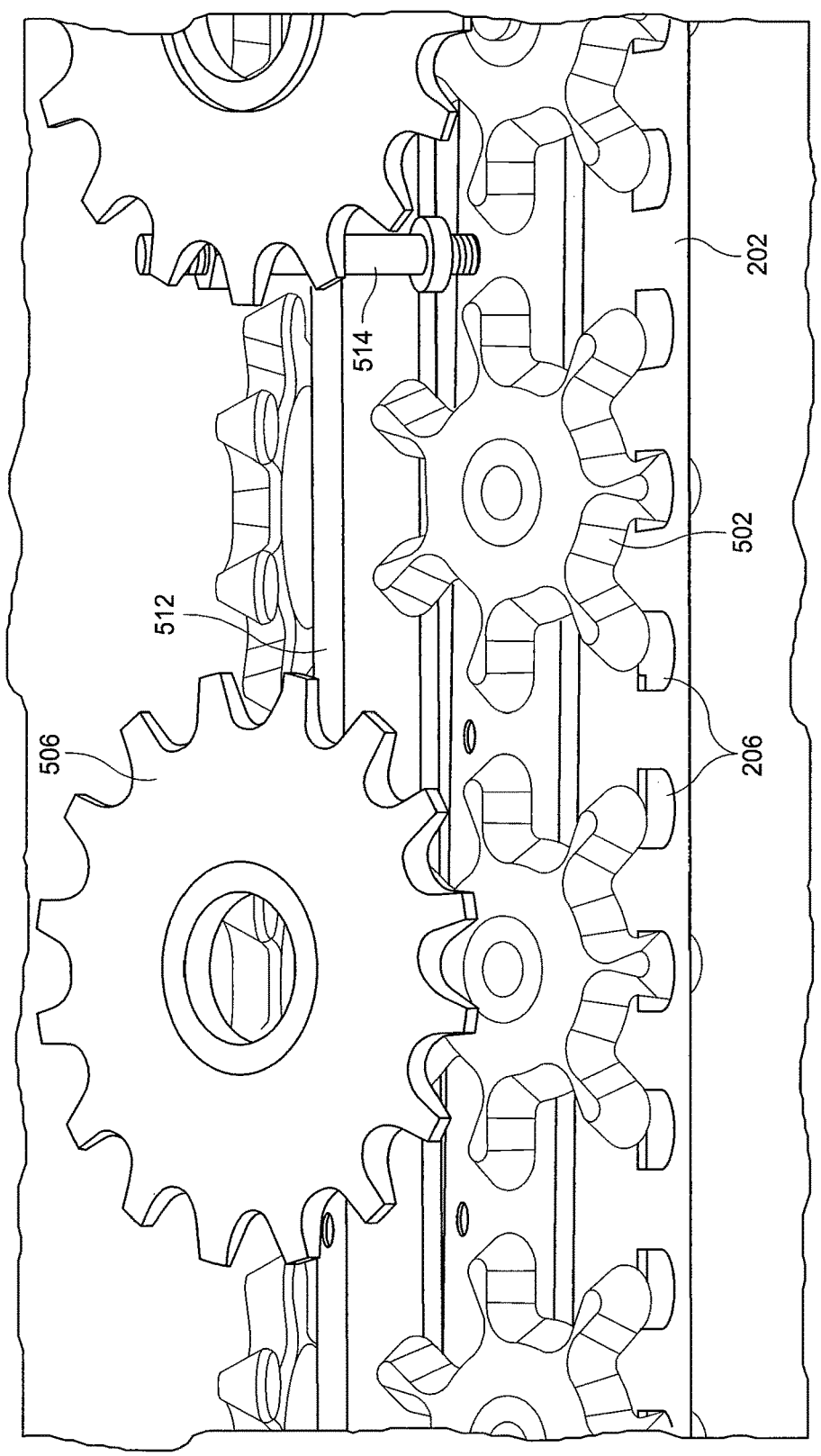
FIG. 6 is an enlarged horizontal isometric view of the tape drive and tensioning portion of the apparatus of FIG. 4.

In FIGS. 4-6, a longitudinal geared wedge embodiment of an apparatus 400 for performing an ELO etch process to remove ELO film stacks from support wafers, is shown. The apparatus 400 includes a tape and wafer loading section 402, an etch bath 404, a wafer unload section 406, and a tape unload section 408. FIG. 5 shows an overhead view of a portion of the etch bath 404 and the tape drive and tensioning portion of the apparatus 400. The support tape 202 includes a plurality of openings or track openings 206 along its sides, similar to those shown in FIG. 2B. The apparatus 400 includes a plurality of drive and tensioning gears 502 that engage the tape in the track openings 206. The drive and tensioning gears 502 drive the tape through the etch bath 404, while also maintaining the lateral position of the sides of the support tape 202 by engaging the outside portion 504 of the track openings 206. The drive and tensioning gears 502 are connected to driven sprockets 506 by drive shafts 508. The driven sprockets 506 may in turn be attached to a driving sprocket and motor (not shown) by a drive chain or belt (not shown). The driven sprockets 506 and the elements that drive them are, in one embodiment, located above the etch bath 404. Tape guides 510, may also be provided to guide the support tape 202 through the etch bath 404. Referring to FIGS. 4-6, a static wedge is shown formed by two ramps 512. The static wedge progressively applies pressure to remove the wafers 102 from the support tape 202, while leaving the ELO stack on the support tape 202. A number of adjustable supports 514 adjustably connect the ramps 512 to an overhead assembly (not shown). The adjustable supports 514 may be threaded, or otherwise adjustable, to provide adjustment of the level of the ramps 512 at the various stages of the etch bath 404.

As depicted in FIG. 4, the ramps 512 are spaced apart at their first end adjacent to the tape and wafer loading section 402, and converge toward one another at their second end adjacent to the tape unload section 408. The ramps 512 also extend further down into the etch bath 404 from their first end to their second end and thereby increasingly engage the top of the support tape 202 as it travels through the etch bath 404. The wafers 102 are supported from below by a substrate support (not shown) that supports the wafers 102 near the tape unload section 408 of apparatus 400 using a spring or buoyancy applied force.

Figure 6A:
FIGS. 6A-6C are cross sections of the tape and wafer assembly as it proceeds through the apparatus of FIG. 4.
Figure 6B:
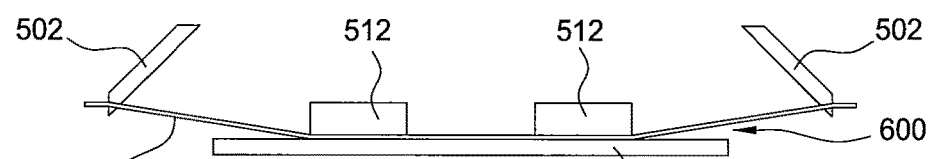
Figure 6C:
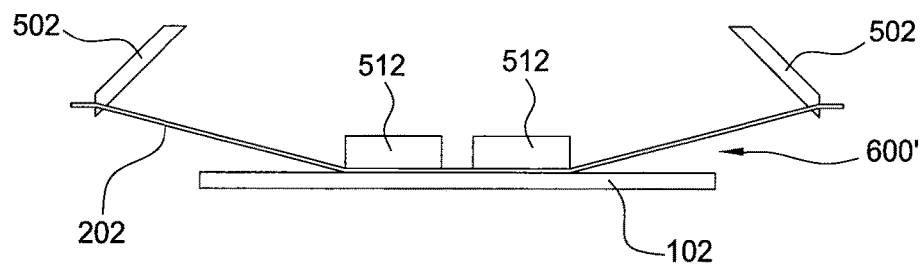

FIGS. 6A-6C are schematic diagrams illustrating the relationship between the ramps 512, the support tape 202, and wafers 102, as the support tape 202 and wafers 102 proceed through the etch bath 404 (see FIG. 4). In FIG. 6A, the support tape 202 and wafer 102 are in an initial position of the etch bath 404. The ramps 512 are substantially at the initial level of the support tape 202 and the wafers 102, and the assembly is therefore relatively planar, with little or no pressure being applied to the support tape 202 and wafers 102. The drive and tensioning gears 502 maintain the position of the ends of the support tape 202. In the position shown in FIG. 6B, (approximately halfway through the etch bath 404), the ramps 512 are extended further into the etch bath 404, and the center of the tape and the wafer 102 are pushed downward relative to the ends of the support tape 202. A crevice 600 is therefore formed between the support tape 202 and the wafer 102 (and the ELO stack thereon). In the position shown in FIG. 6C, (at a point near the tape unload section 408), the ramps 512 are extended even further into the etch bath 404, and the center of the tape and the wafer 102 are pushed further downward relative to the ends of the support tape 202. The size of the crevice 600' is increased as compared to crevice 600 and the wafer 102 is increasingly removed from the support tape 202. At a point in the progression slightly after the illustration shown in FIG. 6C, the adhesion between the support tape 202 and the wafer 102 is minimal, and the wafer 102 is removed from the support tape 202, and exits through the wafer unload section 406.

Figure 7:
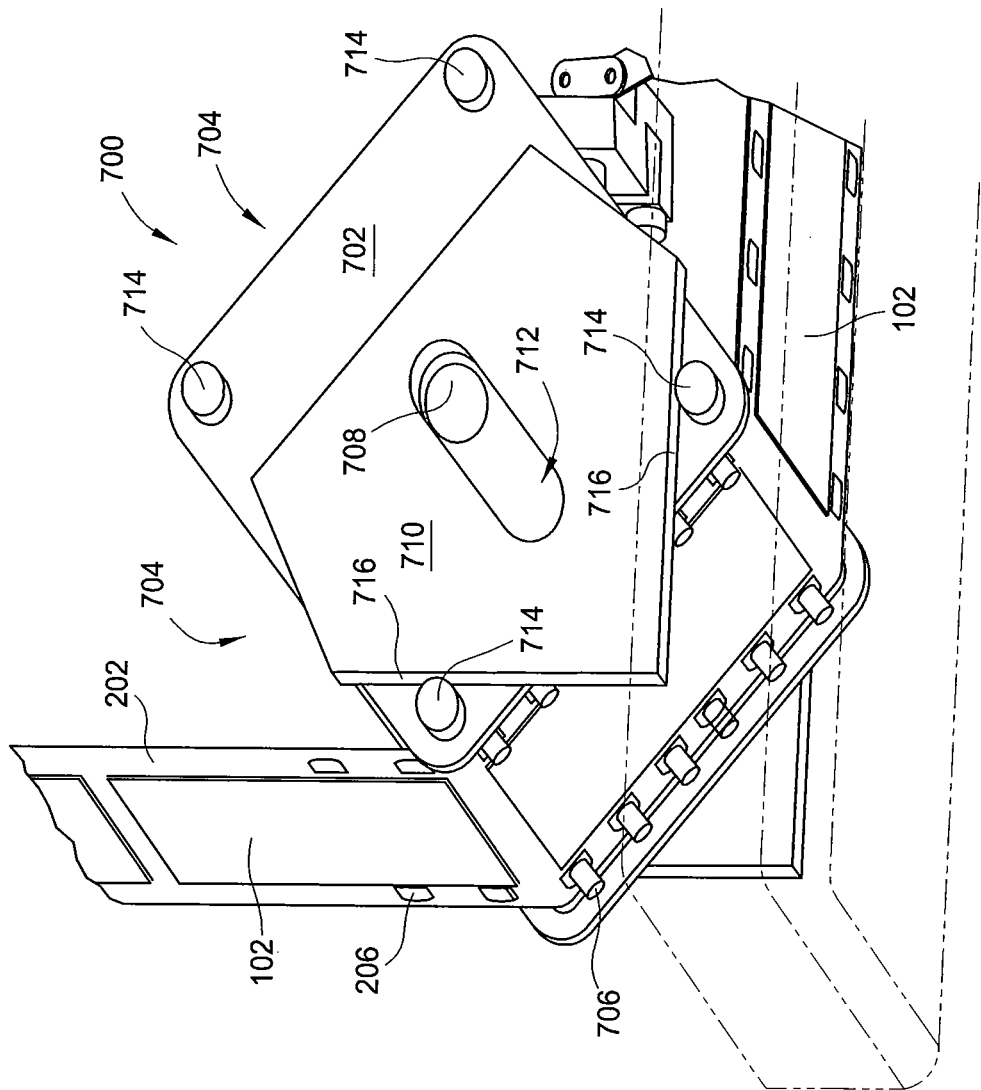
FIG. 7 is an isometric view of a tape and wafer tank entry assembly for use with embodiments of the ELO process apparatus of the invention.

FIG. 7 is an isometric view of one embodiment of a tape and wafer tank entry assembly 700 for use in the tape and wafer loading section 402, (see FIG. 4), of various embodiments of the ELO process apparatus of the invention. The tape and wafer tank entry assembly 700, includes a tape and wafer guiding block 702. While in this embodiment, the tape and wafer guiding block 702 has four tapes engaging sides 704, other numbers of sides may be used. Each tape engaging side 704 includes a plurality of pins 706 for engaging the track openings 206 in the support tape 202. The tape and wafer guiding block 702 rotates about a shaft (not shown) that extends through a centrally located hole 708. A shaft support plate 710 is provided on opposite sides of the tape and wafer guiding block 702, for supporting and guiding the shaft. A slot 712 is provided in each shaft support plate 710, and allows the shaft to oscillate as the tape and wafer guiding block 702 rotates. The tape and wafer guiding block 702 includes guiding pins 714 on each corner of the sides through which the hole 708 extends. The guiding pins 714 engage sides 716 of the shaft support plates 710, so that each corner of the wafer guiding block 702 travels substantially vertically down into the etch bath, before traveling horizontally. The combined interaction of these elements, provides a planar support for each wafer 102 on a side 704 of the wafer guiding block 702 to decrease the likelihood that the support tape 202 is torn or otherwise removed from the wafers 102 prior to entering the etch bath 404. By supporting the wafers 102 in this fashion, the chance of the ELO stack being damaged is reduced as the tape and wafer assembly enters the etch bath 404.

Figure 8:
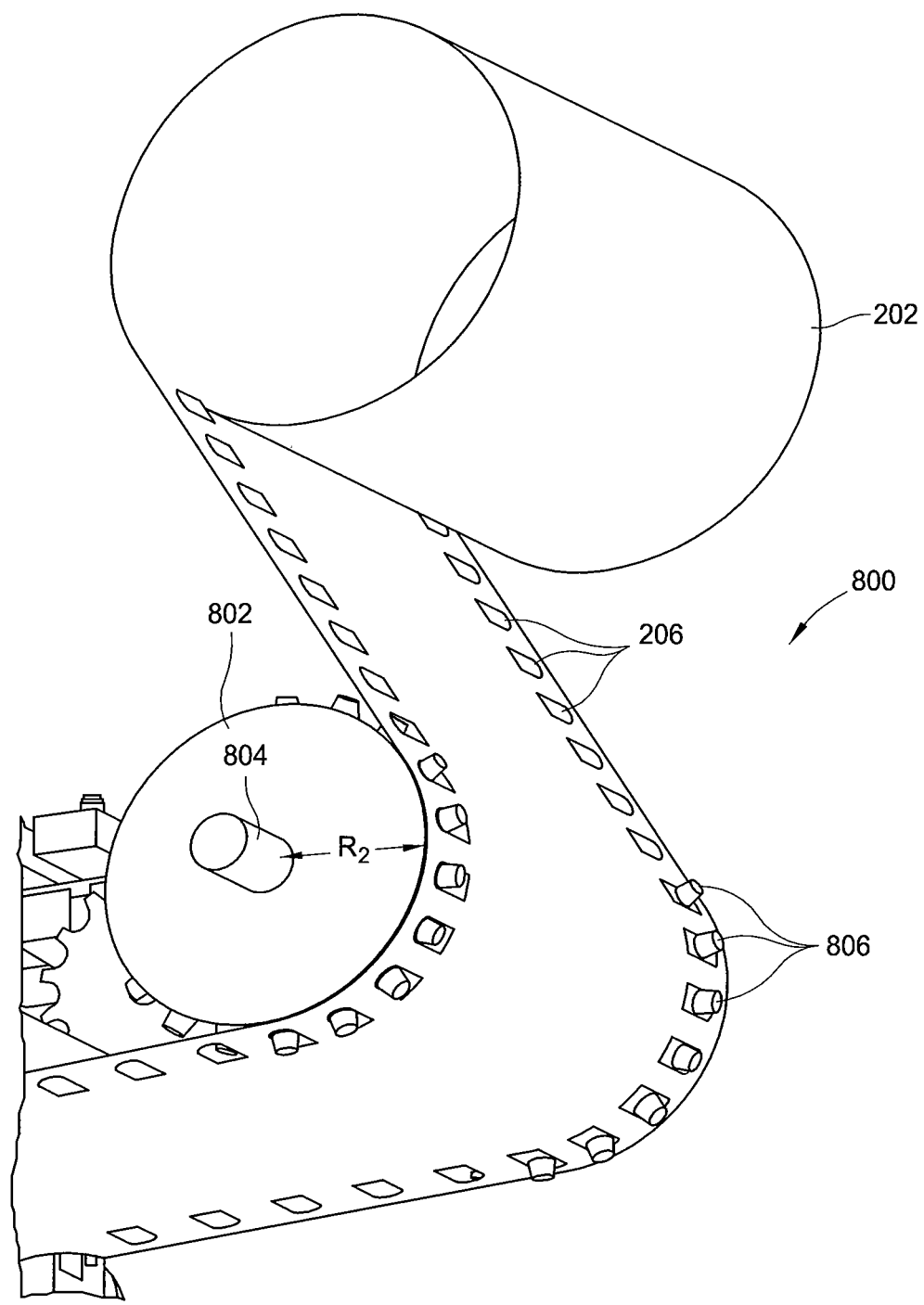
FIG. 8 is an isometric view of a tape extraction assembly for use with embodiments of the ELO process apparatus of the invention.

In FIG. 8, an embodiment of a tape extraction assembly 800 is shown for use in the tape unload section 408 of the various ELO process apparatuses of the invention. The support tape 202 includes the ELO films that have been removed from the wafers 102 in the etch bath 404 as previously described. The tape extraction assembly 800 includes a tape engaging drum or roller 802 that rotates about a support shaft 804. The roller 802 includes a plurality of pins 806 that engage the track openings 206 in the support tape 202. In some embodiments, the pins 806 may be formed by attaching a cog or a sprocket to the roller 802. Alternatively, the roller 802 containing may be formed or manufactured as a single device. The radius $R_2$ of the roller 802 is of a sufficient size to avoid damaging the ELO films or stacks on the support tape 202, as described above with respect to $R_1$ of FIG. 2D. In one embodiment, after disengaging from the roller 802, the support tape 202 with the ELO films or stacks thereon, proceeds to the tape post etch processing sections of apparatus 300 as described above.

Figure 9:
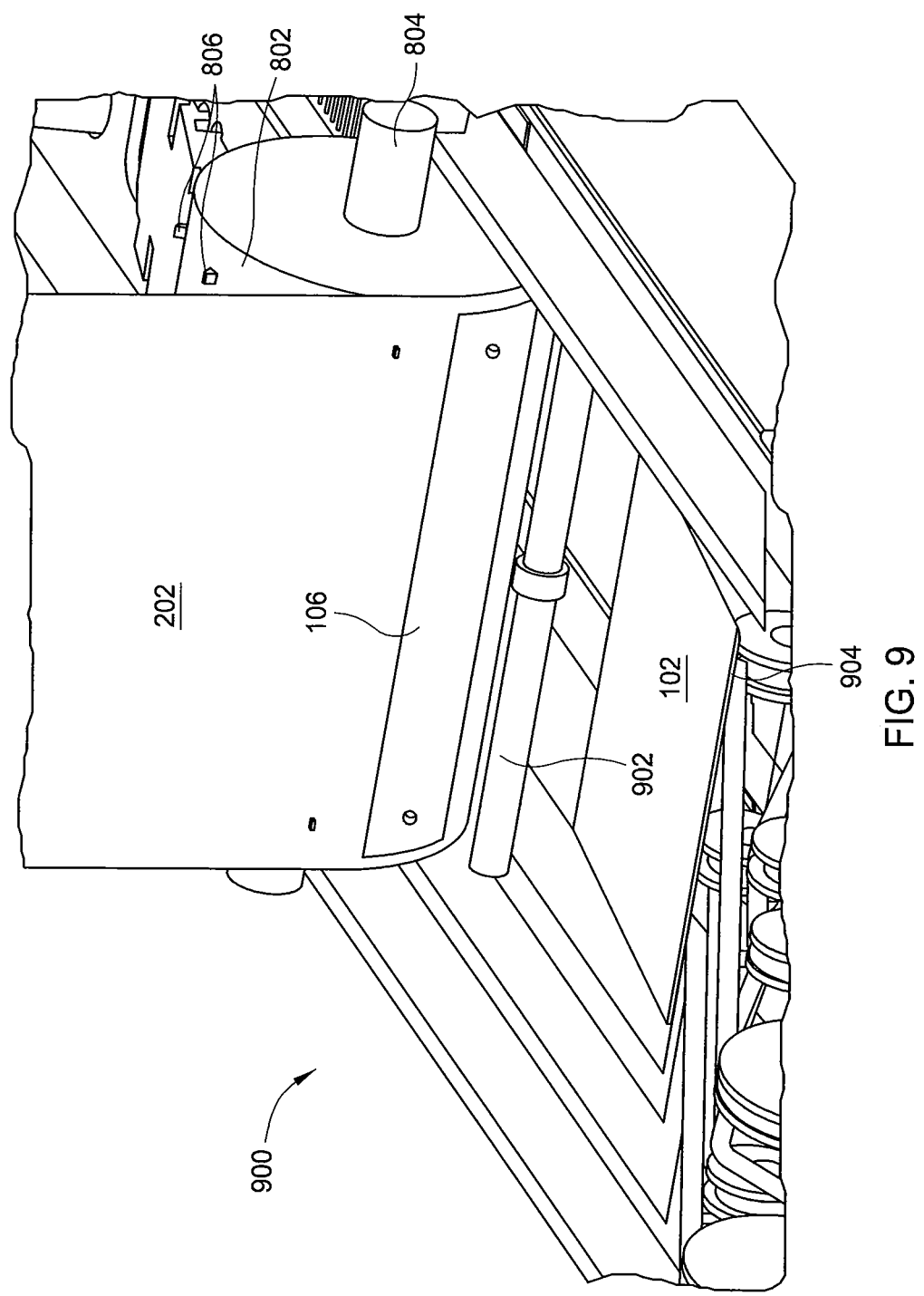
FIG. 9 is an isometric view of a positive substrate detachment assembly for use with embodiments of the ELO process apparatus of the invention.

In some cases, the wafers 102 may not be fully removed from the support tape 202 in the etch bath, due to various processing variables. FIG. 9 depicts a positive substrate detachment assembly 900, which may be used with the various embodiments of the ELO process apparatuses of the invention. The positive substrate detachment assembly 900 includes a wafer engaging bar 902 that contacts the leading edge 904 of any wafers 102 remaining on the support tape 202 once the support tape 202 reaches the roller 802. As the support tape 202 is driven around the roller 802 by pins 806, the wafer engaging bar 902 peels the wafer 102 from the support tape 202. While this action may damage the ELO stack, such as epitaxial film 106 associated with the wafer 102, the positive substrate detachment assembly 900 avoids manual intervention by technicians, thereby decreasing downtime and increasing product throughput.

Figure 10:
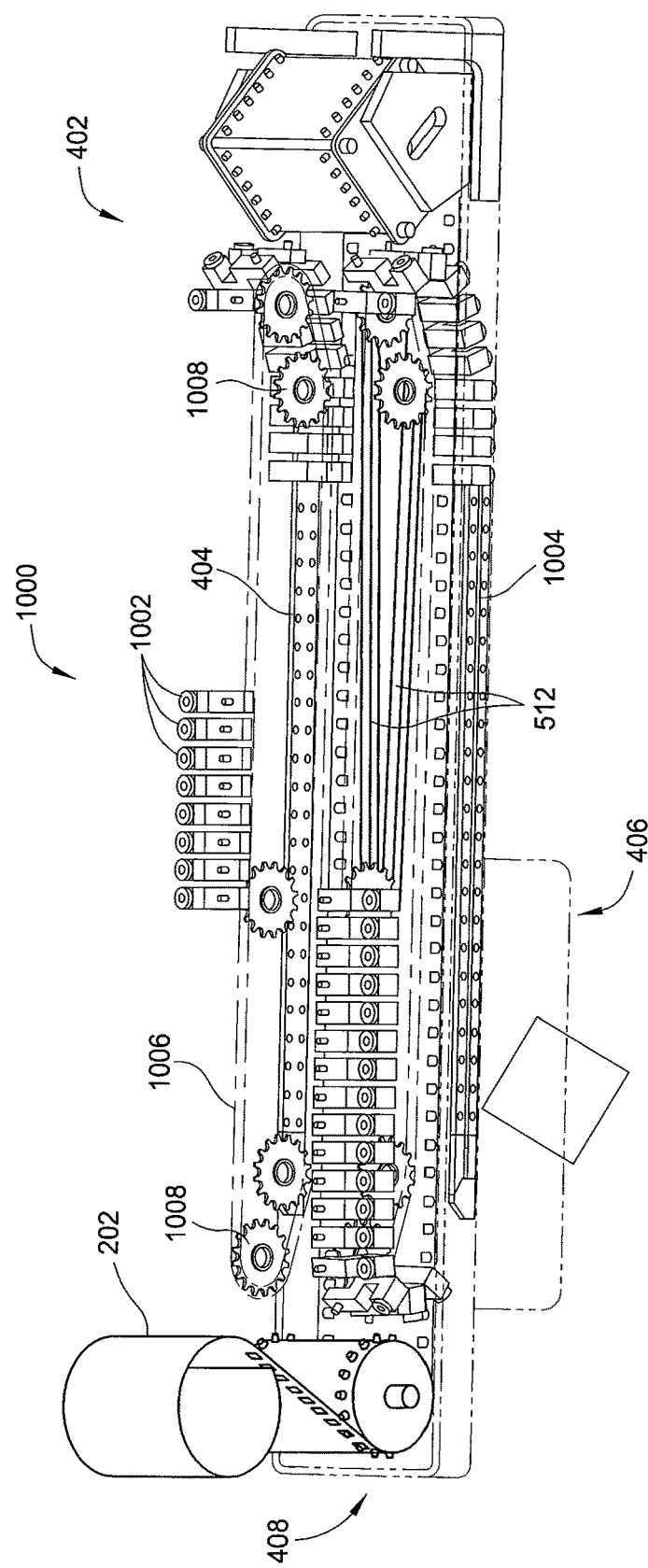
FIG. 10 is a schematic isometric view of a further embodiment of an apparatus for performing an ELO process to remove ELO films from support wafers.
Figure 11:
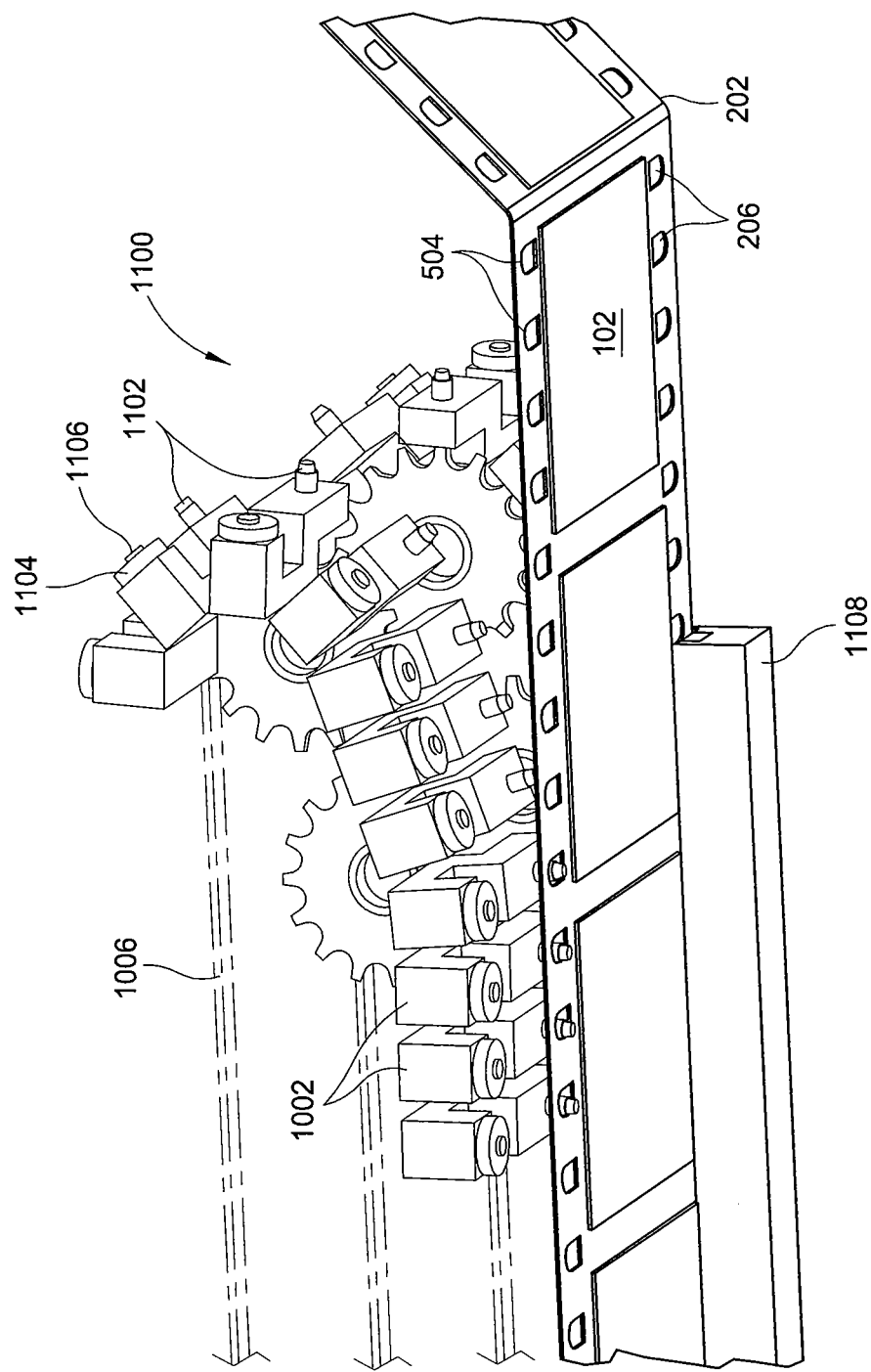
FIG. 11 is an enlarged isometric view of the tape drive and tensioning portion of the apparatus of FIG. 10.

In FIGS. 10-11, a longitudinal chain wedge embodiment of an apparatus 1000 for performing an ELO process to remove ELO films or stacks from support wafers, is shown. Those components of apparatus 1000 that are similar in construction to the components in apparatus 400 are labeled with the same reference designators. Similar to the apparatus 400, apparatus 1000 includes the tape and wafer loading section 402, an etch bath 404, a wafer unload section 406 and a tape unload section 408. FIG. 11 shows an enlarged view of a portion of the apparatus 1000 that illustrates a tape drive and tensioning portion 1100 of the apparatus 1000. The support tape 202 includes a plurality of openings or track openings 206 along its sides, similar to those shown in FIG. 2B. The tape drive and tensioning portion 1100 includes a plurality of drive blocks 1002 that are mounted on a drive belt or drive chain 1006. The drive chain 1006 is driven and guided by a plurality of driving sprockets 1008 on each side of the etch bath 404. At least one of the driving sprockets 1008 on each side of the etch bath 404 is attached to a motor (not shown) by a drive shaft (not shown), to rotate the driving sprocket and the drive train 1006. In some embodiments, two or more of the driving sprockets 1008 may be driven in this manner by an associated motor, drive shaft and/or other driving structure. The drive blocks 1002 also include a pin 1102 that engages the support tape 202 in the track openings 206. Each drive block 1002 further includes a tensioning roller 1104 that is rotatably mounted on a shaft 1106. The tensioning rollers 1104 engage a rail 1004 (FIG. 10) to maintain a spaced apart relationship of the drive blocks 1002 on opposite sides of the etch bath 404, as they are driven therethrough. As the drive blocks 1002 drive the support tape 202 through the etch bath 404, the lateral position of the sides of the support tape 202 are maintained by the pins 1102 engaging the outside portion 504 of the track openings 206.

As with apparatus 400, apparatus 1000 includes a static wedge that is formed by two ramps 512. The static wedge progressively applies pressure to remove the wafers 102 from the support tape 202, while leaving the ELO stack on the support tape 202. A number of adjustable supports (not shown) adjustably connect the ramps 512 to an overhead assembly (not shown). The adjustable supports may include an adjustment mechanism to provide adjustment of the level of the ramps 512 at the various stages of the etch bath 404.

As depicted in FIG. 10, the ramps 512 are spaced apart at their first end adjacent to the tape and wafer loading section 402, and converge toward one another at their second end adjacent to the tape unload section 408. The ramps 512 also extend further down into the etch bath 404 from their first end to their second end and thereby increasingly engage the top of the support tape 202 as it travels through the etch bath 404. The wafers 102 are supported from below by a substrate support (not shown) that supports the wafers 102 near the tape unload section 408 of apparatus 1000 using a spring or buoyancy applied force.

Figure 11A:
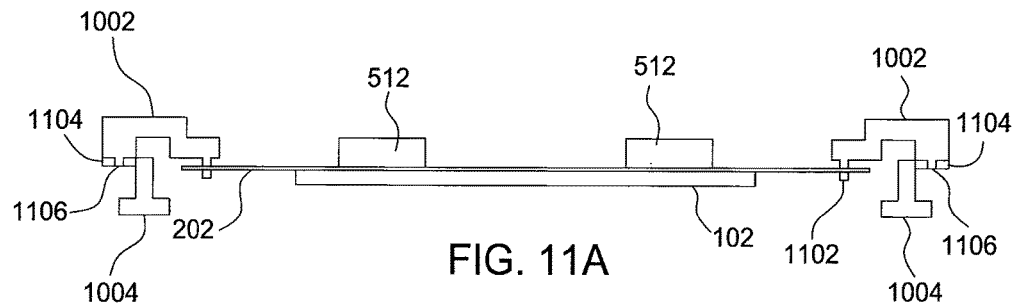
FIGS. 11A-11C are cross sections of the tape and wafer assembly as it proceeds through the apparatus of FIG. 10.
Figure 11B:
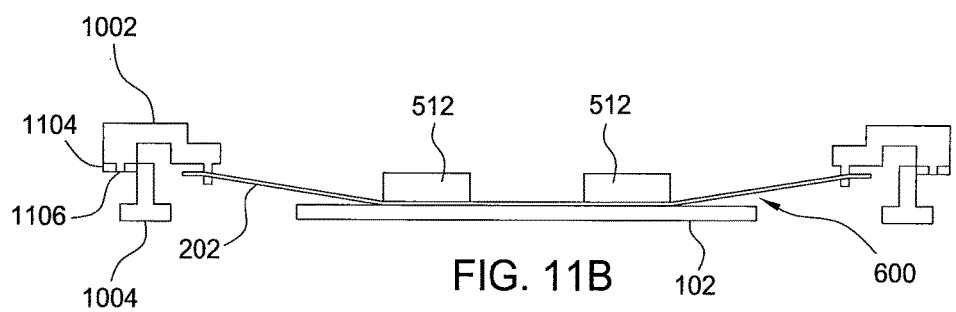
Figure 11C:
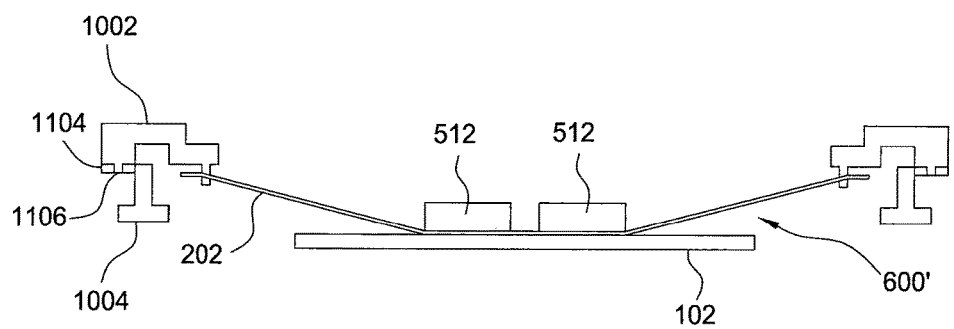

FIGS. 11A-11C are schematic diagrams illustrating the relationship between the ramps 512, the support tape 202 and wafers 102, as the support tape 202 and wafers 102 proceed through the etch bath 404. In FIG. 11A, the support tape 202 and wafer 102 are in an initial position of the etch bath 404. The ramps 512 are substantially at the initial level of the support tape 202 and the wafers 102, and the assembly is therefore relatively planar, with little or no pressure being applied to the support tape 202 and wafers 102. The pins 1102 maintain the position of the ends of the support tape 202 as the support tape 202 progresses through the etch bath 404. The pins 1102 and the drive blocks 1002 are maintained in a spaced apart relationship by the tensioning roller 1104 engaging the rails 1004. A channel 1108 (FIG. 11) surrounds the bottom portion of the pins 1102, in one embodiment, to ensure that the pins 1102 do not disengage from the track openings 206. In the position shown in FIG. 11B, (approximately halfway through the etch bath 404), the ramps 512 are extended further into the etch bath 404, and the center of the tape and the wafer 102 are pushed downward relative to the ends of the support tape 202. A crevice 600 is therefore formed between tape 202, and the wafer 102. In the position shown in FIG. 11C, (at a point near the tape unload section 408), the ramps 512 are extended even further into the etch bath 404, and the center of the tape and the wafer 102 are pushed further downward relative to the ends of the support tape 202. The size of the crevice 600' is increased as compared to crevice 600 and the wafers 102 are increasingly removed from the support tape 202. At a point in the progression slightly after the illustration shown in FIG. 11C, the adhesion between the support tape 202 and the wafer 102 is minimal, and the wafer 102 is removed from the support tape 202, and exits through the wafer unload section 406.

Figure 12:
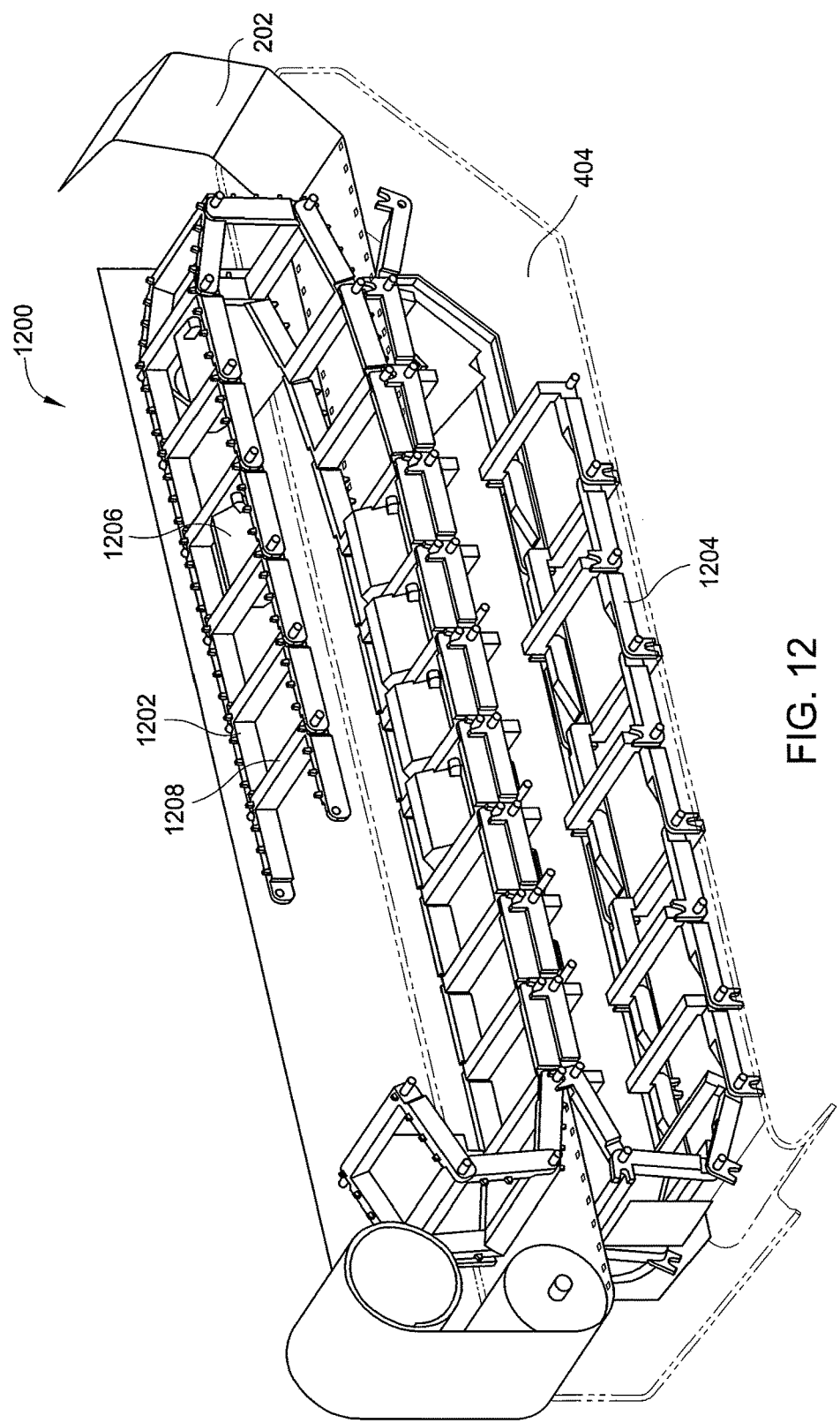
FIG. 12 is a schematic isometric view of another embodiment of an apparatus for performing an ELO process to remove ELO films from support wafers.
Figure 13:
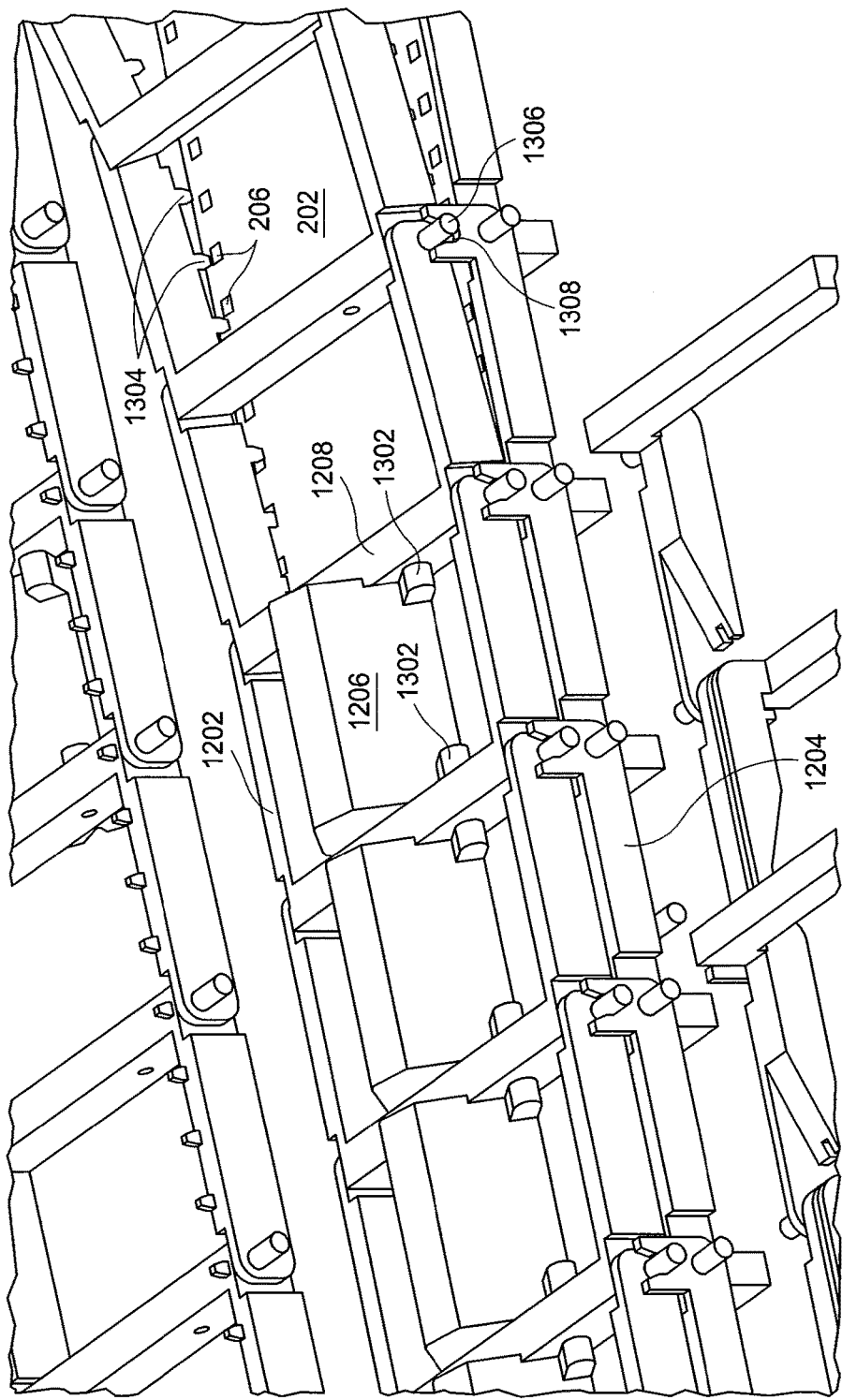
FIG. 13 is an enlarged isometric view of the tape drive and point load tensioning portion of the apparatus of FIG. 12.
Figure 14:
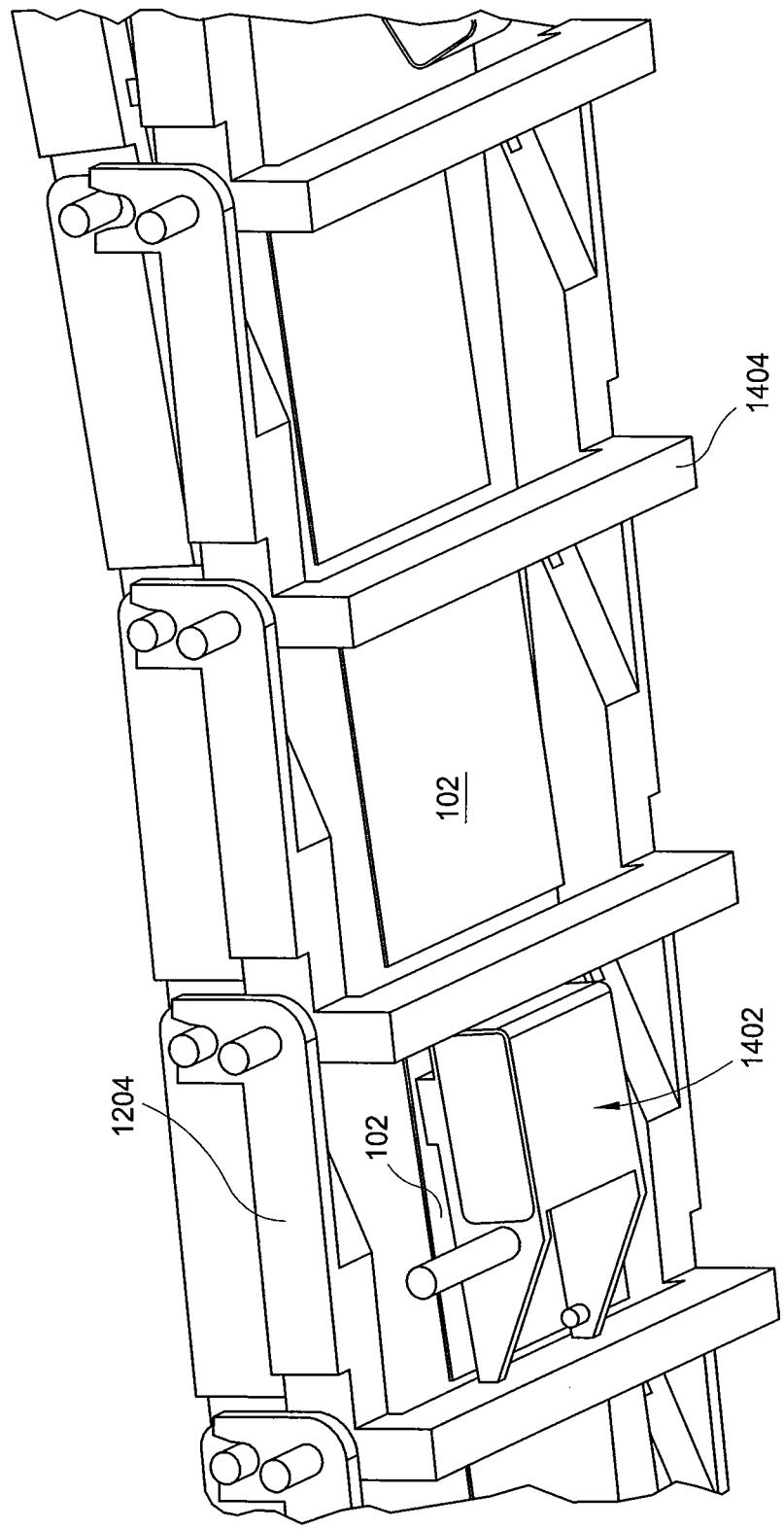
FIG. 14 is an enlarged isometric view of the wafer support and pusher portion of the apparatus of FIG. 12.

FIGS. 12-14 illustrate another embodiment of an apparatus 1200 for performing an ELO process to remove ELO films or stacks from support wafers. It should be noted that portions of some elements have been omitted from FIGS. 12-14 for clarity. Apparatus 1200 includes an etch bath 404 and an upper chain drive 1202 with a plurality of longitudinal point loads 1206 mounted in each "cage" formed by the upper chain drive 1202 and a series of transverse support members 1208. The longitudinal point loads 1206 are rotatably connected at each end 1302 to the transverse support members 1208, to allow the longitudinal point loads 1206 to rotate downward and apply pressure to the wafers. The longitudinal point loads 1206 rotate about an axis that extends in the longitudinal direction of the apparatus 1200. The longitudinal point loads 1206 can apply the pressure constantly by their weight, or in another embodiment, the pressure can be positionally controlled using cams (not shown) that engage the longitudinal point loads 1206. Each "cage" is sized to surround a single wafer such that each longitudinal point load 1206 applies pressure to the wafer located below.

Apparatus 1200 further includes a lower chain drive 1204 with a plurality of substrate supports and/or pushers 1402. The lower chain drive 1204 also includes a series of transverse support members 1404 that form "cages" in the lower chain drive 1204. Each "cage" includes a pusher 1402 that supports a wafer 102 from beneath the wafer 102. The pushers 1402 may apply the pressure by a spring force, or by buoyancy within the etch bath 404. The upper chain drive 1202 further includes a plurality of pins 1304 that extend through the track openings 206 in the support tape 202 and into recesses (not shown) in the lower chain drive 1204 to thereby lock the support tape 202 between the chain drives. The combined action of the pins 1304 maintaining the sides of the support tape 202 as the longitudinal point loads 1206 apply pressure to center of the support tape 202 and the wafer 102 located below it, creates the crevice and separation between the support tape 202 and the wafer 102 as described above with reference to apparatus 400 and apparatus 1000 in FIGS. 6A-6C and 11A-11C, respectively. In one embodiment, the upper chain drive 1202 includes a plurality of pins 1306 that snap into receptacles 1308 in the lower chain drive 1204 to lock the chain drives together and hold the support tape 202 securely therebetween.

Figure 15:
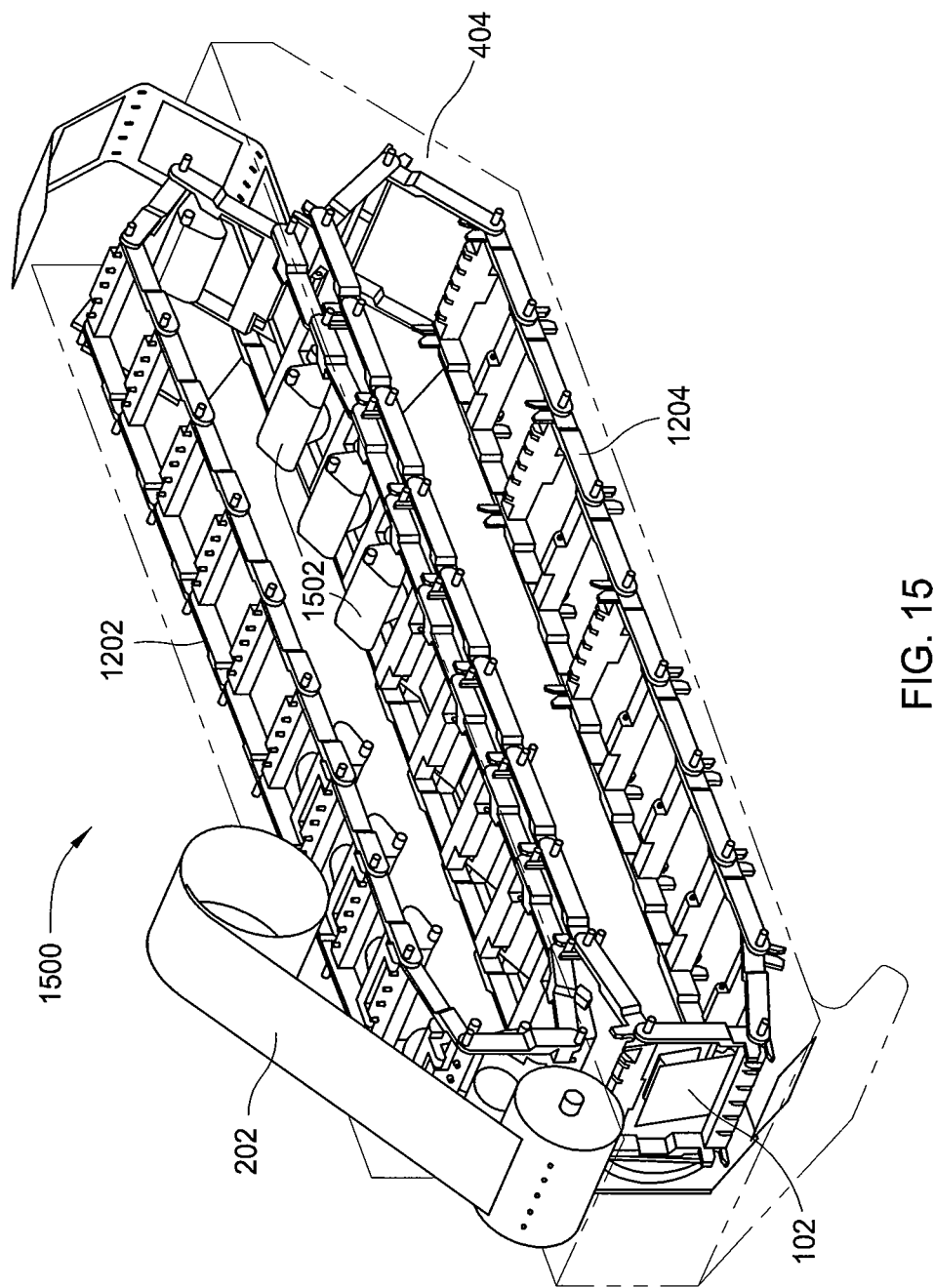
FIG. 15 is a schematic isometric view of another embodiment of an apparatus for performing an ELO process to remove ELO films from support wafers.
Figure 16:
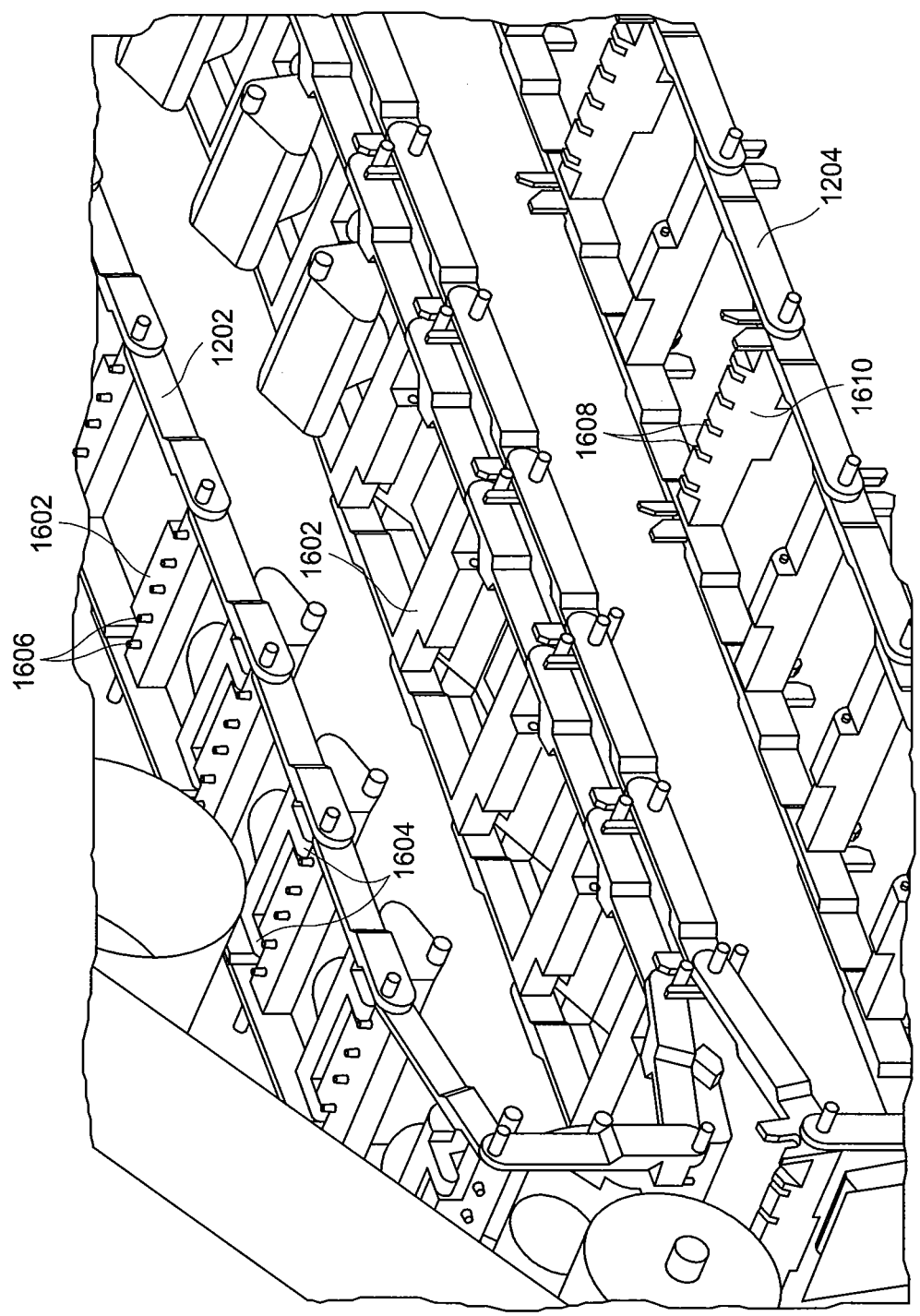
FIG. 16 is an enlarged isometric view of the tape drive and point load tensioning portion of the apparatus of FIG. 15.
Figure 17:
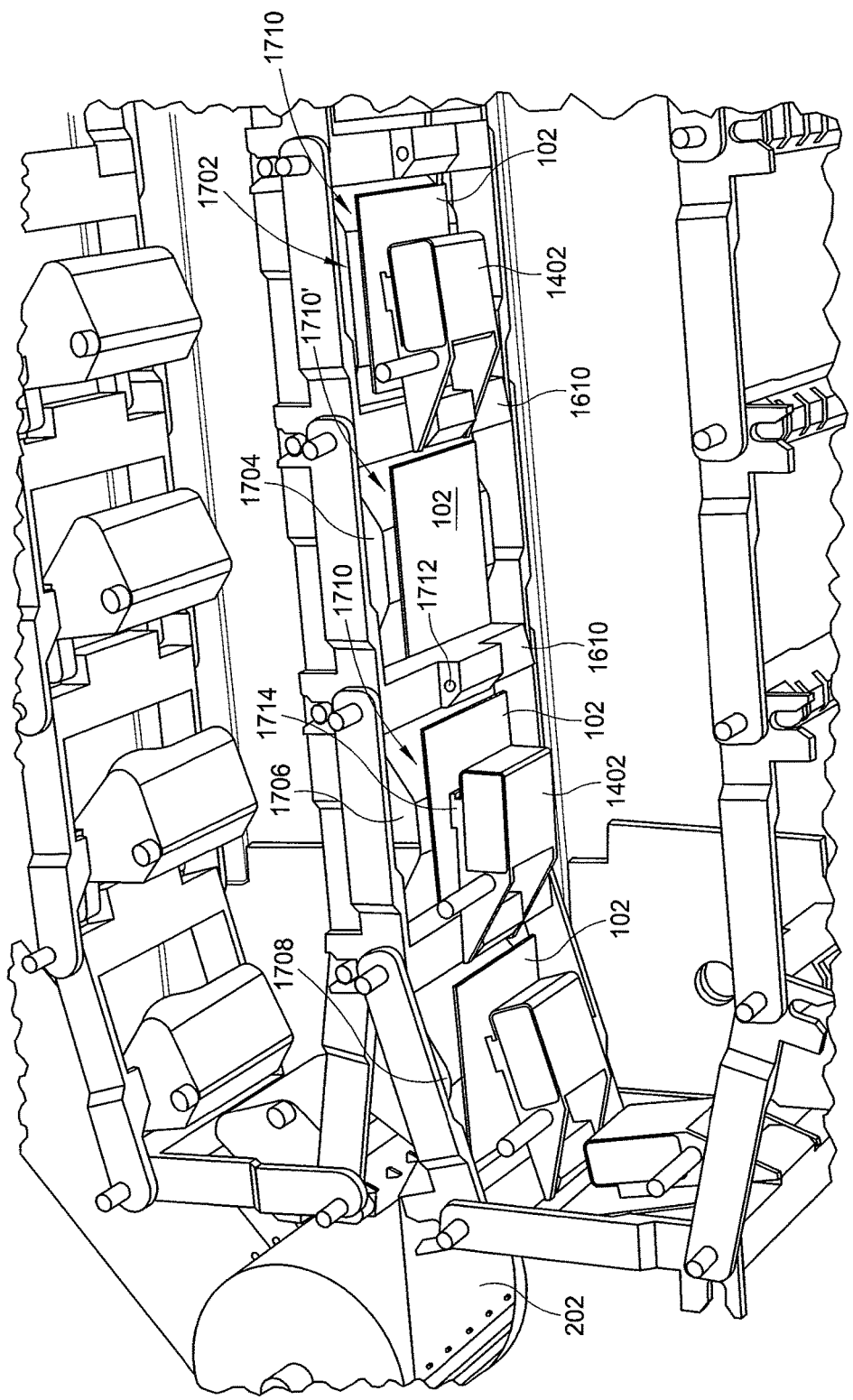
FIG. 17 is an enlarged isometric view of the wafer support and pusher portion of the apparatus of FIG. 15.

FIGS. 15-17 illustrate another embodiment of an apparatus 1500 for performing an ELO process to remove ELO films or stacks from support wafers. Apparatus 1500 is similar in operation to apparatus 1200, and similar elements have been labeled with the same reference designator. A significant difference in apparatus 1500 is the use of transverse point loads 1502. The ends 1604 of the transverse point loads 1502, are rotatably mounted to the upper chain drive 1202 such that the transverse point loads 1502 rotate about an axis transverse to the longitudinal direction of apparatus 1500. The transverse support members 1602 of the upper chain drive 1202 include a plurality of pins 1606 that engage the support tape 202 and extend into recesses 1608 in the transverse support members 1610 of the lower chain drive 1204. The pins 1606 maintain the longitudinal position of each section of the support tape 202 within each "cage" formed by the upper chain drive 1202 and the lower chain drive 1204 and the transverse support members 1602 and 1610.

FIG. 17 depicts each section of the support tape 202 progressively bowed downward by the force of the transverse point loads 1502 acting on the center of each section of the support tape 202. At section 1702, the support tape 202 has started to bow, forming a crevice 1710 at each end of the section. At section 1704, the crevice 1710 has increased to remove a greater portion of the support tape 202 in section 1704 from the wafer 102. In section 1706 the crevice has increased further, and in section 1708, the wafer 102 has released from the support tape 202. The transverse point loads 1502 are not shown in these sections for clarity. FIG. 17 also illustrates further details of the pushers 1402 that in some embodiments are common to both apparatus 1500 as well as apparatus 1200. The pushers 1402 are rotatable mounted to the transverse support members 1610 using a shaft (not shown) that extends through hole 1712 in the transverse support members 1610. A central raised portion 1714 of the pusher 1402 supports the center portion of the wafer 102 located there above. The force applied by the pushers 1402 may be provided by a spring (not shown) or by buoyancy of the pushers 1402 in the etch bath 404, such that the pushers 1402 move with the wafers 102 as they are progressively released from the support tape 202.

Figure 18:
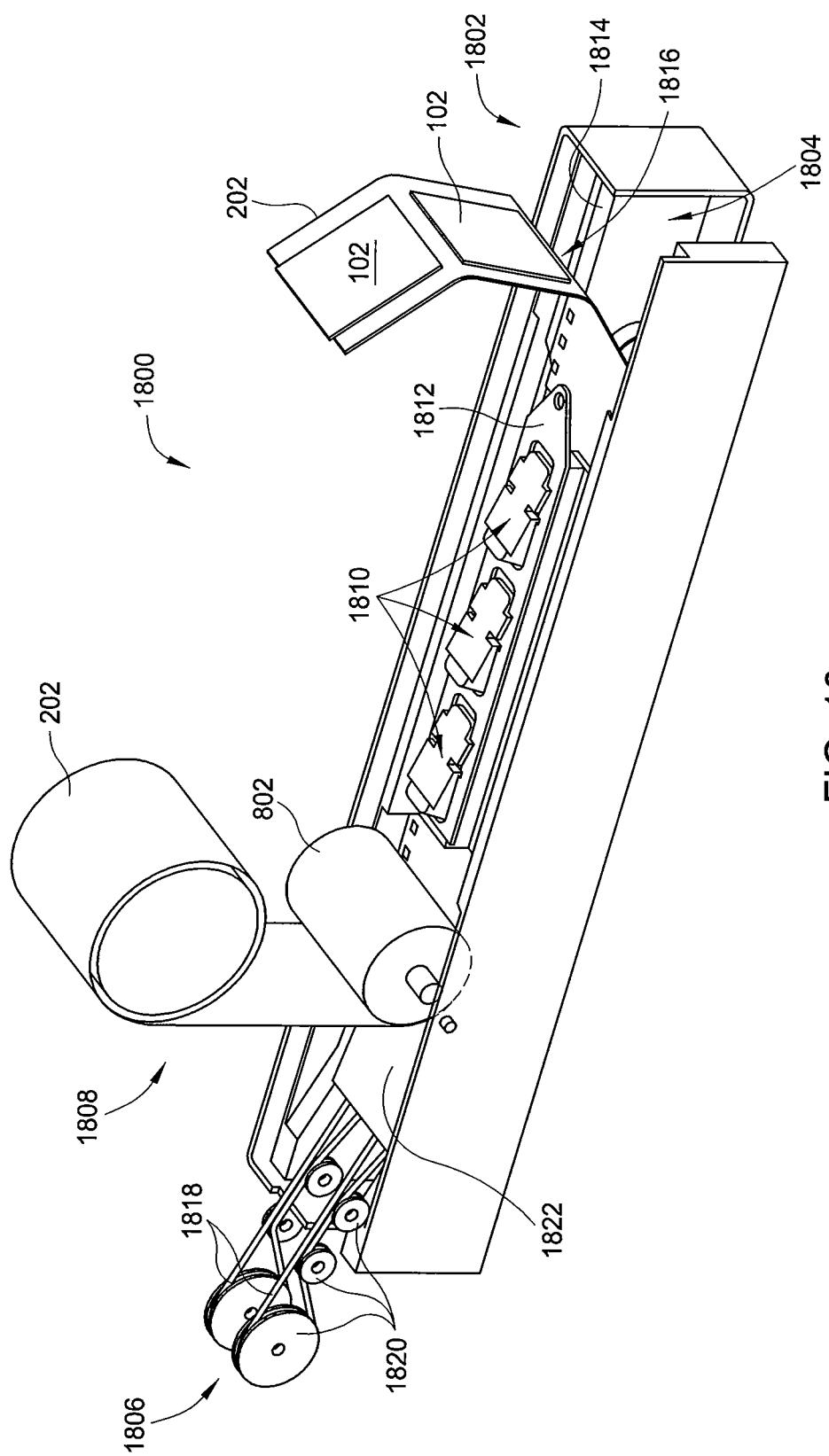
FIG. 18 is a schematic isometric view of a batch-type embodiment of an apparatus for performing an ELO process to remove ELO films from support wafers.
Figure 19:
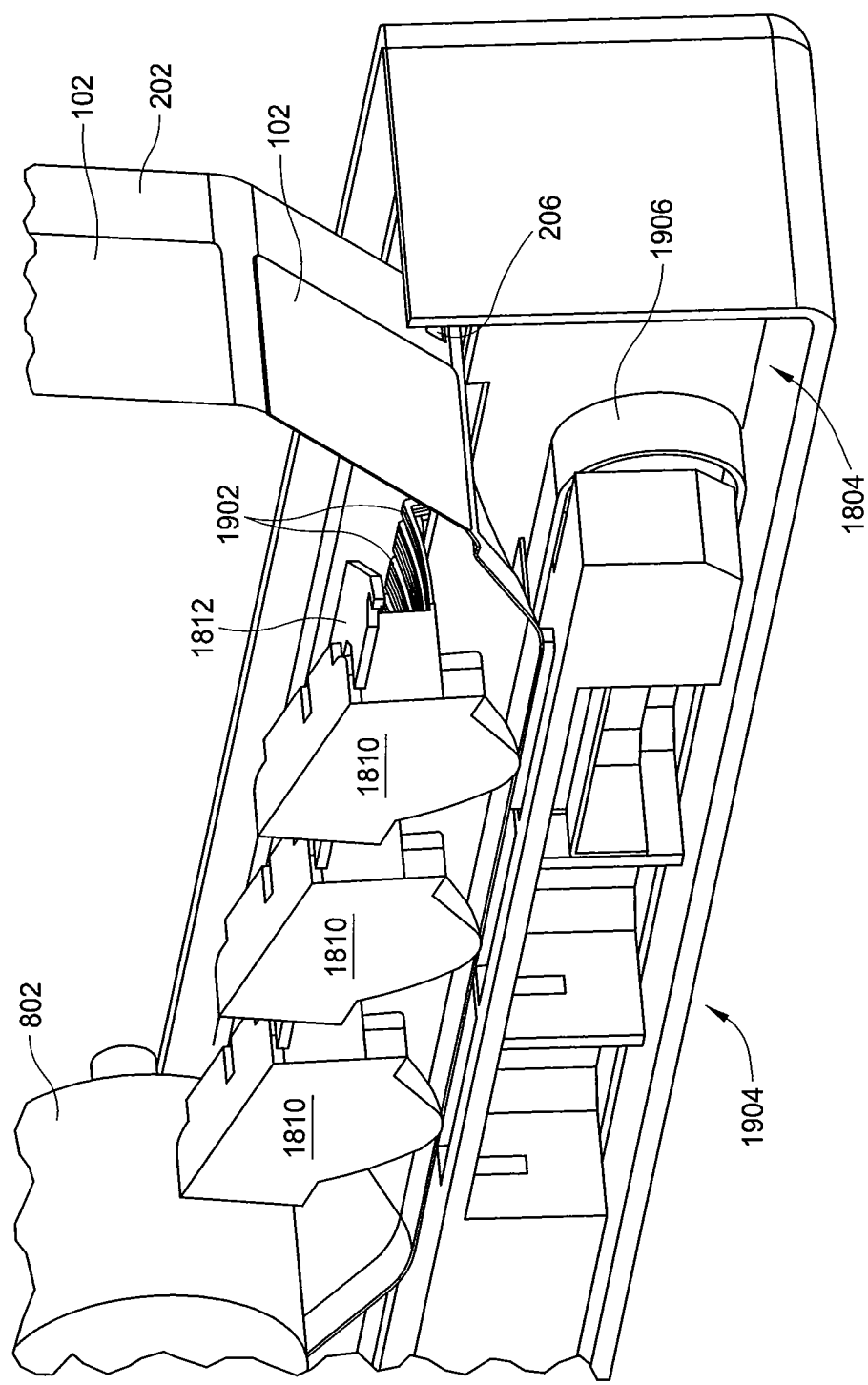
FIG. 19 is an enlarged isometric view of the wafer support and belt drive and point load tensioning portion of the apparatus of FIG. 18.
Figure 20:
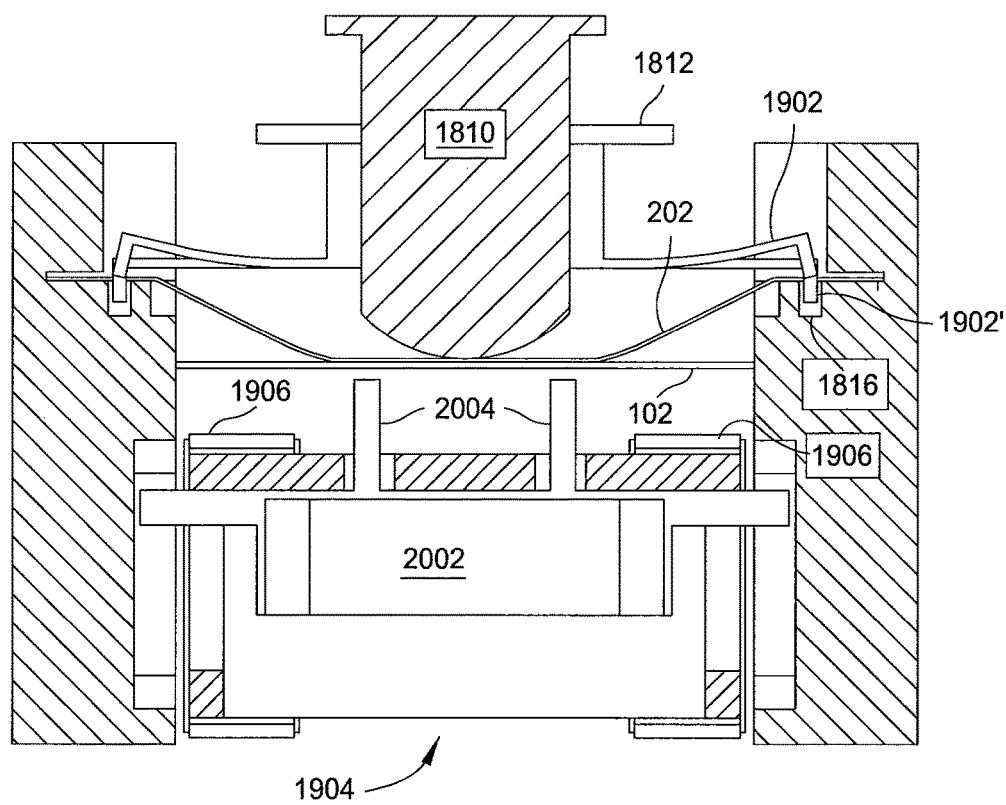
FIG. 20 is a cross section through the wafer support and belt drive and point load tensioning portion of the apparatus of FIG. 18.

FIGS. 18-20 illustrate a batch-type embodiment of an apparatus 1800 for performing an ELO process to remove ELO films or stacks from support wafers. The apparatus 1800 includes a tape and wafer loading section 1802, an etch bath 1804, a wafer unload section 1806 and a tape unload section 1808. In apparatus 1800, the wafers 102 are removed from the support tape 202 in batches. For example, in the embodiment illustrated in FIG. 18, three wafers are removed from the tape in each batch. Other embodiments may remove more than three or less than three wafers per batch depending on the particular configuration. Apparatus 1800 includes three point loads 1810 that provide downward force to form a crevice between the support tape 202 and the wafers 102, and to further remove the wafers 102 from the support tape 202. The point loads 1810 are supported by a finger carrier 1812, that is lowered and raised to engage or disengage the point loads 1810 from the support tape 202, respectfully. The finger carrier 1812 also supports a plurality of fingers 1902 that engage the track openings 206 in the support tape 202 to maintain the sides of the support tape 202 in a spaced apart relationship. Two rails 1814 (one shown in the cutaway view of FIG. 18) include recesses 1816 for the fingers 1902 to engage to positively lock the sides of the support tape 202 into place. As is shown in the cross section of FIG. 20, when the finger carrier 1812 is lowered, those fingers (labeled as 1902' in FIG. 20) that are aligned with the track openings 206 in the support tape 202, extend through the support tape 202 and engage the recesses 1816. As those fingers are flexible, those fingers (labeled as 1902 in FIG. 20) that do not align with the track openings 206 in the support tape 202, do not extend through the tape but remain in a flexed position above the support tape 202.

Underneath the tape and wafer assembly is a wafer support and handling assembly 1904. The wafer support and handling assembly 1904 includes two substrate drive belts 1906 and a bottom pusher 2002. The substrate drive belts 1906 support the wafers 102 as the tape and wafer assembly is fed into the etch bath 404 and transports the wafers 102 to the wafer unload section 1806 once they are removed from the support tape 202. The bottom pusher 2002 includes two rails 2004 that support the wafers 102 during the ELO process after loading the tape and wafer assembly and prior to release of the wafers 102 from the support tape 202.

Figure 21:
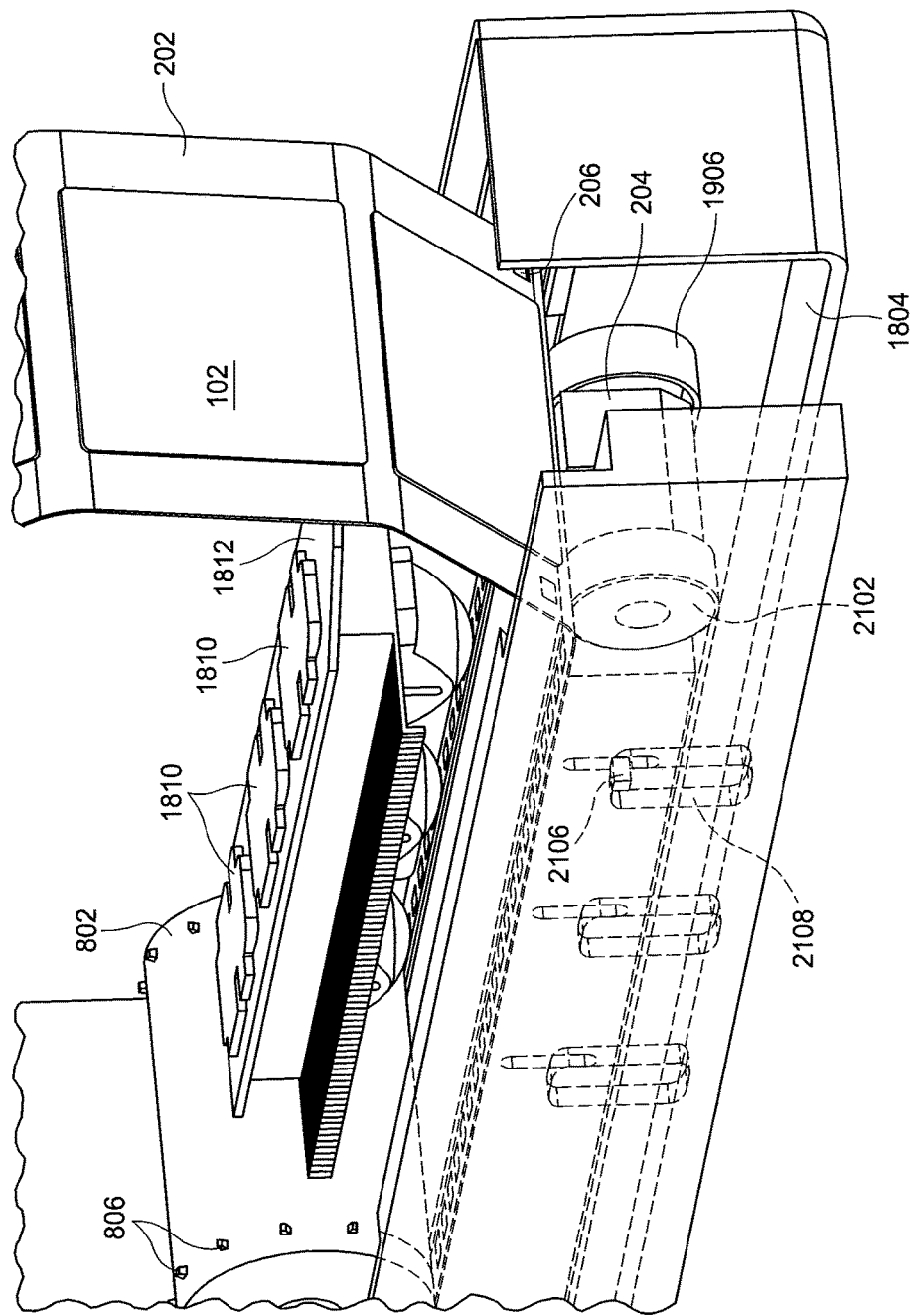
FIG. 21 is an enlarged isometric view of the wafer support and belt drive and point load tensioning portion of the apparatus of FIG. 18 in a loading position.
Figure 22:
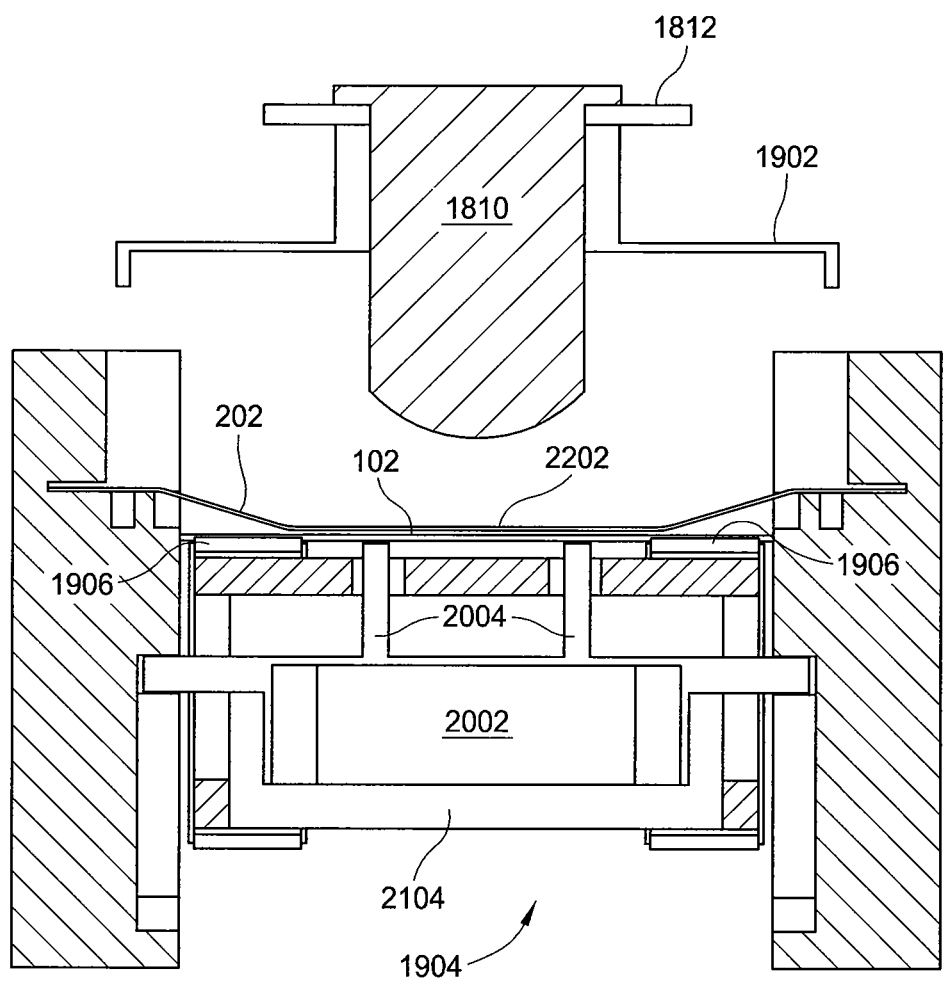
FIG. 22 is a cross section through the wafer support and belt drive and point load tensioning portion of the apparatus of FIG. 18 in a loading position.
Figure 40:
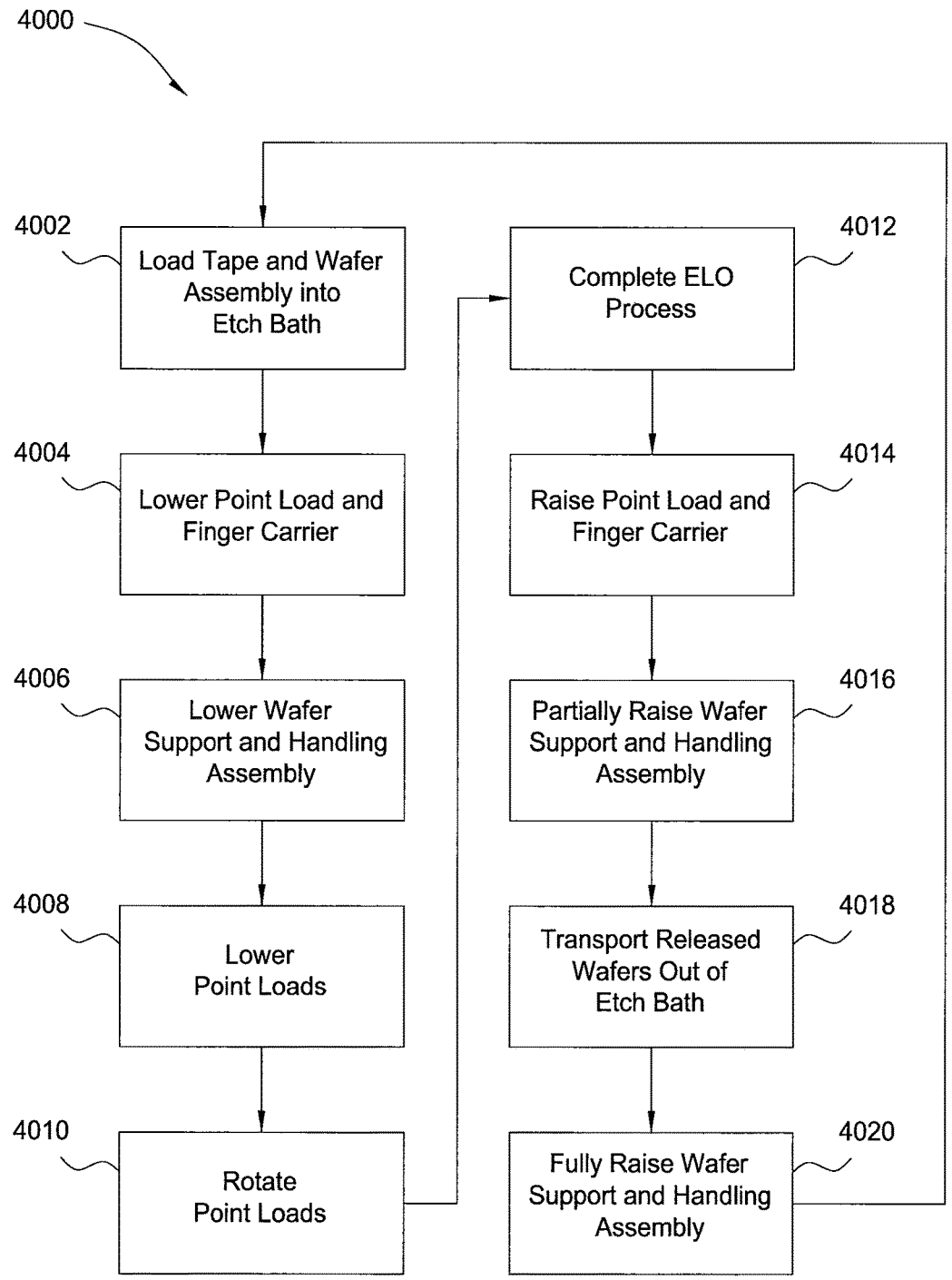
FIG. 40 is a flow chart illustrating one embodiment of a batch ELO method that may be performed by the apparatus of FIGS. 18-38.

FIGS. 21 through 38 illustrate the relationship between the moving parts of apparatus 1800 during various stages of an ELO batch process, as described by some embodiments herein. FIG. 40 is a flow chart illustrating one embodiment of a method 4000 for a batch ELO process that may be performed by apparatus 1800. In FIGS. 21 and 22, the apparatus 1800 is shown in a loading position where the tape and wafer assembly is loaded into the etch bath 1804 in block 4002 of method 4000. The pins 806 in roller 802 engage the track openings 206 in tape 202 and load the tape and wafer assembly into the etch bath 1804 as the roller 802 rotates. The substrate drive belts 1906 are in a raised position so that they can support the wafers 102 from below, so that they do not prematurely release from the support tape 202, which could cause damage to the ELO stack. The substrate drive belts 1906 are mounted on pulleys 2102 of belt carrier 2104. In one embodiment, the pulleys may be driven by a drive motor and associated mechanisms (not shown) that are synchronized with the drive system of roller 802. In the raised position of wafer support and handling assembly 1904, a lever 2106 engages the top of slot 2108 in sidewall 2110 of etch bath 1804. The lever 2106 operates a mechanism (not shown) within belt carrier 2104 to lower the rails 2004 of bottom pusher 2002, (FIG. 20) so that they do not engage the wafers as they are loaded into the etch bath 1804. The finger carrier 1812 is in a raised position such that the point loads 1810 and fingers 1902 are disengaged from the support tape 202.

Figure 23:
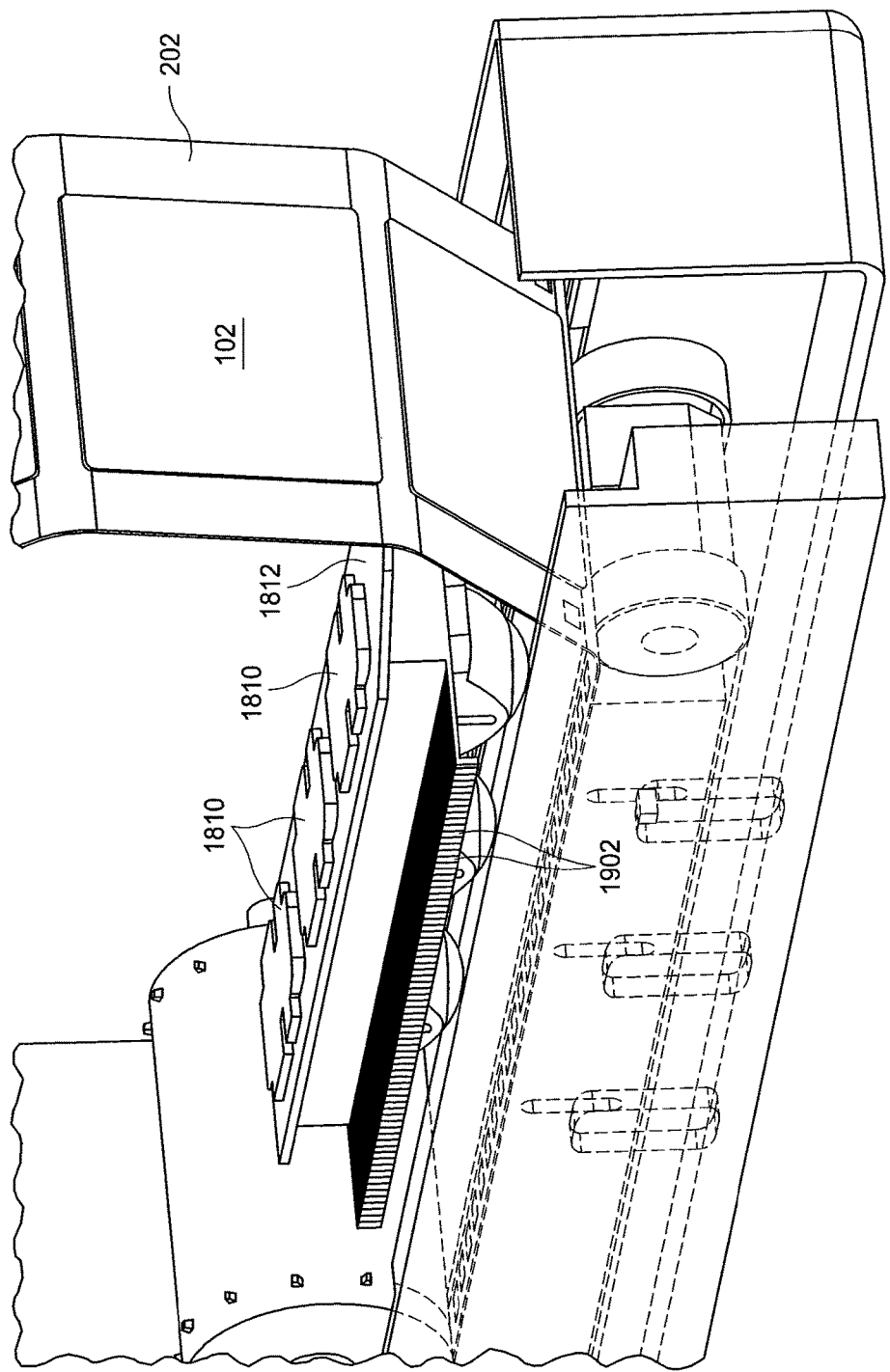
FIG. 23 is an enlarged isometric view of the wafer support and belt drive and point load tensioning portion of the apparatus of FIG. 18 in a point load and finger lowering position.
Figure 24:
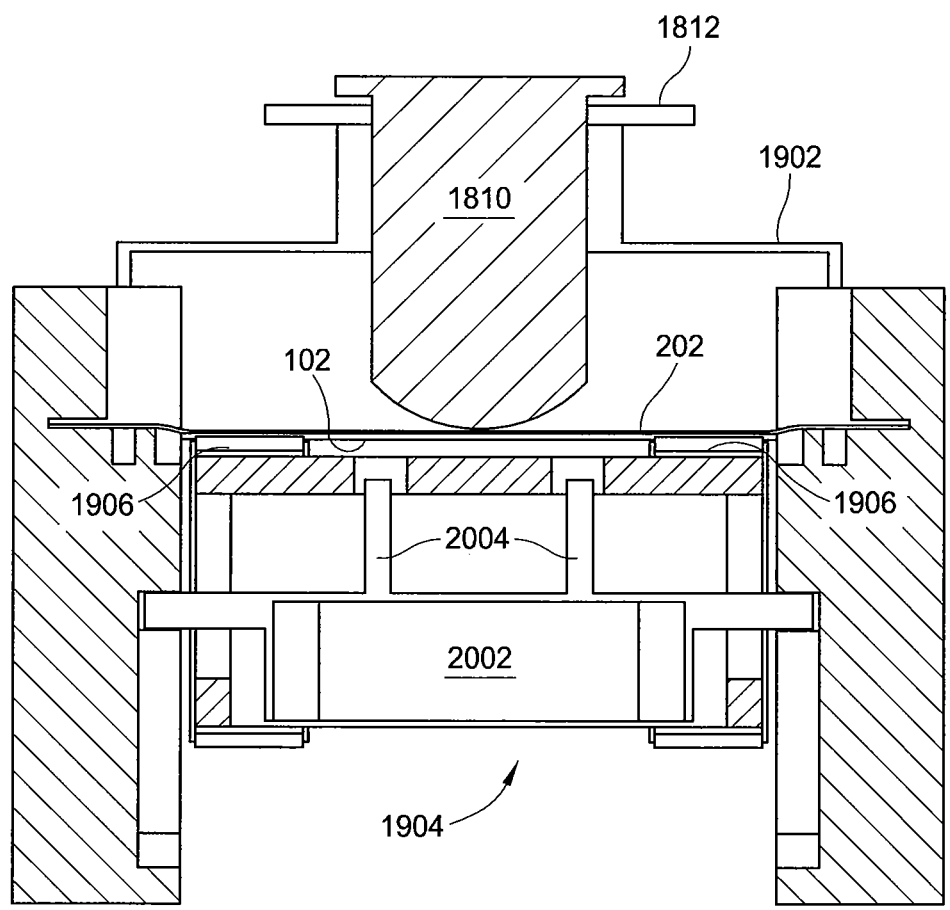
FIG. 24 is a cross section through the wafer support and belt drive and point load tensioning portion of the apparatus of FIG. 18 in a point load and finger lowering position.
Figure 25:
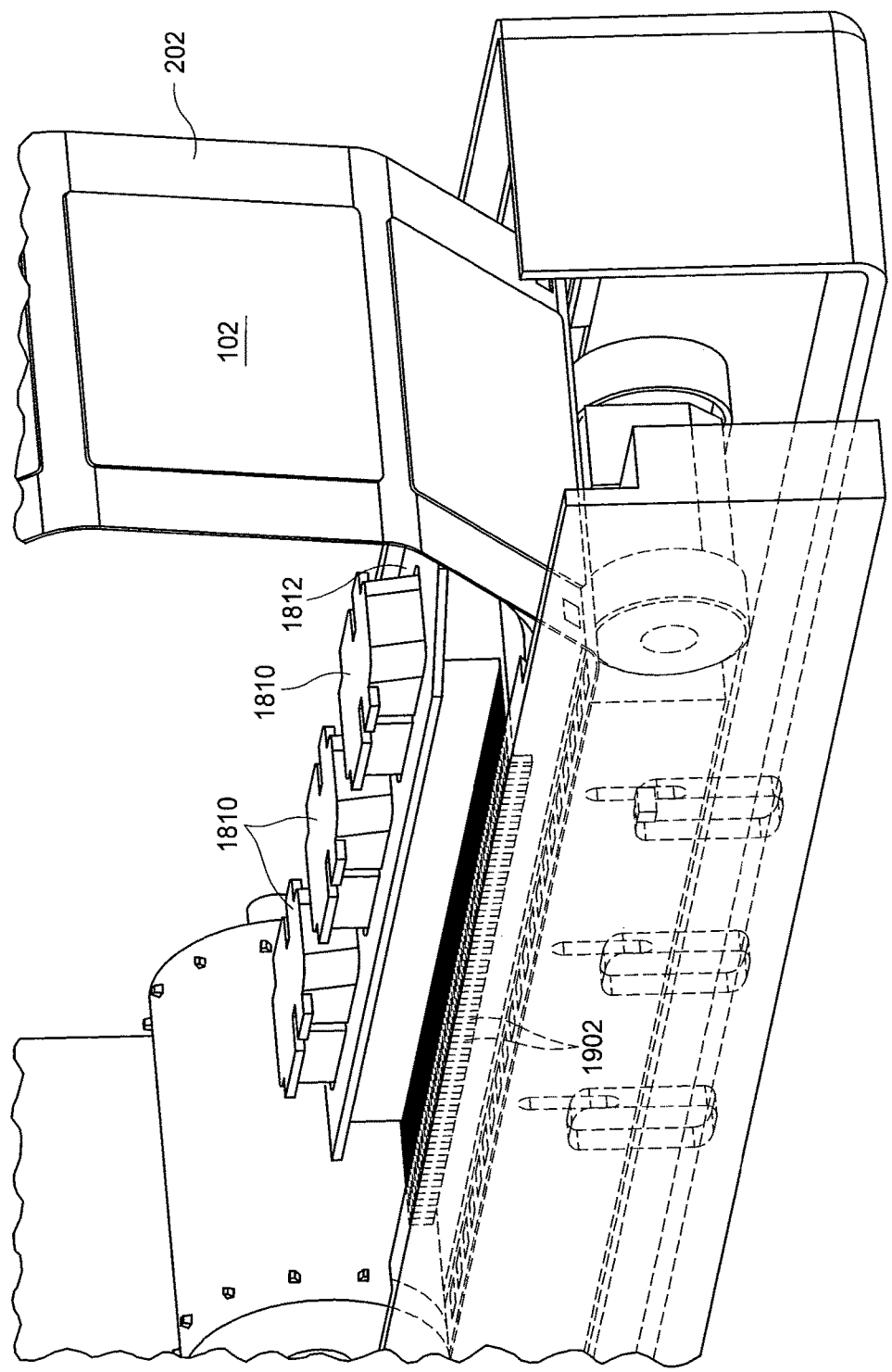
FIG. 25 is an enlarged isometric view of the wafer support and belt drive and point load tensioning portion of the apparatus of FIG. 18 in a point load and finger further lowered position.
Figure 26:
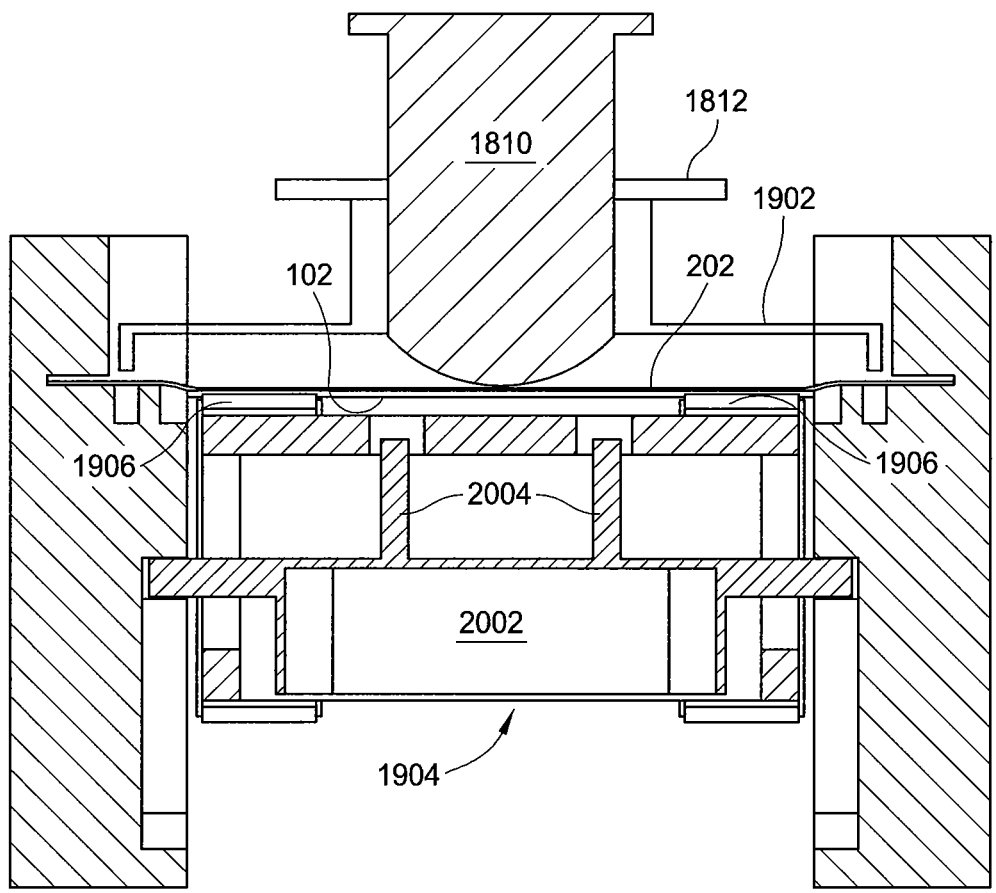
FIG. 26 is a cross section through the wafer support and belt drive and point load tensioning portion of the apparatus of FIG. 18 in a point load and finger further lowered position.
Figure 27:
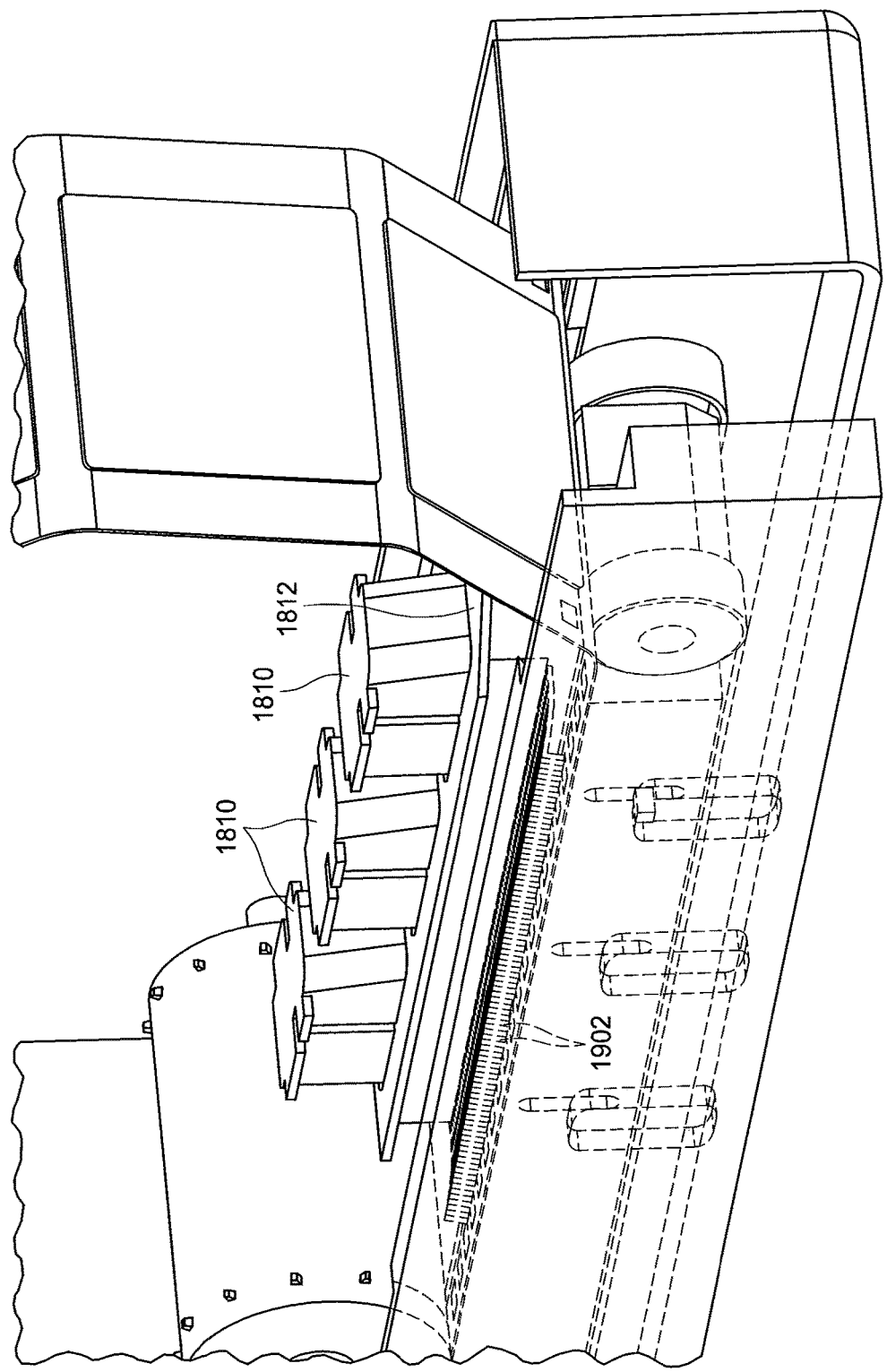
FIG. 27 is an enlarged isometric view of the wafer support and belt drive and point load tensioning portion of the apparatus of FIG. 18 in a tape locked position.
Figure 28:
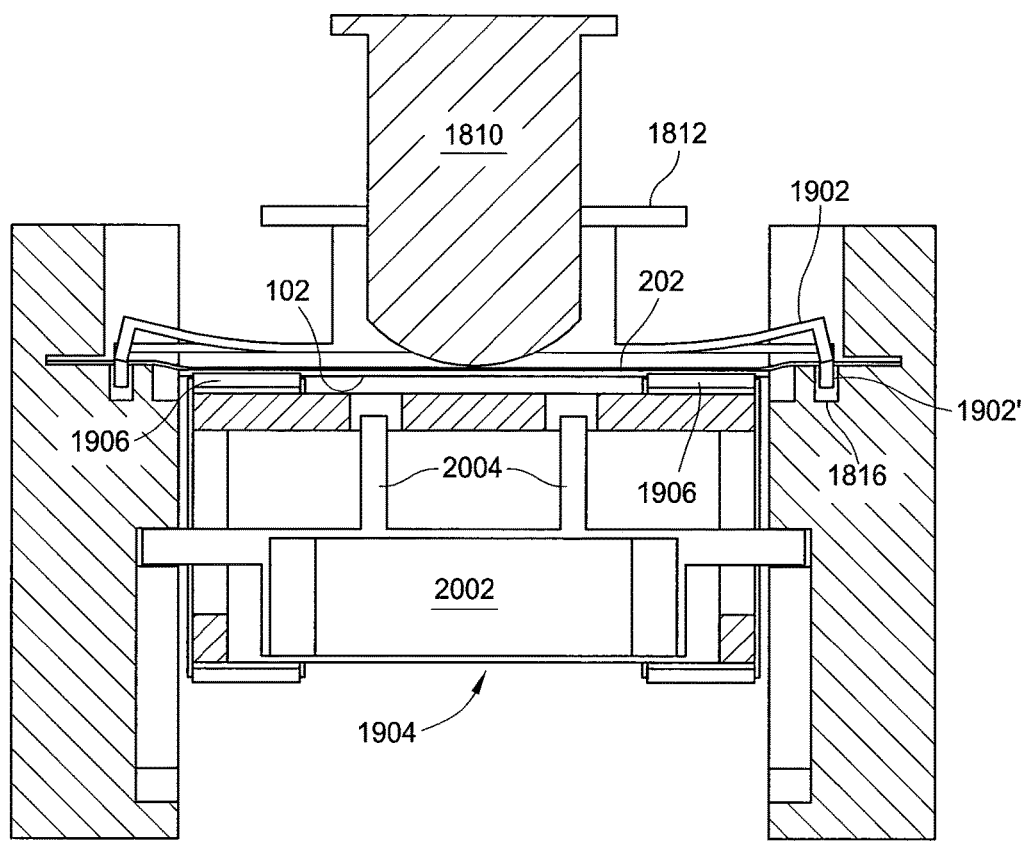
FIG. 28 is a cross section through the wafer support and belt drive and point load tensioning portion of the apparatus of FIG. 18 in a tape locked position.

In some embodiments, the point load and finger carrier 1812 is lowered in block 4004 during method 4000, after the tape and wafer assembly is loaded into the etch bath 1804, as shown in FIGS. 23 through 28. FIGS. 23 and 24 show the finger carrier 1812 lowered to a first intermediate position wherein the point loads 1810 initially contact the support tape 202. Fingers 1902 remain above the support tape 202. In FIGS. 25 and 26, the finger carrier 1812 has further lowered to a further intermediate position wherein the point loads 1810 have not lowered further as they are supported by the tape and wafer assembly. The fingers 1902 still remain above the support tape 202. FIGS. 27 and 28 show the finger carrier 1812 fully lowered such that the fingers 1902' that are aligned with the track openings 206 in tape 202 engage with the recesses 1816 to lock the sides of the support tape 202 into the spaced apart relationship. In the positions shown in FIGS. 23 through 28, the wafer support and handling assembly 1904 remains in its raised position to support the tape and wafer assembly such that the wafers 102 do not prematurely release from the support tape 202 as previously described.

Figure 29:
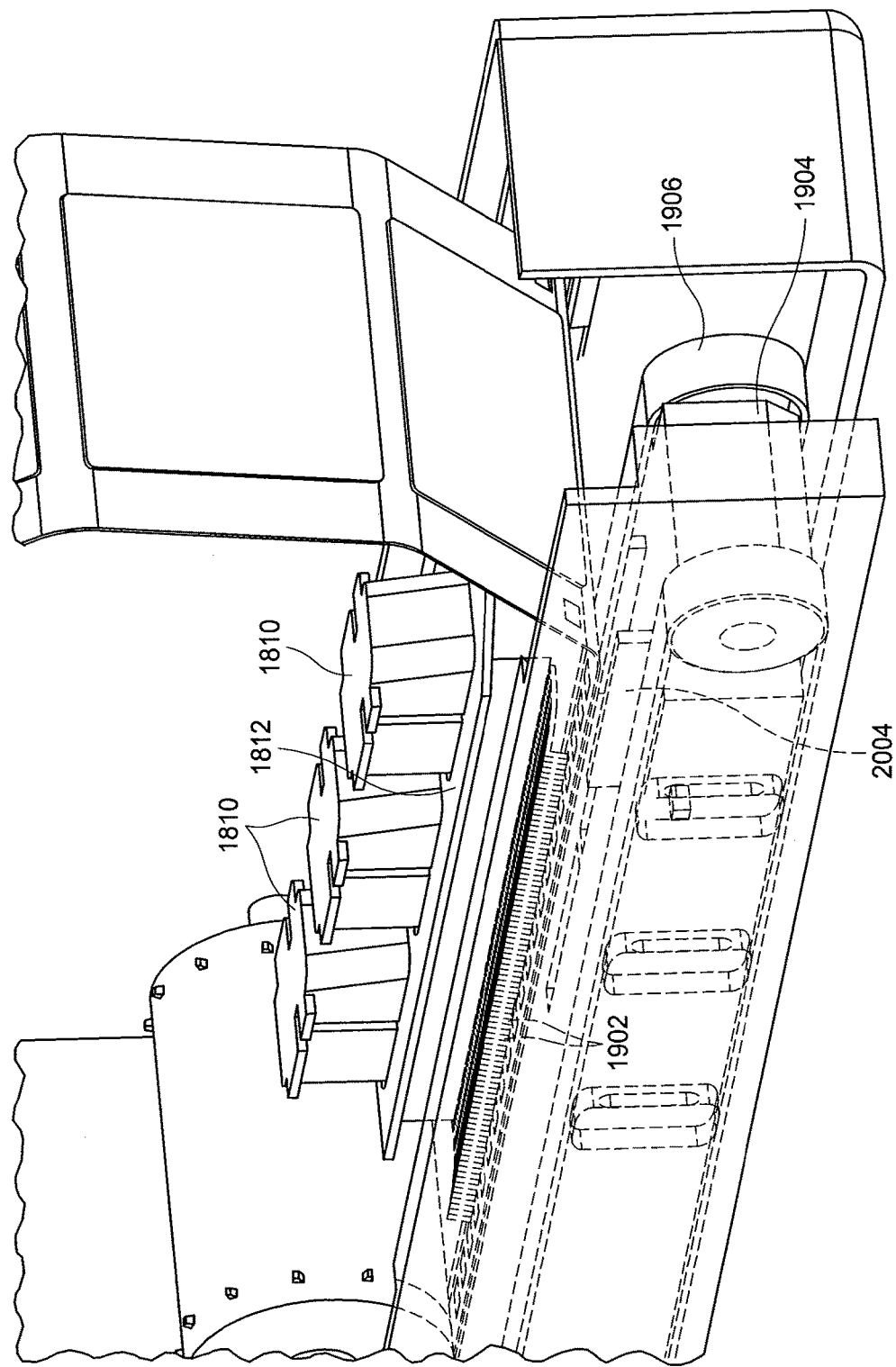
FIG. 29 is an enlarged isometric view of the wafer support and belt drive and point load tensioning portion of the apparatus of FIG. 18 in a lowered belt position.
Figure 30:
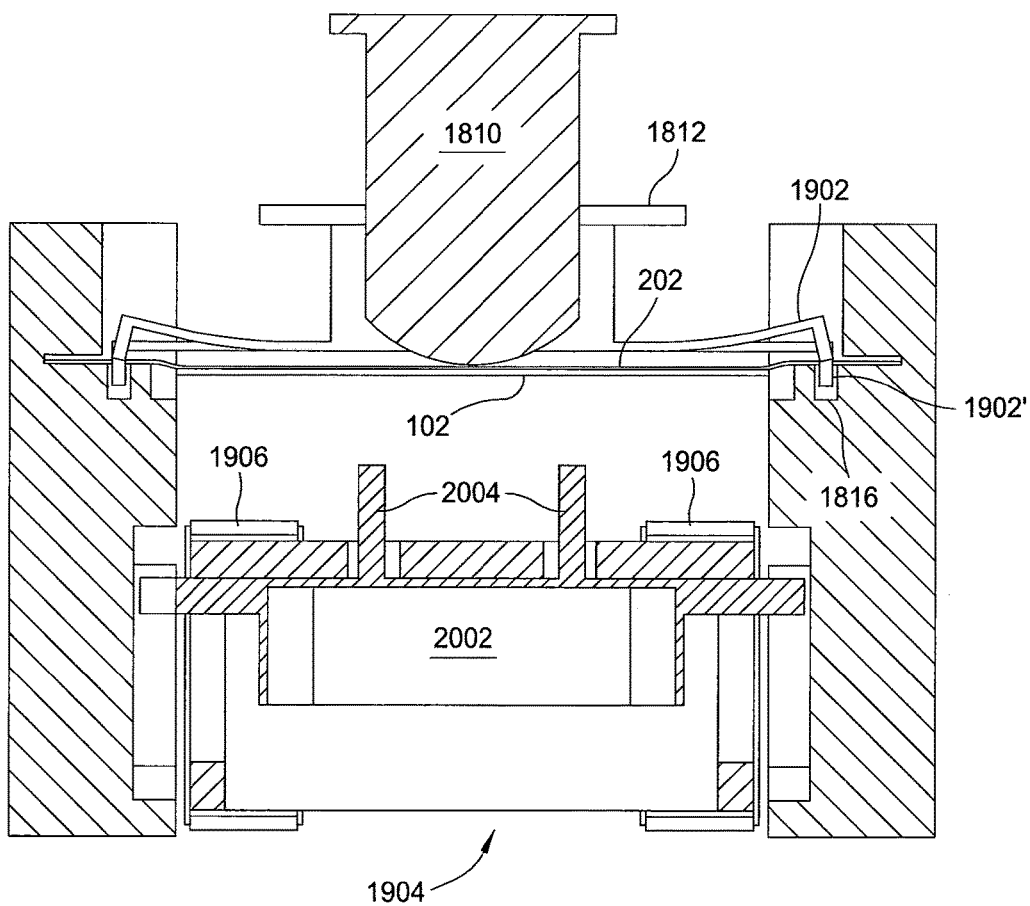
FIG. 30 is a cross section through the wafer support and belt drive and point load tensioning portion of the apparatus of FIG. 18 in a lowered belt position.
Figure 31:
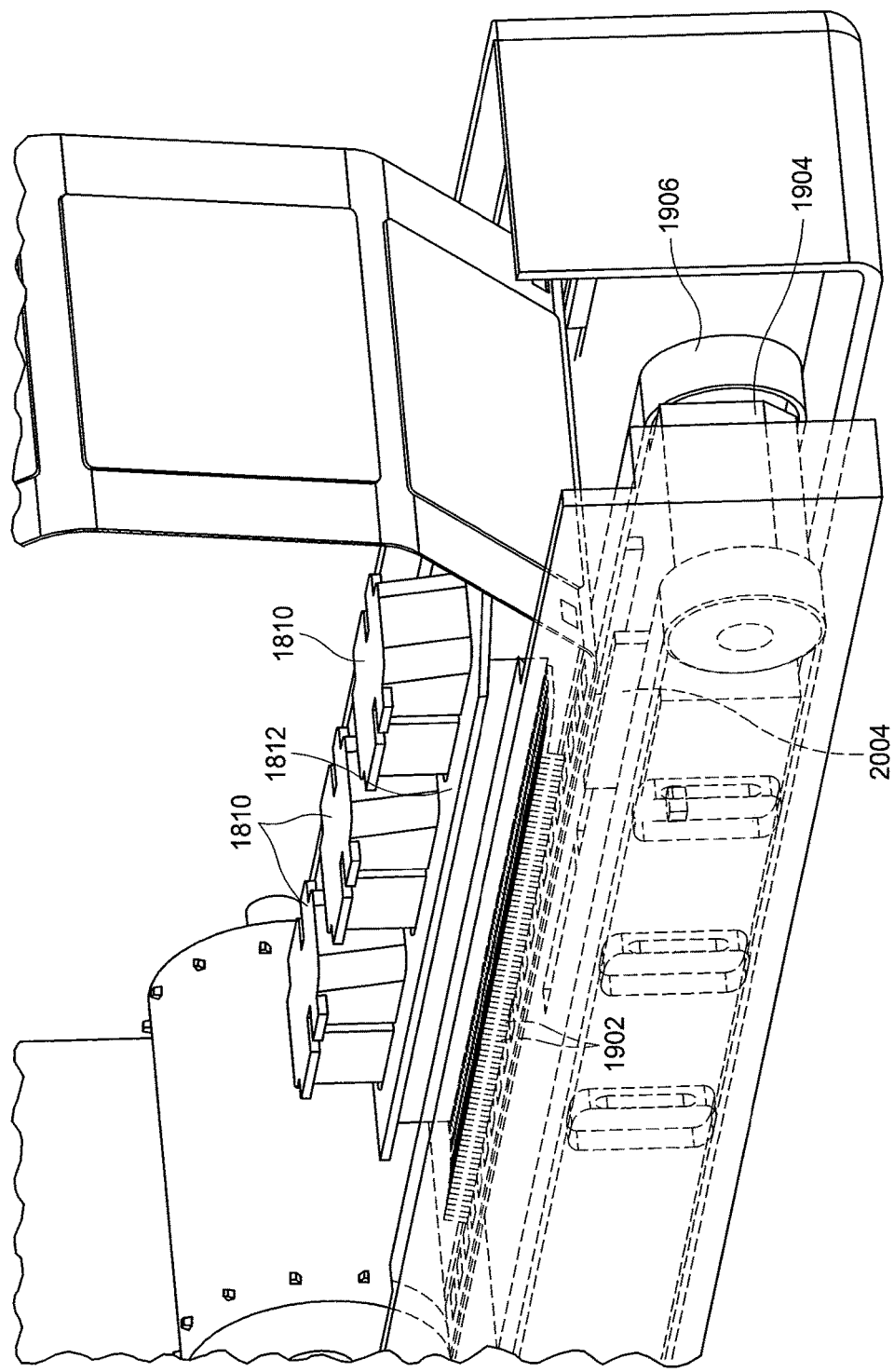
FIG. 31 is an enlarged isometric view of the wafer support and belt drive and point load tensioning portion of the apparatus of FIG. 18 in an initial ELO position.
Figure 32:
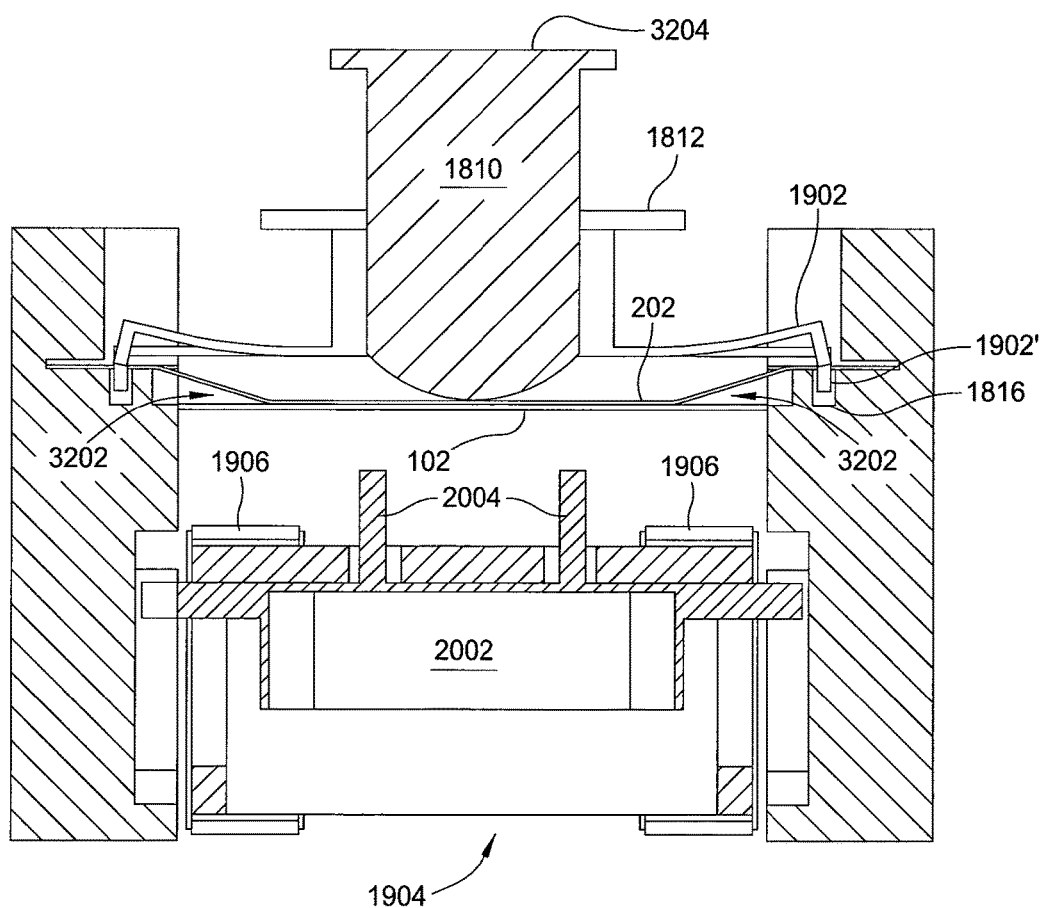
FIG. 32 is a cross section through the wafer support and belt drive and point load tensioning portion of the apparatus of FIG. 18 in an initial ELO position.

Once the finger carrier 1812 has been fully lowered, the method 4000 proceeds to block 4006 wherein the wafer support and handling assembly 1904 is lowered as shown in FIGS. 29 and 30. In the lowered position of wafer support and handling assembly 1904, the lever 2106 does not engage the top of the slot 2108 in the sidewall 2110 of the etch bath 1804. The rails 2004 of bottom pusher 2002, are raised above the top of the wafer support and handling assembly 1904, but are still located below the wafers 102 such that the wafers 102 are free to move downward, once they are released from the support tape 202. Once the wafer support and handling assembly 1904 is lowered, the method proceeds to block 4008 and the ELO process is initiated. The ELO process may initiate, in some embodiments, by the weight of the point loads 1810 acting on the tape and substrate assembly to bow the support tape 202 and drive the wafers 102 downward such that crevices 3202 are formed at the edges of the wafers 102. In other embodiments, a cam or other element (not shown) may apply a force to the top surface 3204 of the point loads 1810 to move the point loads 1810 downward.

Figure 33:
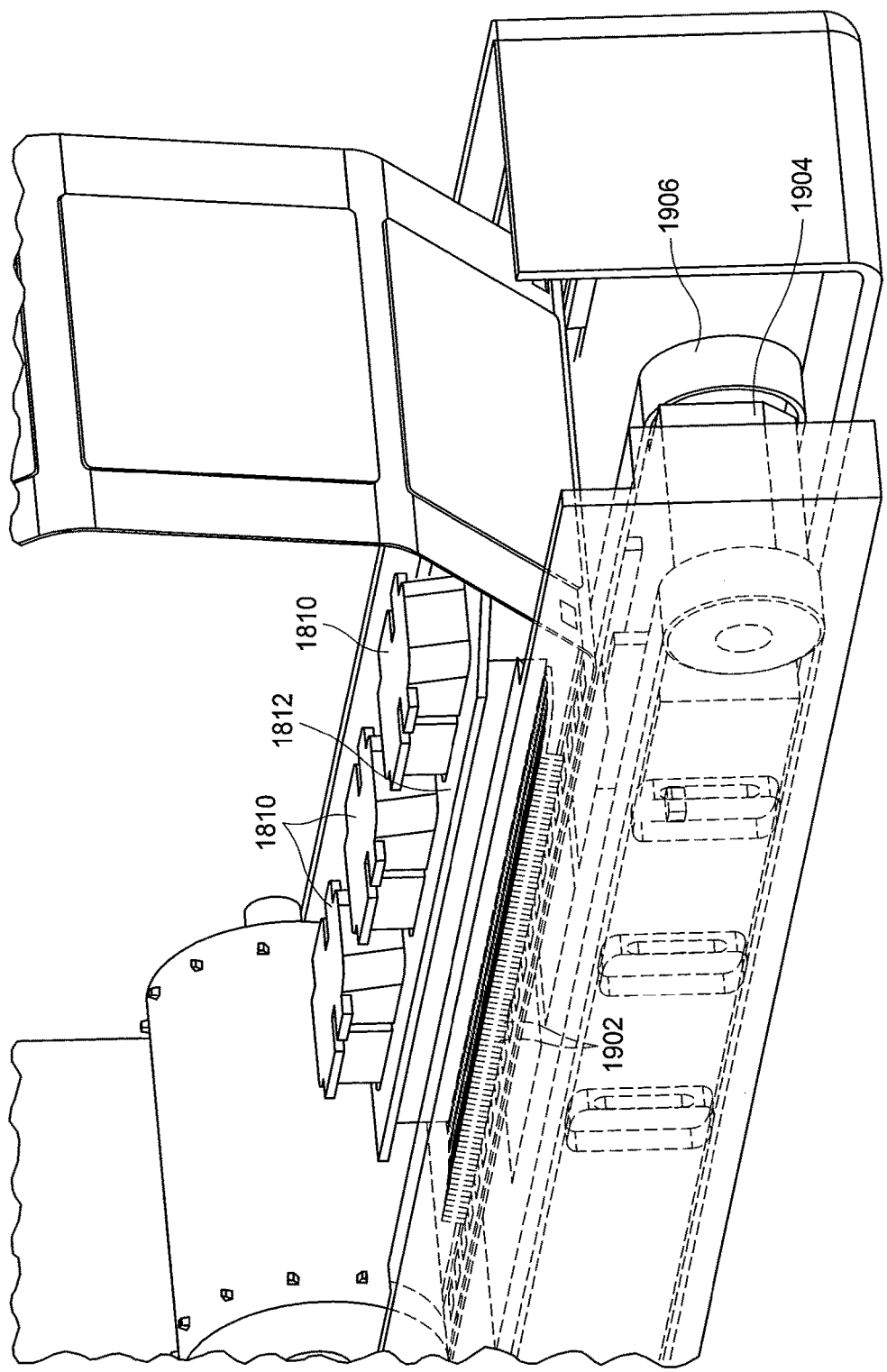
FIG. 33 is an enlarged isometric view of the wafer support and belt drive and point load tensioning portion of the apparatus of FIG. 18 in a continuing ELO position.
Figure 34:
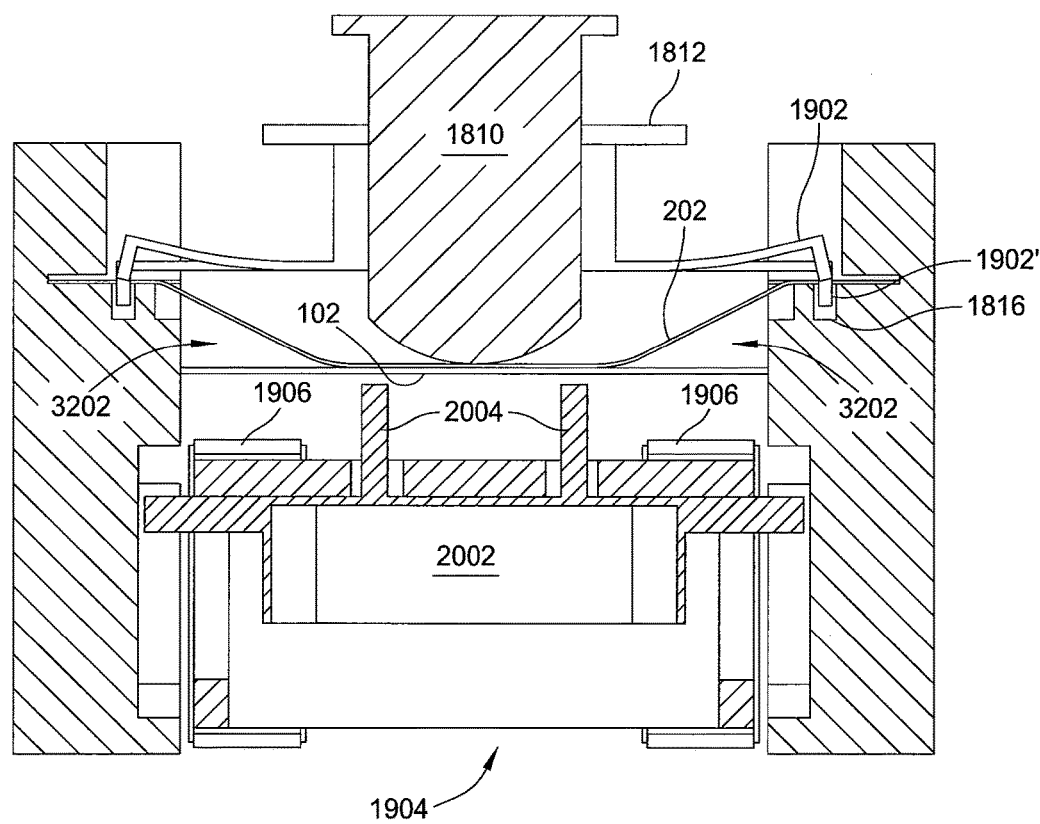
FIG. 34 is a cross section through the wafer support and belt drive and point load tensioning portion of the apparatus of FIG. 18 in a continuing ELO position.
Figure 35:
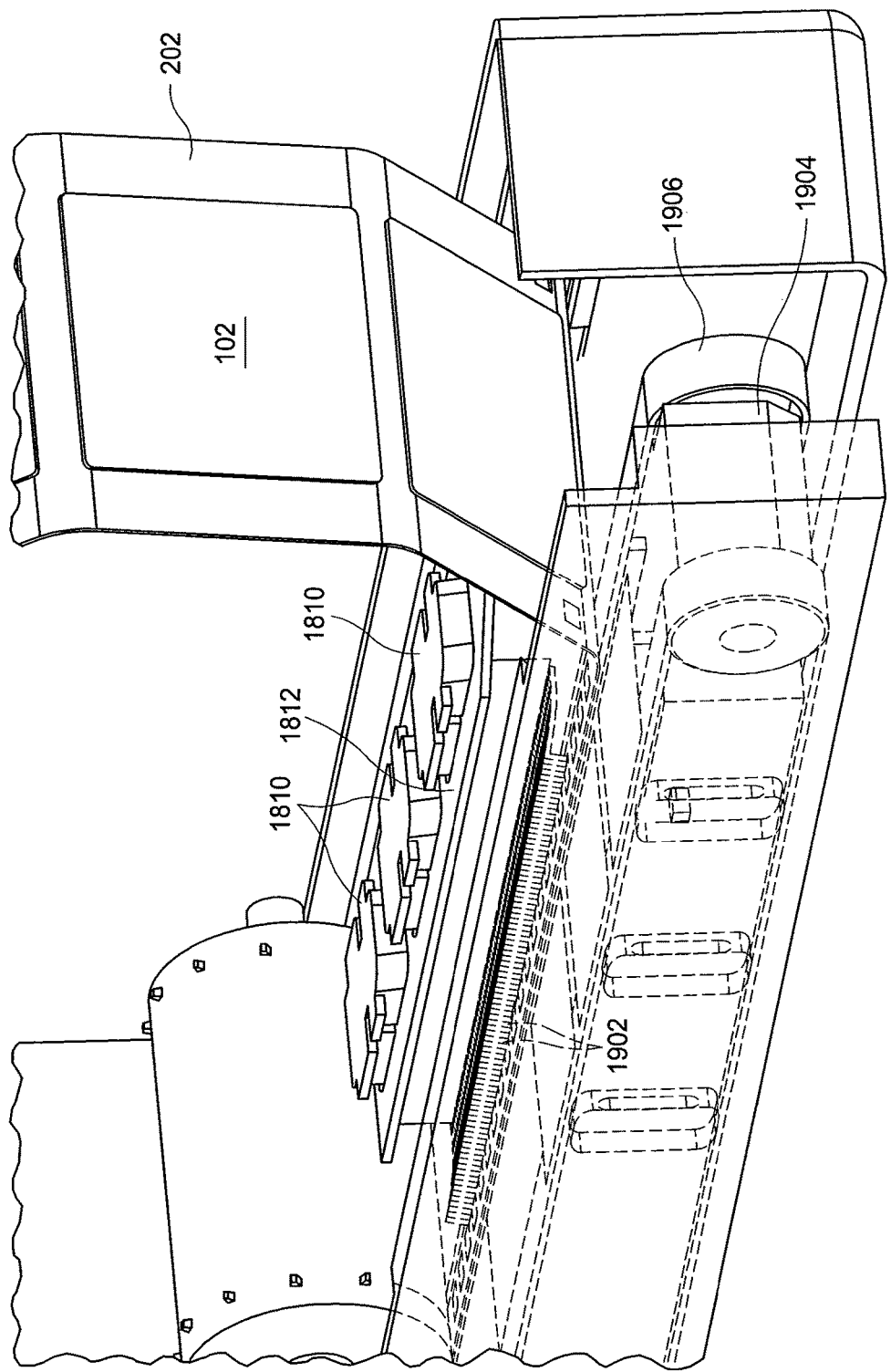
FIG. 35 is an enlarged isometric view of the wafer support and belt drive and point load tensioning portion of the apparatus of FIG. 18 in an ELO completed position.
Figure 36:
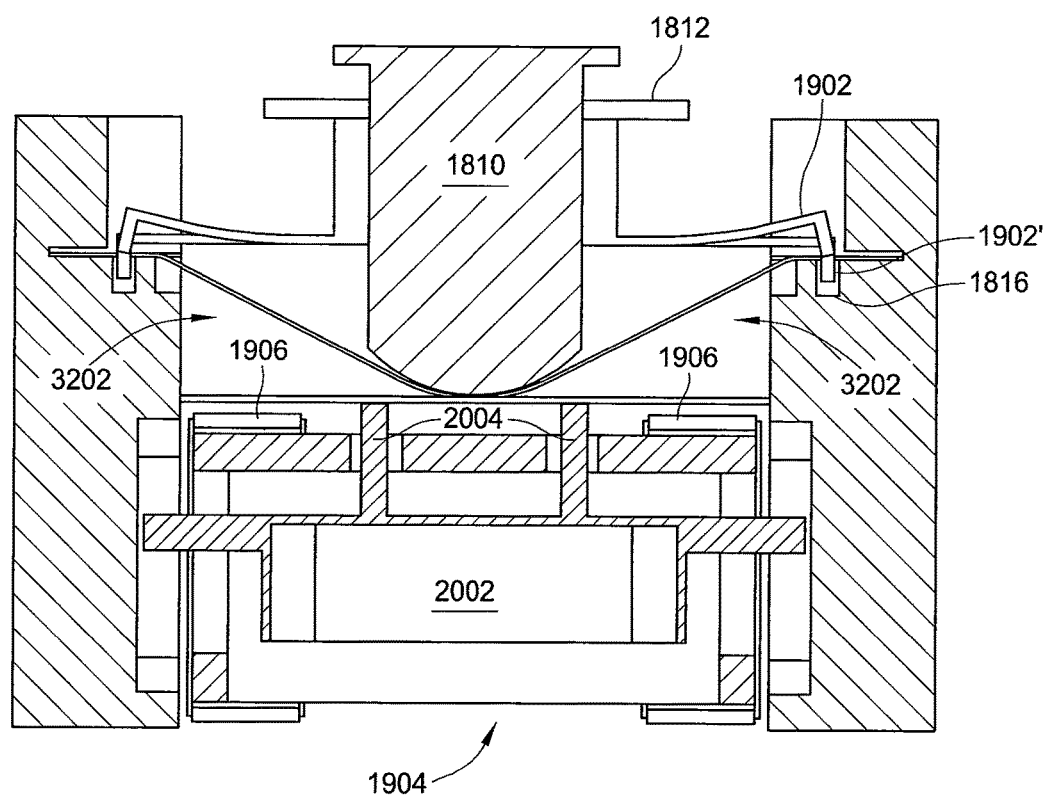
FIG. 36 is a cross section through the wafer support and belt drive and point load tensioning portion of the apparatus of FIG. 18 in an ELO completed position.

FIGS. 33 and 34 illustrate that the ELO process continues, with the point loads 1810 further lowered such that the wafers 102 are pushed further down, and the crevices 3202 have increased in size as more of the wafers 102 are removed from the support tape 202. In FIGS. 35 and 36, the point loads 1810 are shown in their fully lowered position, such that the wafers 102 are supported by the rails 2004 of bottom pusher 2002. The crevices 3202 between the support tape 202 and the wafers 102 have further increased in size such that more of each wafer 102 has been removed from the support tape 202.

Figure 37:
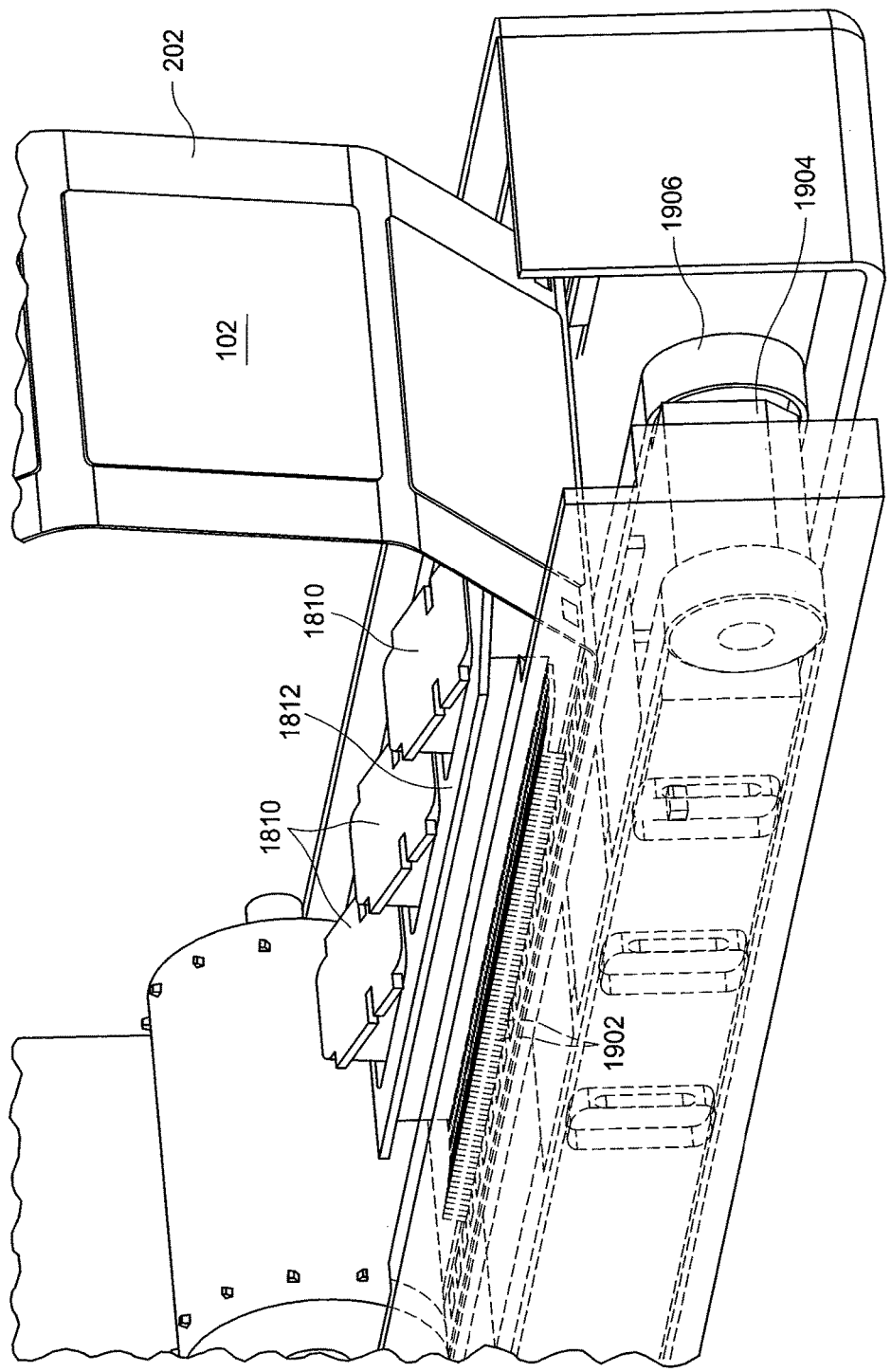
FIG. 37 is an enlarged isometric view of the wafer support and belt drive and point load tensioning portion of the apparatus of FIG. 18 in a point load rotated position.
Figure 38:
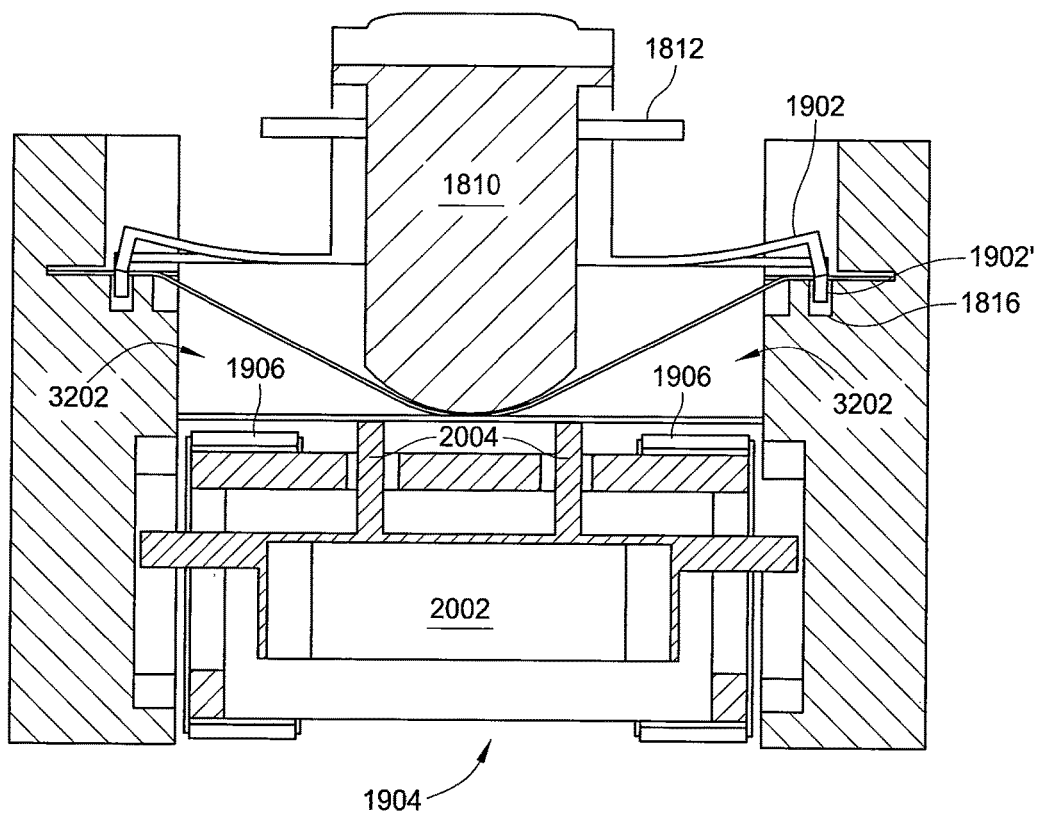
FIG. 38 is a cross section through the wafer support and belt drive and point load tensioning portion of the apparatus of FIG. 18 in a point load rotated position.

Once the point loads 1810 are in their fully lowered position, the method 4000 proceeds to block 4010 where the point loads 1810 are rotated. FIGS. 37 and 38 show the point loads 1810 in a rotated position. By rotating the point loads 1810, the pressure point applied to the tape and wafer assembly is moved back and forth (left to right in FIG. 37), to further remove the support tape 202 and ELO stack from the wafer 102. The point loads 1810 may be rotated by a cam assembly or other mechanism (not shown). After rotating the point loads 1810, the ELO process is complete and the wafers 102 are removed from the support tape 202, as indicated in block 4012 of method 4000. The method 4000 then proceeds to block 4014 and the point load and finger carrier 1812 is raised as shown by its position illustrated in FIG. 22. After raising the point load and finger carrier 1812, the method 4000 proceeds to block 4016, wherein the wafer support and handling assembly 1904 is partially raised as is also shown in FIG. 22. In FIG. 22, it should be noted that at this point in the process, the center portion 2202 of the tape and ELO stack is released from the wafers 102, and the tape and ELO stack form a straight line above and not contacting the wafers 102. By raising the wafer support and handling assembly 1904 the substrate drive belts 1906 are in contact with the wafers 102 and the rails 2004 of bottom pusher 2002 are retracted as described above. The method 4000 then proceeds to block 4018 and the wafers 102 are transported out of the etch bath 1804 and to the wafer unload section 1806 (FIG. 18) by pulleys 2102 driving the substrate drive belts 1906. In the wafer unload section 1806, a series of belts 1818 and pulleys 1820 transport the removed wafers (such as shown by 1822) out of the apparatus 1800 and to subsequent processes such as those shown in apparatus 300 of FIG. 3.

After the removed wafers 102 have been transported out of the apparatus 1800, the method 4000 proceeds to block 4020, the wafer support and handling assembly 1904 is raised to its uppermost position as shown in FIG. 24. The method 4000 is then restarted at block 4002 and the next batch (length) of tape and wafer assembly is loaded into the etch bath 1804.

In several alternative embodiments, a plurality of substrates 100 may be disposed on a single support substrate. Alternatively, a plurality of ELO thin film stacks 150 may be disposed on a support substrate that contains multiple gallium arsenide wafers or surfaces. Each of the ELO thin film stacks 150 is disposed on or over each gallium arsenide wafer or surface on the support substrate. Therefore, the support substrate may contain at least 2 substrates 100 or ELO thin film stacks 150, but usually contains 3, 4, 5, 6, 9, 12, 16, 20, 24, 50, 100, or more substrates 100 or ELO thin film stacks 150.

Each ELO thin film stack 150 contains an epitaxial film 106 disposed on or over a sacrificial layer 104. The support tape 202 may be disposed on or over each of the substrates 100, such as by the epitaxial film 106. In some embodiments, each of the ELO thin film stacks 150 may be grown on an individual wafer 100 and then coupled with the support substrate. In other embodiments, each of the ELO thin film stacks 150 may be grown on an individual gallium arsenide wafer or surface already coupled with the support substrate.

In some examples, the support substrate may contain at least 2 epitaxial substrates or surfaces, such as gallium arsenide wafers or gallium arsenide surfaces, but usually contains 3, 4, 5, 6, 9, 12, 16, 20, 24, 50, 100, or more epitaxial substrates or surfaces. In some embodiments, the support substrate may contain or be made from columbium, columbium alloys, titanium carbide, magnesium silicate, steatite, tungsten carbide, tungsten carbide cermet, iridium, alumina, alumina ceramics, zirconium, zirconium alloys, zirconia, zirconium carbide, osmium, tantalum, hafnium, molybdenum, molybdenum alloys, oxides thereof, silicates thereof, alloys thereof, derivatives thereof, or combinations thereof. In some examples, the support substrate has no porosity or substantially no porosity. In other examples, the support substrate may be resistant to hydrogen fluoride and hydrofluoric acid.

An adhesive may be used to form an adhesive layer between the support substrate and either the wafer 100, or the gallium arsenide wafers or surfaces. In one example, each wafer 100, containing an individual ELO thin film stack 150 disposed thereon, may be coupled with the support substrate by an adhesive to form an adhesive layer therebetween. In another example, each individual gallium arsenide wafer or gallium arsenide surface may be coupled with the support substrate by an adhesive to form an adhesive layer therebetween. The adhesive may be the same adhesive as used to form the adhesive layer 204, as described above. Alternatively, the adhesive may be different than the adhesive used to form the adhesive layer 204. In some examples, the adhesion layer contains an optical adhesive or an ultraviolet-curable adhesive. In other examples, the adhesion layer may contain a mercapto ester compound and may further contain butyl octyl phthalate, tetrahydrofurfuryl methacrylate, acrylate monomer, derivatives thereof, or combinations thereof. In other examples, the adhesion layer contains silicone or sodium silicate.

In another alternative embodiment, a substrate 100 contains a sacrificial layer 104 disposed on a wafer 102, an epitaxial film 106 disposed over the sacrificial layer 104, and a support handle is the support tape 202 disposed over the epitaxial film 106. In some embodiments, the support tape 202 contains multiple layers including a stiff support layer disposed over the epitaxial film 106, a soft support layer disposed over the stiff support layer, and a handle plate layer disposed over the soft support layer. In other embodiments, the support tape 202 is the handle plate layer and is disposed over the soft support layer, which is disposed over the stiff support layer, which is disposed over the epitaxial film 106. The support tape 202 is disposed on and maintains compression of the epitaxial film 106.

In some embodiments, the stiff support layer may contain a polymer, a copolymer, an oligomer, derivatives thereof, or combinations thereof. In one embodiment, the stiff support layer contains a copolymer. In one example, the copolymer may be an ethylene/vinylacetate (EVA) copolymer or derivatives thereof. An EVA copolymer which is useful as the stiff support layer is WAFER GRIP adhesion film, commercially available from Dynatex International, located in Santa Rosa, Calif.

In other examples, the stiff support layer may contain a hot-melt adhesive, an organic coating, an inorganic material, or combinations thereof. In some examples, the inorganic material contains a single inorganic layer or multiple inorganic layers, such as metal layers or metallic foils. In another example, the stiff support layer may contain wax or derivatives thereof, such as black wax.

In another embodiment, the soft support layer may contain an elastomer, such as rubber, foam, or derivatives thereof. Alternatively, the soft support layer may contain a material such as neoprene, latex, or derivatives thereof. The soft support layer may contain a monomer. For example, the soft support layer may contain an ethylene propylene diene monomer or derivatives thereof.

In another embodiment, the soft support layer may contain a liquid or a fluid contained within a membrane. Alternatively, the soft support layer may contain a gas contained within a membrane. The membrane may contain a material such as rubber, foam, neoprene, latex, or derivatives thereof. In one example, the membrane contains natural rubber, synthetic rubber, or latex.

In another embodiment, the handle plate may contain a material such as plastic, polymer, oligomer, derivatives thereof, or combinations thereof. In one example, the handle plate may contain polyester or derivatives thereof. The handle plate may have a thickness within a range from about 50.8 µm to about 127.0 µm, such as about 23.4 µm.

In one embodiment, the method further includes removing the epitaxial film 106 from the wafer 102 and attaching a support substrate, such as the support tape 202, to an exposed surface of the epitaxial film 106 by an adhesive layer 204. The support tape 202 may be bonded to the exposed surface of the epitaxial film 106 by an adhesive. In one example, the adhesive layer 204 contains an optical adhesive and/or may be UV-curable, such as commercially available as Norland UV-curable optical adhesive. In some examples, the adhesive may contain a mercapto ester compound. In other examples, the adhesive may further contain a material such as butyl octyl phthalate, tetrahydrofurfuryl methacrylate, acrylate monomer, derivatives thereof, or combinations thereof.

In another alternative embodiment, a substrate 100 contains a support substrate, such as support tape 202 disposed over a first surface of the epitaxial film 106, and the support tape 202 disposed over the other surface of the epitaxial film 106. An adhesive layer 204 may be disposed between the epitaxial film 106 and the support tape 202. The support tape 202 contains the stiff support layer disposed over the epitaxial film 106, the soft support layer disposed over the stiff support layer, and the handle plate disposed over the soft support layer.

In one example, the adhesive may be cured by exposing the adhesive to UV radiation. Generally, the adhesive may be exposed to the UV radiation for a time period within a range from about 1 minute to about 10 minutes, preferably, from about 3 minutes to about 7 minutes, such as about 5 minutes. The adhesive may be cured at a temperature within a range from about 25° C. to about 75° C., such as about 50° C.

In other examples, the adhesive may be a silicone adhesive or may contain sodium silicate. In these examples, the adhesive may be cured for a time period within a range from about 10 hours to about 100 hours, preferably, from about 20 hours to about 60 hours, and more preferably, from about 30 hours to about 50 hours, for example, about 42 hours. The adhesive may be cured at a temperature within a range from about 25° C. to about 75° C., such as about 50° C. Also the adhesive may be cured at a pressure within a range from about 1 psi (pounds per square inch) to about 50 psi, preferably, from about 3 psi to about 25 psi, and more preferably, from about 5 psi to about 15 psi. In one example, the pressure may be about 9 psi.

In other embodiments, the sacrificial layer 104 may be exposed to an etching process to remove the epitaxial film 106 from the wafer 102. In some embodiments, the sacrificial layer 104 may be exposed to a wet etch solution during the etching process.

In some embodiments, the sacrificial layer 104 may be exposed to a wet etch solution during the etching process. The wet etch solution contains hydrofluoric acid and may contain a surfactant and/or a buffer. In some example, the sacrificial layer 104 may be etched at a rate of about 0.3 mm/hr or greater, preferably, about 1 mm/hr or greater, and more preferably, about 5 mm/hr or greater. In an alternative embodiment, the sacrificial layer 104 may be exposed to an electrochemical etch during the etching process. The electrochemical etch may be a biased process or a galvanic process. Also, the sacrificial layer 104 may be exposed to a vapor phase etch during the etching process in another embodiment described herein. The vapor phase etch includes exposing the sacrificial layer 104 to hydrogen fluoride vapor. The etching process may be a photochemical etch, a thermally enhanced etch, a plasma enhanced etch, a stress enhanced etch, derivatives thereof, or combinations thereof.

In embodiments herein, the epitaxial materials contained within epitaxial film 106 may include gallium arsenide, aluminum gallium arsenide, indium gallium phosphide, alloys thereof, derivatives thereof, or combinations thereof. The epitaxial film 106 may have a rectangular geometry, a square geometry, or other geometries. The epitaxial film 106 may contain one layer, but usually contains multiple layers. In some examples, the epitaxial film 106 contains a layer having gallium arsenide and another layer having aluminum gallium arsenide. In another example, the epitaxial film 106 contains a gallium arsenide buffer layer, an aluminum gallium arsenide passivation layer, and a gallium arsenide active layer. The gallium arsenide buffer layer may have a thickness within a range from about 100 nm to about 500 nm, such as about 300 nm, the aluminum gallium arsenide passivation layer has a thickness within a range from about 10 nm to about 50 nm, such as about 30 nm, and the gallium arsenide active layer has a thickness within a range from about 500 nm to about 2,000 nm, such as about 1,000 nm. In some examples, the epitaxial film 106 further contains a second aluminum gallium arsenide passivation layer.

In other embodiments herein, the epitaxial film 106 may contain a photovoltaic cell structure containing multiple layers. The cell structure may contain gallium arsenide, n-doped gallium arsenide, p-doped gallium arsenide, aluminum gallium arsenide, n-doped aluminum gallium arsenide, p-doped aluminum gallium arsenide, indium gallium phosphide, alloys thereof, derivatives thereof, or combinations thereof. In many examples, the gallium arsenide is n-doped or p-doped.

In another embodiment, the sacrificial layer 104 may contain aluminum arsenide, alloys thereof, derivatives thereof, or combinations thereof. In one example, the sacrificial layer 104 contains an aluminum arsenide layer and has a thickness of about 20 nm or less, preferably, within a range from about 1 nm to about 10 nm, and more preferably, from about 4 nm to about 6 nm.

While the foregoing is directed to embodiments of the invention, other and further embodiments of the invention may be devised without departing from the basic scope thereof, and the scope thereof is determined by the claims that follow.

What is claimed is:

1. A method for forming thin film devices during an epitaxial lift off process, comprising:
   coupling an elongated support tape and a plurality of substrates, wherein the substrates are spatially separated from each other when coupled to the elongated support tape, wherein each substrate comprises a wafer having a sacrificial layer disposed over the wafer and an epitaxial film disposed over the sacrificial layer;
   exposing the substrates to an etchant in an etch bath during an etching process while moving the elongated support tape along a length of the etch bath; and
   etching the sacrificial layer and peeling the epitaxial film from the wafer of each of the substrates by progressively applying pressure to a center portion of the elongated support tape relative to lateral sides of the elongated support tape as the elongated support tape is moved along the length of the etch bath.

2. The method of claim 1, wherein the elongated support tape is coupled with the epitaxial film of each of the substrates.

3. The method of claim 1, wherein the plurality of substrates coupled with the elongated support tape includes a number of substrates that ranges from about 4 substrates to about 100 substrates.

4. The method of claim 1, wherein the elongated support tape comprises at least one metal.

5. The method of claim 1, wherein the elongated support tape comprises at least one metallic foil.

6. The method of claim 5, wherein the metallic foil comprises at least one metal selected from the group consisting of iron, nickel, cobalt, steel, stainless steel, alloys thereof, derivatives thereof, and combinations thereof.

7. The method of claim 1, wherein the elongated support tape comprises at least one material selected from the group consisting of a polymeric material, a co-polymeric material, an oligomeric material, derivatives thereof, and combinations thereof.

8. The method of claim 1, wherein the elongated support tape comprises at least one material selected from the group consisting of polyacrylic materials, polyethylene materials, polypropylene materials, polytetrafluoroethylene materials, fluorinated polymeric materials, isomers thereof, derivatives thereof, and combinations thereof.

9. The method of claim 1, wherein the elongated support tape comprises multiple layers.

10. The method of claim 1, wherein the elongated support tape moves along the length of the etch bath by the turning of at least two reels, drums, or rollers.

11. The method of claim 1, wherein at least one of the lateral sides of the elongated support tape comprises a row of track openings extending the length of the elongated support tape.

12. The method of claim 11, wherein each lateral side of the elongated support tape comprises a row of track openings extending the length of the elongated support tape.

13. The method of claim 11, wherein the elongated support tape moves along the length of the etch bath by the turning of at least one roller having a plurality of pins extending from the roller to engage the track openings.

14. The method of claim 13, wherein the at least one roller comprises a sprocket or a cog to engage the track openings.

15. The method of claim 1, wherein the elongated support tape comprises a plurality of slots extending perpendicular or substantially perpendicular from the outside edges of the elongated support tape.

16. The method of claim 15, wherein the plurality of slots comprises pairs of aligned slots which extend from opposite outside edges of the elongated support tape.

17. The method of claim 16, wherein each pair of slots is within a region of the elongated support tape, and the region is free of substrates.

18. The method of claim 16, wherein each substrate is coupled with the elongated support tape between two consecutive pairs of slots.

19. The method of claim 1, further comprising disposing an adhesive layer between each substrate and the elongated support tape.

20. The method of claim 19, wherein disposing the adhesive layer comprises applying an adhesive to each substrate, and wherein coupling the elongated support tape and the plurality of substrates includes coupling each substrate to the elongated support tape via the applied adhesive.

21. The method of claim 19, wherein the adhesive layer comprises a pressure sensitive adhesive, a hot-melt adhesive, or a UV-cured adhesive.

22. The method of claim 19, wherein the adhesive layer comprises an acrylic adhesive.

23. The method of claim 1, wherein exposing the sacrificial layer to the etchant in the etch bath during the etching process includes exposing the sacrificial layer to a wet etch solution comprising hydrofluoric acid, a surfactant, and a buffer.

24. The method of claim 1, wherein the sacrificial layer is etched at a rate of about 5 mm/hr or greater.

25. The method of claim 1, wherein the epitaxial film comprises a material selected from the group consisting of gallium arsenide, aluminum gallium arsenide, indium gallium phosphide, alloys thereof, derivatives thereof, and combinations thereof.

26. The method of claim 1, wherein the epitaxial film comprises a layer comprising gallium arsenide and another layer comprising aluminum gallium arsenide.

27. The method of claim 1, wherein the epitaxial film comprises a gallium arsenide buffer layer, at least one aluminum gallium arsenide passivation layer, and a gallium arsenide active layer.

28. The method of claim 1, wherein the epitaxial film comprises a photovoltaic cell structure comprising multiple layers, and the photovoltaic cell structure comprises at least two materials selected from the group consisting of gallium arsenide, n-doped gallium arsenide, p-doped gallium arsenide, aluminum gallium arsenide, n-doped aluminum gallium arsenide, p-doped aluminum gallium arsenide, indium gallium phosphide, alloys thereof, derivatives thereof, and combinations thereof.

29. The method of claim 1, wherein the sacrificial layer comprises a material selected from the group consisting of aluminum arsenide, alloys thereof, derivatives thereof, and combinations thereof.

30. The method of claim 1, wherein the sacrificial layer comprises an aluminum arsenide layer having a thickness within a range from about 1 nm to about 20 nm.

31. The method of claim 1, wherein the wafer comprises gallium arsenide, gallium arsenide alloys, dopants thereof, or derivatives thereof.

* * * * *